(12) United States Patent
Dasu et al.

(10) Patent No.: US 8,281,297 B2
(45) Date of Patent: Oct. 2, 2012

(54) RECONFIGURABLE PROCESSING

(75) Inventors: Aravind R. Dasu, Providence, UT (US);
Ali Akoglu, Tempe, AZ (US); Arvind Sudarsanam, Logan, UT (US);
Sethuraman Panchanathan, Gilbert, AZ (US)

(73) Assignee: Arizona Board of Regents, Tempe, AZ (US)

( * ) Notice: Subject to any disclaimer, the term of this patent is extended or adjusted under 35 U.S.C. 154(b) by 1345 days.

(21) Appl. No.: 10/544,894

(22) PCT Filed: Feb. 5, 2004

(86) PCT No.: PCT/US2004/003609
§ 371 (c)(1),
(2), (4) Date: Jul. 19, 2006

(87) PCT Pub. No.: WO2004/072796
PCT Pub. Date: Aug. 26, 2004

(65) Prior Publication Data
US 2007/0198971 A1    Aug. 23, 2007

Related U.S. Application Data

(60) Provisional application No. 60/445,339, filed on Feb. 5, 2003, provisional application No. 60/490,162, filed on Jul. 24, 2003, provisional application No. 60/493,132, filed on Aug. 6, 2003, provisional application No. 60/523,462, filed on Nov. 18, 2003.

(51) Int. Cl.
*G06F 9/45* (2006.01)
(52) U.S. Cl. ...................................... 717/161
(58) Field of Classification Search .................. 717/155, 717/160, 161; 716/1, 18, 103; 712/11; 703/14; 715/853; 718/102
See application file for complete search history.

(56) References Cited

U.S. PATENT DOCUMENTS 5,491,823 A * 2/1996 Ruttenberg .................... 717/161
5,502,645 A * 3/1996 Guerra et al. .................... 716/18
5,572,436 A * 11/1996 Dangelo et al. .................. 716/18

(Continued)

OTHER PUBLICATIONS

Brisk et al, "Instruction Generation and Regularity Extraction for Reconfigurable Processors", CASES 2002, Oct. 2002, pp. 1-8.*

(Continued)

*Primary Examiner* — Tuan Anh Vu
(74) *Attorney, Agent, or Firm* — Schwabe, Williamson & Wyatt P.C.

(57) ABSTRACT

A method of producing a reconfigurable circuit device for running a computer program of moderate complexity such as multimedia processing. Code for the application is compiled into Control Flow Graphs representing distinct parts of the application to be run. From those Control Flow Graphs are extracted basic blocks. The basic blocks are converted to Data Flow Graphs by a compiler utility. From two or more Data Flow Graphs, a largest common subgraph is determined. The largest common subgraph is ASAP scheduled and substituted back into the Data Flow Graphs which also have been scheduled. The separate Data Flow Graphs containing the scheduled largest common subgraph are converted to data paths that are then combined to form code for operating the application. The largest common subgraph is effected in hardware that is shared among the parts of the application from which the Data Flow Graphs were developed. Scheduling of the overall code is effected for sequencing, providing fastest run times and the code is implemented in hardware by partitioning and placement of processing elements on a chip and design of the connective fabric for the design elements.

19 Claims, 42 Drawing Sheets

U.S. PATENT DOCUMENTS

| | | | | |
|---|---|---|---|---|
| 5,671,432 | A * | 9/1997 | Bertolet et al. | 712/11 |
| 5,764,951 | A * | 6/1998 | Ly et al. | 716/1 |
| 5,943,499 | A * | 8/1999 | Gillies et al. | 717/155 |
| 6,493,863 | B1 * | 12/2002 | Hamada et al. | 716/103 |
| 6,507,947 | B1 * | 1/2003 | Schreiber et al. | 717/160 |
| 6,745,160 | B1 * | 6/2004 | Ashar et al. | 703/14 |
| 7,120,879 | B2 * | 10/2006 | Gutberlet et al. | 715/853 |
| 7,155,708 | B2 * | 12/2006 | Hammes et al. | 717/155 |
| 7,401,333 | B2 * | 7/2008 | Vandeweerd | 718/102 |
| 2001/0016936 | A1 * | 8/2001 | Okada et al. | 716/18 |

OTHER PUBLICATIONS

Janssen et al, "A Specification Invariant Technique for Regularity Improvement between Flow-Graph Clusters", IEEE 1996, p. 138-143.*

Cheng et al, "High-Level synthesis: Current Status and Future Prospects", Jun. 1993 pp. 351-400.*

Middendorf et al, "Traversal Graphs for partially ordered sets: sequencing, Merging, and Scheduling problems" Apr. 1999-Sep 1998, pp. 417-435 <Middendorf_1999.pdf>.*

Singh, H. et al. "MorphoSys: An Integrated Reconfigurable System for Data-Parallel Computation-Intensive Applications" IEEE Transactions on Computers, 2000.

Soukup, J. "Fast Maze Router" Proceedings of the 15th Design Automation Conference, pp. 100-102, 1978.

Strauss, M., et al. "BOPS: Conquering the Geometry Pipeline" Game Developers Conference. Mar. 22-26, 2004, San Jose, California.

Taylor, Michael Bedford, "Design Decisions in the Implementation of a Raw Architecture Workstation", MS thesis, MIT, 1996.

Taylor, R. et al."A High-Performance Flexible Architecture for Cryptography" CHES'99, LNCS 1717, pp. 231-245, 1999.

Vorbach, M., Becker, J. " Reconfigurable Processor Architectures for Mobile Phones" Proc of International on Parallel and Distributed Processing Symposium, 2003.

Wan, M. et al. "Design Methodology of a Low-Energy Reconfigurable Single-Chip DSP System" Journal of VLSI Signal Processing Systems, 28, pp. 47-61, May-Jun. 2001.

Wan, M. et al. "Design Methodology of a Low-Energy Reconfigurable Single-Chip DSP System" Journal of VLSI Signal Processing, 2000.

Wolf, W., et al. "The Princeton University Behavioral Synthesis System" Proc. Design Automation Conf., Jun. 1992, pp. 182-187.

Yamauchi, T. et al. "SOP: A Reconfigurable Massively Parallel System and Its Control-Data-Flow based Compiling Method" IEEE Symposium on FPGAs for Custom Computing Machines, 1996.

Ye, Z. et al. "CHIMAERA: A High-Performance Architecture with a Tightly-Coupled Reconfigurable Functional Unit" International Conference on Computer Architecture, 2000.

Zhang, H., et al. "A 1-V Heterogeneous Reconfigurable DSP IC for Wireless Baseband Digital Signal Processing" IEEE Journal of Solid-State Circuits, 35 (11), pp. 1697-1704, Nov. 2000.

Zhang, H., et al. "Interconnect Architecture Exploration for Low-Energy Reconfigurable Single-Chip DSPs" IEEE Computer Society Workshop on VLSI'99 pp. 2-8, Apr. 1999.

Search Report, mailed Mar. 17, 2005 for application PCT/US04/03609.

Abdulrahim, Mohammad A. "Parallel Algorithms for Labeled Graph Matching" PhD thesis Colorado School of Mines, 1998.

Agarwal, A.et at. "The Raw Compiler Project" Proc of the Second SUIF compiler workshop, Stanford, CA, Aug. 21-23, 1997.

Agarwal, A., et al. "Routing Architectures for Hierarchical Field Programmable Gate Arrays" IEEE International Conference 071 Computer Design, pp. 475-478, Oct. 10, 1994.

Akoglu, A., et al. "Pattern Recognition Tool to Detect Reconfigurable Patterns in MPEG4 Video Processing" International Parallel and Distributed Processing Symposium, pp. 131-135, 15-19, Apr. 2002.

Alsolaim, A., et al. "Architecture and Application of a Dynamically Reconfigurable Hardware Array for Future Mobile Communication Systems" pp. 205-214.

Ammons, G., et al. "Exploiting Hardware Performance Counters with Flow and Context Sensitive Profiling" PLDI, Jun. 1997.

Arnold, M., et al. "Automatic Detection of Recurring Operation Patterns" Seventh International Workshop on Hardware/Software Co-Design (CODES'99), Rome Italy, May 1999.

Arnold, M., et al. "Instruction Set Synthesis Using Operation Pattern Detection" Fifth Annual Conf. of ASCI, Heijen, The Netherlands, Jun. 1999.

Arnold, Marnix "Matching and Covering with Multiple-Output Patterns"Technology Report No. 1-68340-44/1999/01, Delft University of Technology, Jan. 1999.

Athanas, P. "A Functional Reconfigurable Architecture and Compiler for Adaptive Computing" Technical Report LEMS-100, Brown University, Division of Engineering, 1992.

Athanas, P. et al. "An Adaptive Hardware Machine Architecture and Compiler for Dynamic Processor Reconfiguration" International Conference on Computer Design, 1991.

Ball, T., et al. "Efficient Path Profiling", Proceedings of MICRO-29, Dec. 2-4, 1996, Paris, France.

Basin, D.A., et al. "A Term Equality Problem Equivalent to Graph Isomorphism" Information Processing Letters, 54: 61-66, 1994.

Becker, J., et al. "A Parallel Dynamically Reconfigurable Architecture Designed for Flexible Application-Tailored Hardware/Software Systems in Future Mobile Communication" The Journal of Supercomputing, 19 (1), 102-127, 2001.

Becker, J., et al. "Design and Implementation of a Coarse-Grained Dynamically Reconfigurable Hardware Architecture" IEEE Computer Society Workshop on VLSI, 2001.

Betz, V., et al. "VPR: A New Packing, Placement and Routing Tool for FPGA Research" International Workshop on Field-Programmable Logic and Application, pp. 213-222, 1997.

Bittner, R. et al. "Computing Kernels Implemented with a Wormhole RTR CCM" The 5th Annual IEEE Symposium on FPGAs for Custom Computing Machines, 1997.

Bondalapati, Kiran Kumar "Modeling and Mapping Dynamically Reconfigurable Hybrid Architectures" PhD Thesis, USC, 2001.

Bozorgzadeh, E., et al. "Rpack: Routability-Driven packing for cluster-based FPGAs" Proceedings of the Conference on Asia South Pacific Design Automation Conference, p. 629-634, Jan. 2001, Japan.

BRASS Research Group, Berkeley Reconfigurable Architectures, Systems, & Software, http://brass.cs.berkeley.edu.

Brisk, P. et al."Instruction Generation and Regularity Extraction for Reconfigurable Processors", International Compilers, Architecture and Synthesis for Embedded Systems (CASES), pp. 1-8, Oct. 2002.

Brisk, P., et al. "Area-Efficient Instruction Set Synthesis for Reconfigurable System-on-Chip Designs" ACM DAC 2004, pp. 395-400 (2004).

Brown, Fon R. III Real-Time Scheduling with Fuzzy Systems, PhD thesis, Utah State University, 1998.

Cadambi, S., et al. "CPR: A Configuration Profiling Tool" IEEE Symposium on Field-Programmable Custom Computing Machines, (FCCM '99), Apr. 1999, Napa, C.

Callahan, T. et al. "The Garp Architecture and C Compiler" IEEE Transactions on computers, 2000.

Cambouropoulos, Emilios "Extracting Significant Patterns from Musical Strings: Some Interesting Problems." London String Days 2000 Workshop, King's College London.

Campi, F., et al. "A Reconfigurable Processor Architecture and Software Development Environment for Embedded Systems" International Parallel and Distributed Processing Symposium, 2003.

Chameleon Systems Inc.—www.chameleonsystems.com, "Advanced Communications Technologies—Development Partnership with Chameleon Systems", Business Wire, Dec. 26, 2000.

Chekuri, C., et al. "Profile-Driven Instruction Level Parallel Scheduling with Application to Super Blocks" Proc of the 29th Annual International Symposium on Microarchitecture (MICRO-29) Dec. 1996.

Chen, C., et al. "Unifying Graph Matching Problems with a Practical Solution" In Proceedings of International Conference on Systems, Signals, Control, Computers, Sep. 1998, 55.

Chen, D., et al. "A Reconfigurable Multiprocessor IC for Rapid Prototyping of Algorithmic-Specific High-Speed DSP Data Paths" IEEE Journal of Solid-State Circuits, 1992.

Chou, P., et al. "Interval Scheduling: Fine-Grained Code Scheduling for Embedded Systems" Proc. ACM/IEEE DAC, 1995, 462-467.

Chowdhary, A. "A General Approach for Regularity Extraction in Datapath Circuits", Proc. of International Conference on Computer-Aided Design, 1998.

Chu, M.et al. "Object Oriented Circuit-Generators in Java", IEEE Symposium on FPGAs for Custom Computing Machines, Apr. 1998.

Coffman, E. , et al. "Optimal Scheduling for Two-Processor Systems" Acta Informatica, 1, 1972, 200-213.

Cook, D., et al. "Knowledge Discovery from Structural Data" Journal of Intelligent Information Systems, 1995.

Dasu, A., et al. "An Analysis Tool Set for Reconfigurable Media Processing" The International Conference on Engineering of Reconfigurable Systems and Algorithms, Las Vegas, Jun. 2003.

Dasu, A., et al. A Survey of Media Processing Approaches, IEEE Transactions on Circuits and Systems for Video Technology, vol. 12, No. 8, Aug. 2002.

Dasu, Aravind "Reconfigurable Processing" PhD qualifying report 2001.

De, V., et al. "A Heuristic Global Router for Polycell Layout" PhD thesis, Duke University, 1986.

Dees, W., et al. "Automated Rip-UP and Reroute Techniques" Proceedings of Design Automation Conference, 1982.

Dehnert, J., et al. "Compiling for the Cydra-5," Journal of Supercomputing, 7: 181-228 (1993).

DeHon, Andre. "Reconfigurable Architectures for General-Purpose Computing", PhD Thesis, MIT, 1996.

Dehon, Andre. "The Density Advantage of Configurable Computing" Computer, vol. 33, No. 4, Apr. 2000, pp. 41-49.

Ebeling, C., et al. "RaPiD—Reconfigurable Pipelines Datapath" Department of Computer Science and Engineering University of Washington.

Eles, P., et al. "Scheduling of Conditional Process Graphs for the Synthesis of Embedded Systems" Design Automation and Test in Europe, Feb. 23-26, 1998 Paris, France.

Eles, P., et al. "Scheduling with Bus Access Optimization for Distributed Embedded Systems" IEEE Trans on VLSI Systems, vol. 8, No. 5, 472-491, Oct. 2000.

Fisher, Joseph A. "Global Code Generation for Instruction-Level Parallelism: Trace Scheduling-2" Tech. Rep. HPL 93-43, Hewlett Packard Labs, Jun. 1993.

Fredriksson, Kimmo "Faster String Matching with Super-Alphabets" Proc of SPIRE' 2002, Lecture Notes in Computer Science 2476, pp. 44-57, Springer Verlag, Berlin 2002.

George, V.,et al. "The Design of a Low Energy FPGA", International Symposium on Low Power Electronics and Design, 1999.

Gold, S., et al. "A Graduated Assignment Algorithm for Graph Matching" IEEE Trans. on Pattern Analysis and Machine Intelligence, vol. 18, No. 4, Apr. 1996.

Goldstein, S., et al. "PipeRench: A Coprocessor for Streaming Multimedia Acceleration" Carnegie Mellon University.

Gupta, R., et al. "A Co-Synthesis Approach to Embedded System Design Automation" Design Automation for Embedded Systems, V1 N1/2, 1996, 69-120.

Hadlock, F. "Finding a Maximum Cut of a Planar Graph in Polynomial Time" SIAM Journal of Computing, 4, No. 3:331-225, Sep. 1975.

Hartenstein, R., et al. "KressArray Xplorer: A New CAD Environment to Optimize Reconfigurable Datapath Array Architectures" Proc of the ASP-DAC Asia and South Pacific Design Automation Conference, 2000.

Hopcroft, J.E., et al. "Linear Time Algorithm for Isomorphism of Planar Graphs" Sixth ACM Symposium on Theory of Computing, 1974.

Huang, L., et al. "An Approach to Distribution of Parallel Programs With Conditional Task Attributes" Technical Report TR97-06, Department of Computer Science, The University of Adelaide, Aug. 1997.

Huang, L., et al. "Design an Implementation of an Adaptive Task Mapping Environment for Parallel Programming" Australian Computer Science Communications, 19 (1) 326-335, Feb. 1997.

Hwu, W., et al. "The Superblock: An Effective Technique for VLIW and Superscalar Compilation" Journal of Supercomputing, 7: 229-248 (1993).

Iseli, C. et al. "A C ++ Compiler for FPGA Custom Execution Units Synthesis" IEEE Symposium on FPGAs for Custom Computing Machines, 1995.

ISO/IEC JTC1/SC29/WG11 N3908 "MPEG-4 Video Verification Model version 18.0" Jan. 2001.

Jain, S., et al. "Speeding Up Program Execution Using Reconfigurable Hardware and a Hardware Function Library" VLSI Design, 1998 Proceedings, 1998 Eleventh International Conference, IEEE 1997/1998, pp. 400-405.

Janssen, M., et al. "A Specification Invariant Technique for Regularity Improvement between Flow-Graph Clusters" IEEE Proceedings of the 1996 European Design and Test Conference (ED&TC), pp. 138-143 (1996).

Jiajun, Y., et al. "A Fuzzy Expert System Architecture Implementing Onboard Planning and Scheduling for Autonomous Small Satellite" 12th Annual AIAA/Utah State University Conference on Small Satellites, Logan, Utah, Aug. 1998.

Jung, Sung-Hwan "Content-based Image Retrieval Using Fuzzy Multiple Attribute Relational Graph" IEEE International Symposium on Industrial Electronics Proceedings (ISIE 2001), 3: 1508-1513, 2001.

Kasahara, H., et al. "Practical Multiprocessor Scheduling Algorithms for Efficient Parallel Processing" IEEE Trans. on Comp., V33, Nul 1, 1984, 1023-1029.

Kastner, R. et al."Instruction Generation for Hybrid Reconfigurable Systems" International Conference on Computer-Aided Design (ICCAD), Nov. 2001.

Kastrup, B. et al. "ConCISe: A Compiler-Driven CPLD-Based Instruction Set Accelerator" IEEE Symposium on Field Programmable Custom Computing Machines, 1999.

Keutzer, Kurt "DAGON: Technology Binding and Local Optimization by DAG Matching" Proc. of Design Automation Conference, 1987.

Ku, D., et al. "Relative Scheduling under Timing Constraints" IEEE Trans. Computer-Aided Design, vol. 11, pp. 696-718, Jun. 1992.

Kuramochi, M., et al. "An Efficient Algorithm for Discovering Frequent Subgraphs" Technical Report 02-026, University of Minnesota, 2002.

Kwok, Y.K., et al. "Dynamic Critical-Path Scheduling: An Effective Technique for Allocating Task Graphs to Multiprocessors" IEEE Transactions on Parallel and Distributed Systems, vol. 7, No. 5, May 1996 pp. 506-521.

Lai, Y.T., et al. "Hierarchical Interconnection Structures for Field Programmable Gate Arrays" IEEE Transactions on Very Large Scale Integration (VSLI) Systems, vol. 5. No. 2, pp. 186-196, Jun. 1997.

Lakshminarayana, G., et al. "Wavesched: A Novel Scheduling Technique for Control-Flow Intensive Designs" IEEE Transactions on Computer-Aided Design of Integrated Circuits and Systems, vol. 18, No. 5, May, 1999.

Lee, W. et al. "Space-Time Scheduling of Instruction-Level Parallelism on a Raw Machine", Proc of the Eighth International Conference on Architectural Support for Programming Languages and Operating Systems (ASPLOS), San Jose, CA, Oct. 1998.

Li, S., et al. "Configuration Code Generation and Optimizations for Heterogeneous Reconfigurable DSPS" Proceedings of SIPS99.

Li, W., et al. "Routability Prediction for Hierarchical FPGAs" Ninth Great Lakes Symposium on VLSI, pp. 256-259, Mar. 4-6, 1999.

Liu, J. et al. "Variable Instruction Set Architecture and its Compiler Support" IEEE Transactions on Computers, 2003.

Marquardt, A, et al. "Using Cluster-Based Logic Blocks and Timing-Driven Packing to Improve FPGA Speed and Density" Proceeding of the 1999 ACM/SIGDA Seventh International Symposium on Field Programmable Gate Arrays, p. 37-46, Feb. 21-23, 1999, Monterey.

Marshall, T. et al. "A Reconfigurable Arithmetic Array for Multimedia Applications" Proc of the ACM/SIGDA Seventh International Symposium on Field Programmable Gate Arrays, 1999.

Messmer, B.T., et al. "A decision tree approach to graph and subgraph isomorphism detection" Pattern Recognition, 32: 1979-1998, 1999.

Mirsky, E. et al. "MATRIX: A Reconfigurable Computing Architecture with Configurable Instruction Distribution and Deployable Resources" IEEE Symposium on FPGAs for Custom Computing Machines, Apr. 17-19, 1996, Napa, CA.

Miyamori, T., et al. "A Quantitative Analysis of Reconfigurable Coprocessors for Multimedia Applications" IEEE Symposium on FPGAs for Custom Computing Machines, 1998.

Mohamed, A., et al. "Hardware Implementation of Phong Shading using Spherical Interpolation" Periodica Polytechnica, vol. 44, Nos. 3-4, 2000.

Mooney, Vincent J. III "Path-Based Edge Activation for Dynamic Run-Time Scheduling" International Symposium on System Synthesis (ISSSS'99), pp. 30-36, Nov. 1999.

Moreano, J., et al. "Datapath Merging and Interconnection Sharing for Reconfigurable Architectures" ACM ISSS'02, pp. 38-43 (2002).

Moreno, J.M. et al. "Approaching Evolvable Hardware to Reality: The Role of Dynamic Reconfiguration and Virtual Meso-structures" Microelectronics for Neural, Fuzzy and Bio-Inspired Systems, 1999.

Nagaraj, Raghavendra C. "Complexity Analysis of MPEG-4 Video Object Profiles" A Masters Thesis, Arizona State University, 2000.

Perchant, A., et al. "A New Definition for Fuzzy Attributed Graph Homomorphism with Application to Structural Shape Recognition in Brain Imaging" hi IMTC'99, 16th IEEE Instrumentation and Measurement Technology Conference, pp. 1801-1806 Venice, Italy, May 1999.

Rabaey, Jan M. "Reconfigurable Processing: The Solution to Low-Power Programmable DSP" Proceedings 1997 ICASSP Conference Munich Apr. 1997.

Rangarajan, A., et al. "A Lagrangian Relaxation Network for Graph Matching" IEEE Transactions on Neural Networks, 7 (6): 1365-1381, 1996.

Rao, D., et al. "On Clustering for Maximal Regularity Extraction" IEEE Transactions on Computer-Aided Design, vol. 12, No. 8, Aug. 1993.

Rewini, H., et al. "Static Scheduling of Conditional Branches in Parallel Programs" Journal of Parallel and Distributed Computing, 24, 4154 (1995).

Reyner, Steven W. "An Analysis of a Good Algorithm for the Subtree Problem" SIAM Journal of Computing, 6 (4): 730-732, 1997.

Sarrigeorgidis, K., et al. "Massively Parallel Wireless Reconfigurable Processor Architecture and Programming" IOtlz Reconfigurable Architectures Workshop, Nice, France, Apr. 22, 2003.

Sawitzki, S. et al. "CoMPARE: A Simple Reconfigurable Processor Architecture Exploiting Instruction Level Parallelism" Proc. of PART, pp. 213-224, Springer-Verlag, 1998.

Schoner, B., et al. "Issues in Wireless Video Coding using Run-Time-reconfigurable FPGAs" Proc of the IEEE Symposium on FPGAs for Custom Computing Machines, Napa CA, Apr. 19-21, 1995.

Singh, A., et al. "Efficient circuit Clustering for Area and Power Reduction in FPGAs" ACM Transactions on Design Automation of Electronic Systems, vol. 7, Issue 4, Oct. 2002, pp. 643-663.

\* cited by examiner

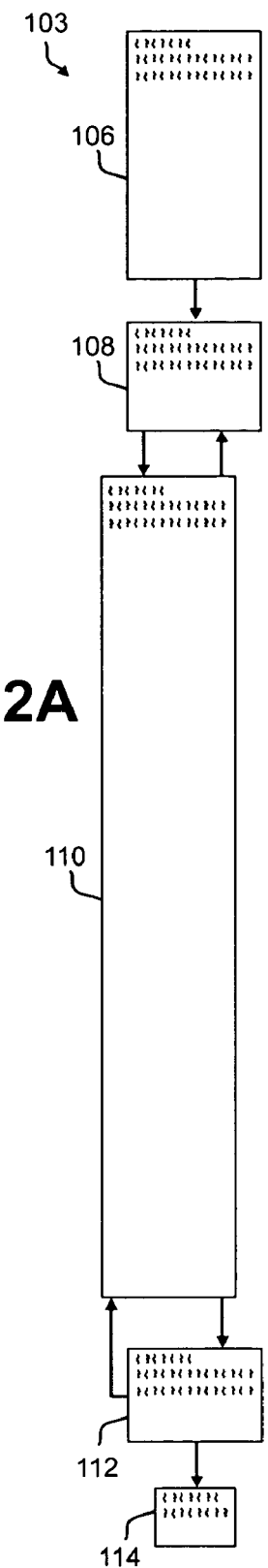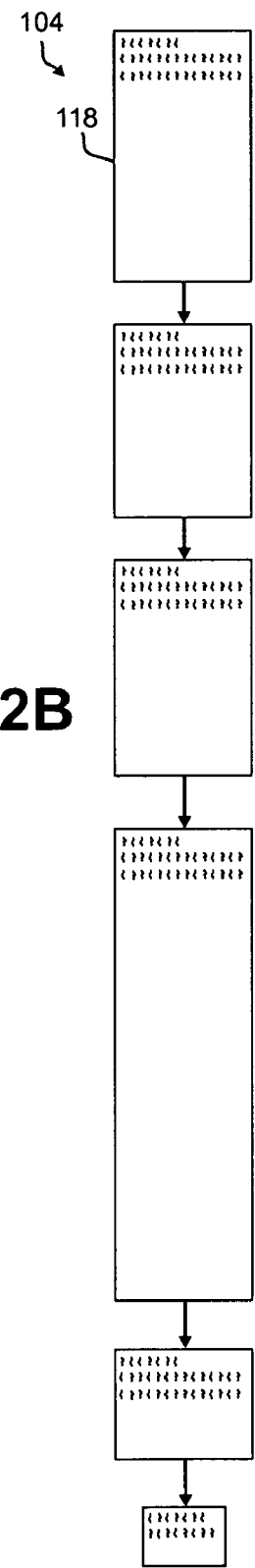
Fig. 2A
Fig. 2B

Fig. 6B
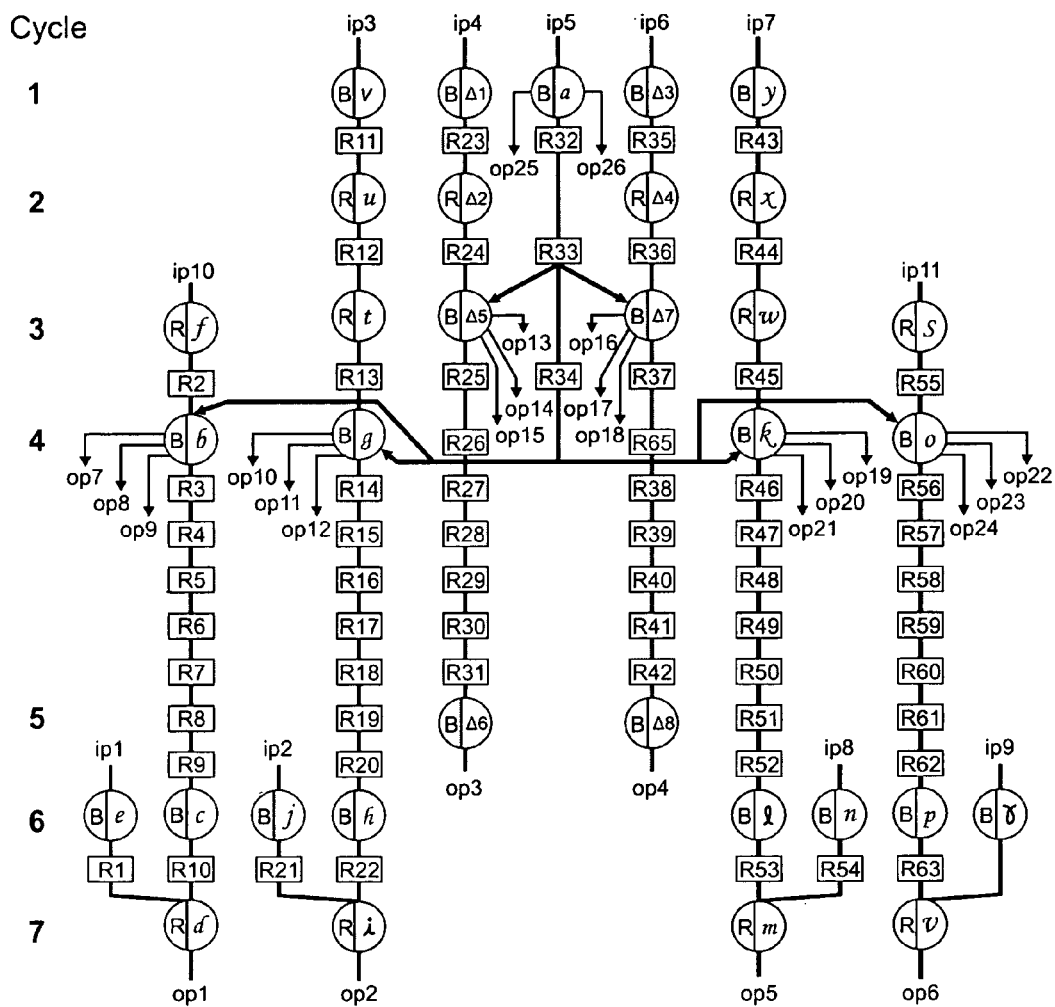
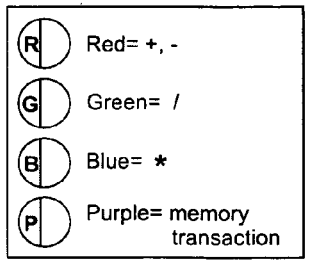

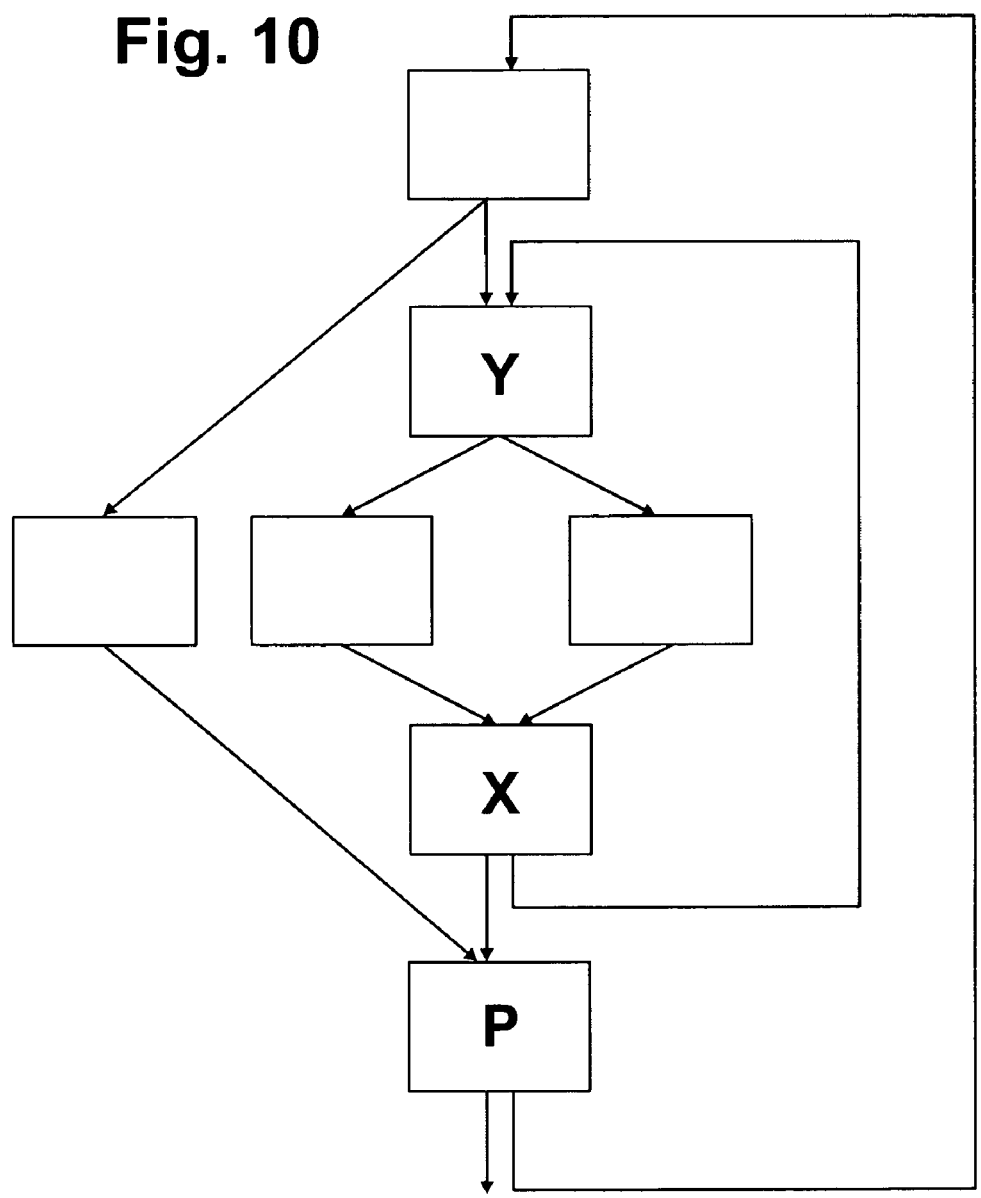

Decision (a, b, e, g)
Merge (c, e, j)
Pass (d, f, h, i)

Fig. 29A
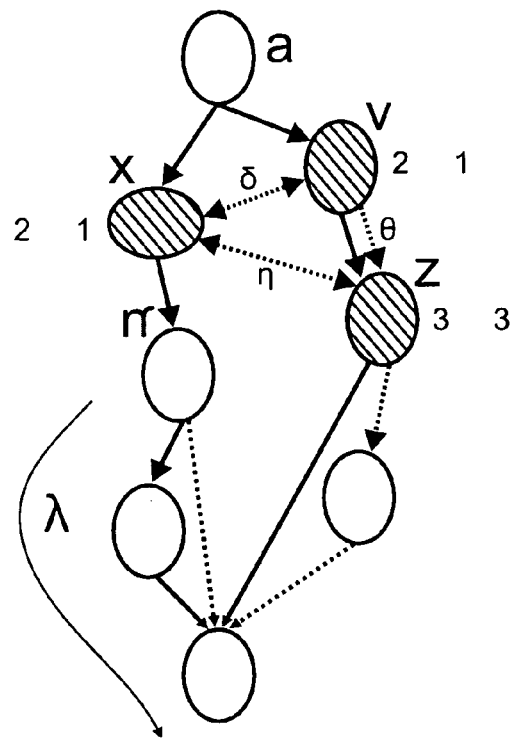
Fig. 29B
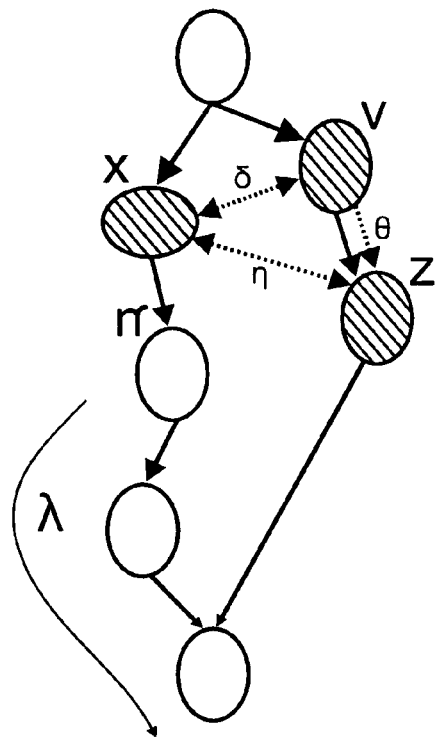
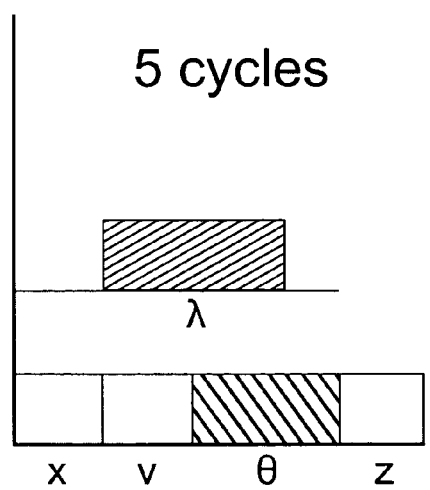
5 cycles
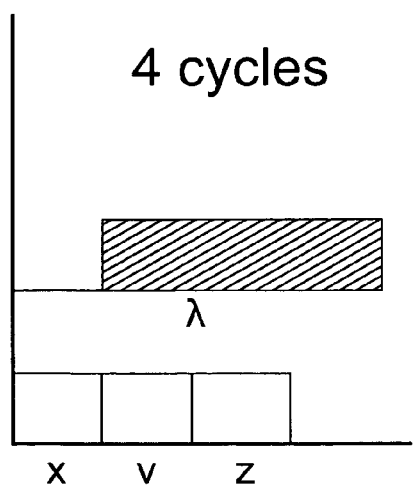
4 cycles

Fig. 31

|  | Expression α | Expression β | Expression θ | Expression γ |
|---|---|---|---|---|
| Process A |  | 0 |  |  |
| Process B |  | 10 |  |  |
| ..... |  |  |  |  |
| ....... |  |  |  |  |

|  | Expression α | Expression β | Expression θ | Expression γ |
|---|---|---|---|---|
| Process A |  | 30 |  |  |
| Process B |  | 40 |  |  |
| ..... |  |  |  |  |
| ....... |  |  |  |  |

↓ .......
and so on

CLU=Configurable Logic Unit
LU=Logic Units
SN=Switching Network
CM=Configuration Memory
LSM=Logic Schedule Manager
NSM=Network Schedule Manager Routing Architecture Overview Multiple vs. Single Building Block Control Flow Effect on Clusters

Fig. 41A  Cost Matrix
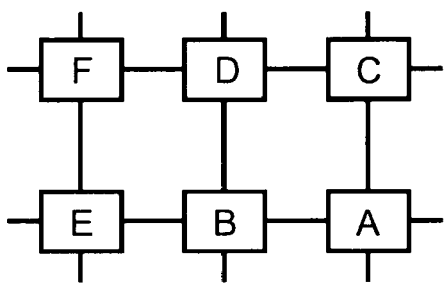
Fig. 41B  Pre-Placement
Fig. 42  Design Flow
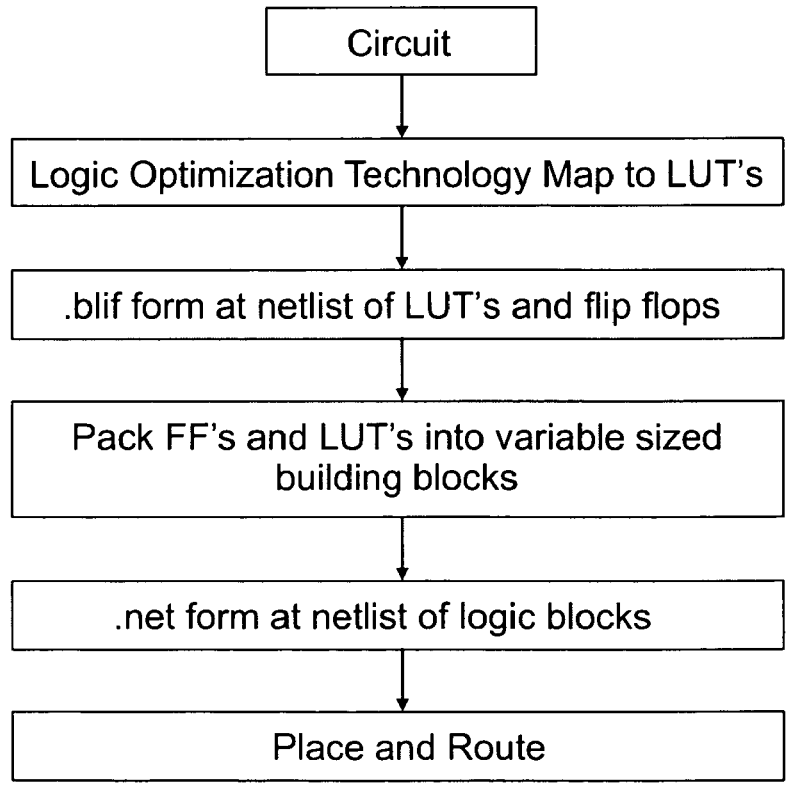

Control Flow Linked List

Modified Structure Obtained From the Control Flow Linked List

Fig. 46

Initial Zone Structure Obtained

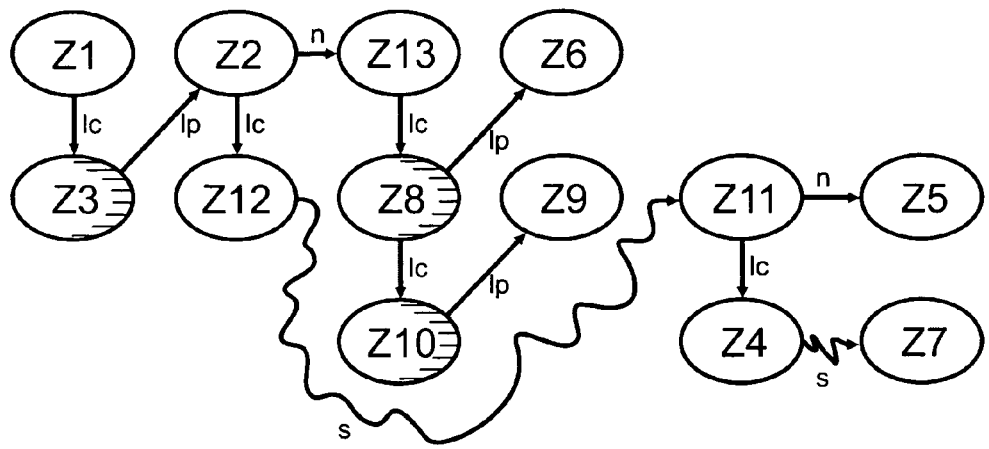

s: sibling relationship
lc: later child relationship
lp: later parent relationship
In all types, destination zone is (lc/s/lp) of source zone.
The shaded zones are Loop types.

Fig. 47

Comprehensive Zone Structure
with Cancelled Links Shown

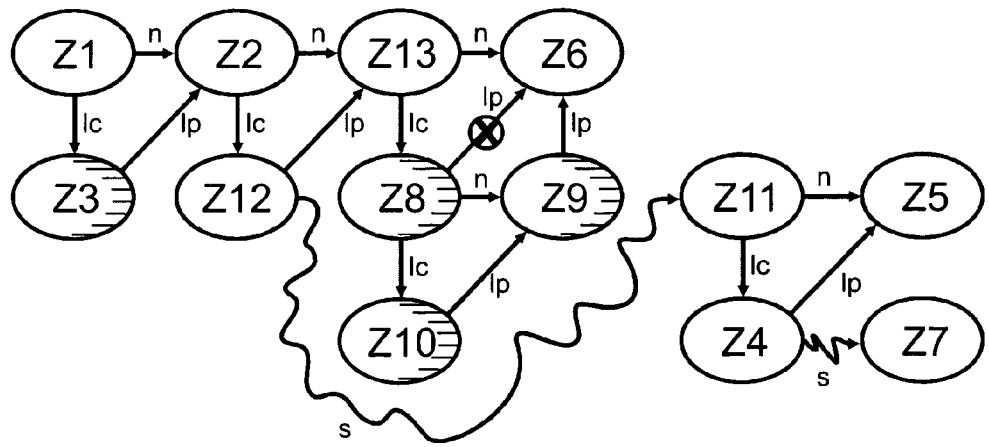

s: sibling relationship
lc: later child relationship
lp: later parent relationship
In all types, destination zone is (lc/s/lp) of source zone.
The shaded zones are Loop types.

Comprehensive Zone Structure with Cancelled Links Removed s: sibling relationship
lc: later child relationship
lp: later parent relationship
In all types, destination zone is (lc/s/lp) of source zone.
The shaded zones are Loop types.

Sequentially Ordered Zones

RECONFIGURABLE PROCESSING

CROSS REFERENCE TO RELATED APPLICATIONS

This application claims priority from provisional patent application Ser. No. 60/445,339 filed Feb. 5, 2003 in the name of Aravind R. Dasu et al. entitled "Reconfigurable Processing," provisional patent application Ser. No. 60/490,162 filed Jul. 24, 2003 in the name of Aravind R. Dasu et al. entitled "Algorithm Design for Zone Pattern Matching to Generate Cluster Modules and Control Data Flow Based Task Scheduling of the Modules," provisional patent application Ser. No. 60/493,132 filed Aug. 6, 2003 in the name of Aravind R. Dasu et al. entitled "Heterogeneous Hierarchical Routing Architecture," and provisional patent application Ser. No. 60/523,462 filed Nov. 18, 2003 in the name of Aravind R. Dasu et al. entitled "Methodology to Design a Dynamically Reconfigurable Processor," all of which are incorporated herein by reference.

FIELD OF THE INVENTION

This invention relates to the accomplishment of moderately complex computer applications by a combination of hardware and software, and more particularly to methods of optimizing the implementation of portions of such computer applications in hardware, hardware thus produced, and to the resultant combination of hardware and software.

BACKGROUND

A number of techniques have been proposed for improving the speed and cost of moderately complex computer program applications. By moderately complex computer programming is meant programming of about the same general level of complexity as multimedia processing.

Multimedia processing is becoming increasingly important with wide variety of applications ranging from multimedia cell phones to high definition interactive television. Media processing involves the capture, storage, manipulation and transmission of multimedia objects such as text, handwritten data, audio objects, still images, 2D/3D graphics, animation and full-motion video. A number of implementation strategies have been proposed for processing multimedia data. These approaches can be broadly classified based on the evolution of processing architectures and the functionality of the processors. In order to provide media processing solutions to different consumer markets, designers have combined some of the classical features from both the functional and evolution based classifications resulting in many hybrid solutions.

Multimedia and graphics applications are computationally intensive and have been traditionally solved in 3 different ways. One is through the use of a high speed general purpose processor with accelerator support, which is essentially a sequential machine with enhanced instruction set architecture. Here the overlaying software bears the burden of interpreting the application in terms of the limited tasks that the processor can execute (instructions) and schedule these instructions to avoid resource and data dependencies. The second is through the use of an Application Specific Integrated Circuit (ASIC) which is a completely hardware oriented approach, spatially exploiting parallelism to the maximum extent possible. The former, although slower, offers the benefit of hardware reuse for executing other applications. The latter, albeit faster and more power, area and time efficient for a specific application, offers poor hardware reutilization for other applications. The third is through specialized programmable processors such as DSPs and media processors. These attempt to incorporate the programmability of general purpose processors and provide some amount of spatial parallelism in their hardware architectures.

The complexity, variety of techniques and tools, and the high computation, storage and I/O bandwidths associated with multimedia processing presents opportunities for reconfigurable processing to enables features such as scalability, maximal resource utilization and real-time implementation. The relatively new domain of reconfigurable solutions lies in the region of computing space that offers the advantages of these approaches while minimizing their drawbacks. Field Programmable Gate Arrays (FPGAs) were the first attempts in this direction. But poor on-chip network architectures lead to high reconfiguration times and power consumptions. Improvements over this design using Hierarchical Network architectures with RAM style configuration loading have lead to a factor of two to four times reduction in individual configuration loading times. But the amount of redundant and repetitive configurations still remains high. This is one of the important factors that leads to the large overall configuration times and high power consumption compared to ASIC or embedded processor solutions.

A variety of media processing techniques are typically used in multimedia processing environments to capture, store, manipulate and transmit multimedia objects such as text, handwritten data, audio objects, still images, 2D/3D graphics, animation and full-motion video. Example techniques include speech analysis and synthesis, character recognition, audio compression, graphics animation, 3D rendering, image enhancement and restoration, image/video analysis and editing, and video transmission. Multimedia computing presents challenges from the perspectives of both hardware and software. For example, multimedia standards such as MPEG-1, MPEG-2, MPEG-4, MPEG-7, H.263 and JPEG 2000 involve execution of complex media processing tasks in real-time. The need for real-time processing of complex algorithms is further accentuated by the increasing interest in 3-D image and stereoscopic video processing. Each media in a multimedia environment requires different processes, techniques, algorithms and hardware. The complexity, variety of techniques and tools, and the high computation, storage and UO bandwidths associated with processing at this level of complexity presents opportunities for reconfigurable processing to enables features such as scalability, maximal resource utilization and real-time implementation.

To demonstrate the potential for reconfiguration in multimedia computations, the inventors have performed a detailed complexity analysis of the recent multimedia standard MPEG-4. The results show that there are significant variations in the computational complexity among the various modes/operations of MPEG-4. This points to the potential for extensive opportunities for exploiting reconfigurable implementations of multimedia/graphics algorithms.

The availability of large, fast, FPGAs (field programmable gate arrays) is making possible reconfigurable implementations for a variety of applications. FPGAs consist of arrays of Configurable Logic Blocks (CLBs) that implement various logical functions. The latest FPGAs from vendors like Xilinx and Altera can be partially configured and run at several megahertz. Ultimately, computing devices may be able to adapt the underlying hardware dynamically in response to changes in the input data or processing environment and process real time applications. Thus FPGAs have established a point in the computing space which lies in between the dominant extremes of computing, ASICS and software programmable/instruction set based architectures. There are three dominant features that differentiate reconfigurable architectures from instruction set based programmable computing architectures and ASICs: (i) spatial implementation of instructions through a network of processing elements with the absence of explicit instruction fetch-decode model (ii) flexible interconnects which support task dependent data flow between operations (iii) ability to change the Arithmetic and Logic functionality of the processing elements. The reprogrammable space is characterized by the allocation and structure of these resources. Computational tasks can be implemented on a reconfigurable device with intermediate data flowing from the generating function to the receiving function. The salient features of reconfigurable machines are:

Instructions are implemented through locally configured processing elements, thus allowing the reconfigurable device to effectively process more instructions into active silicon in each cycle.

Intermediate values are routed in parallel from producing functions to consuming functions (as space permits) rather than forcing all communication to take place through a central resource bottleneck.

Memory and interconnect resources are distributed and are deployed based on need rather than being centralized, hence presenting opportunities to extract parallelism at various levels.

The networks connecting the Configuration Logic Blocks or Units (CLBs) or processing elements can range from full connectivity crossbar to neighbor only connecting mesh networks. The best characterization to date which empirically measures the growth in the interconnection requirements with respect to the number of Look-Up Tables (LUTs) is the Rent's rule which is given as follows:

$$N^{io} = CN^p_{gates}$$

where $N^{io}$ corresponds to the number of interconnections (in/out lines) in a region containing $N_{gates}$. C and p are empirical constants. For logical functions typically p ranges from $0.5 < p < 0.7$.

It has been shown [1] (by building the FPGA based on Rent's model and using a hierarchical approach) that the configuration instruction sizes in traditional FPGAs are higher than necessary, by at least a factor of two to four. Therefore for rapid configuration, off-chip context loading becomes slow due to the large amount of configuration data that must be transferred across a limited bandwidth I/O path. It is also shown that greater word widths increase wiring requirements, while decreasing switching requirements. In addition, larger granularity data paths can be used to reduce instruction overheads. The utility of this optimization largely depends on the granularity of the data which needs to be processed. However, if the architectural granularity is larger than the task granularity, the device's computational power will be under utilized. Another promising development in efforts to reduce configuration time is shown in [2].

Most of the current approaches towards building a reconfigurable processor are targeted towards performance in terms of speed and are not tuned for power awareness or configuration time optimization. Therefore certain problems have surfaced that need to be addressed at the pre-processing phase.

First, the granularity or the processing ability of the Configurable Logic Units (CLUs) must be driven by the set of applications that are intended to be ported onto the processing platform. Some research groups have taken the approach of visual inspection [3], while others have adopted algorithms of exponential complexity [4,5] to identify regions in the application's Data Flow Graphs (DFGs) that qualify for CLUs. None of the current approaches attempt to identify the regions through an automated low complexity approach that deals with Control Data Flow Graphs (CDFGs).

Secondly, the number of levels in hierarchical network architecture must be influenced by the number of processing elements or CLUs needed to complete the task/application. This in turn depends on the amount of parallelism that can be extracted from the algorithm and the percentage of resource utilization. To the best of our knowledge no research group in the area of reconfigurable computing has dealt with this problem.

Thirdly, the complex network on the chip, makes dynamic scheduling expensive as it adds to the primary burden of power dissipation through routing resource utilization. Therefore there is a need for a reconfiguration aware scheduling strategy. Most research groups have adopted dynamic scheduling for a reconfigurable accelerator unit through a scheduler that resides on a host processor [6,7].

The increasing demand for fast processing, high flexibility and reduced power consumption naturally demand the design and development of a low configuration time aware-dynamically reconfigurable processor.

It is an object, therefore, to provide a low area, low power consuming and fast reconfigurable processor.

Task scheduling [1] is an essential part of the design cycle of hardware implementation for a given application. By definition, scheduling refers to the ordering of sub-tasks belonging to an application and the allocation of resources to these tasks. Two types of scheduling techniques are static and dynamic scheduling. Any application can be modeled as a Control-Data Flow Graph. Most of the current applications provide a large amount of variations to users and hence are control-dominated. To arrive at an optimal static schedule for such an application would involve a highly complex scheduling algorithm. Branch and Bound is an example of such an algorithm with exponential complexity. Several researchers have addressed task scheduling and one group has also addressed scheduling for conditional tasks.

Any given application can be modeled as a CDFG G(V,E). V is the set of all nodes of the graph. Theses nodes represent the various tasks of the CDFG. E is the set of all communication edges. These edges can be either conditional or unconditional. There are two possible methods of scheduling this CDFG which have been listed below.

Static scheduling of tasks is done at compile time. It is assumed that lifetimes of all the nodes are known at compile time. The final schedule is stored on-chip. During run-time, if there is a mistake in the assumption of lifetime of any node, then the schedule information needs to be updated. Advantage of this method is that worst-case execution time is guaranteed. But, a static schedule is always worse than a dynamic schedule in terms of optimality. Some of the existing solutions for static scheduling are stated here.

Chekuri [2] discusses the earliest branch node retirement scheme. This is applicable for trees and s-graphs. An s-graph is a graph where only one path has weighted nodes. In this case, it is a collection of Directed Acyclic Graphs (DAGs) representing basic blocks which all end in branch nodes, and the options at the branch nodes are: exit from the whole graph or exit to another branch node. The problem with this approach is that it is applicable only to small graphs and also restricted to S-graphs and trees. It also does not consider nodes mapped to specific processing elements.

Pop [3] tackles control task scheduling in 2 ways. The first is partial critical path based scheduling. But they do not assume that the value of the conditional controller is known prior to the evaluation of the branch operation. They also propose the use of a branch and bound technique for finding a schedule for every possible branch outcome. This is quite exhaustive, but it provides an optimal schedule. Once all possible schedules have been obtained, the schedules are merged. The advantages are that it is optimal, but it has the drawback of being quite complex. It also does not consider loop structures. Scheduling of tasks is done during run-time. Main advantage of such an approach is that there is no need for a schedule to be stored on-chip. Moreover, the schedule obtained is optimal. But, a major limiting factor is that the schedule information needs to be communicated to all the processing elements on the chip at all time. This is a degrading factor in an architecture where interconnects occupy 70% of total area.

Jha [4] addresses scheduling of loops with conditional paths inside them. This is a good approach as it exploits parallelism to a large extent and uses loop unrolling. But the drawback is that the control mechanism for having knowledge of each iteration and the resource handling that iteration is very complicated. This is useful for one or two levels of loop unrolling. It is quite useful where the processing units can afford to communicate quite often with each other and the scheduler. But in our case, the network occupies about 70% of the chip area [6] and hence cannot afford to communicate with each other too often. Moreover the granularity level of operation between processing elements is beyond a basic block level and hence this method is not practical.

Mooney [5] discusses a path based edge activation scheme. This means that if for a group of nodes (which must be scheduled onto the same processing unit and whose schedules are affected by branch paths occurring at a later stage) one knows ahead of time the branch controlling values, then one can at run time prepare all possible optimized list schedules for every possible set of branch controller values. This method is very similar to the partial critical path based method proposed by Pop discussed above. It involves the use of a hardware scheduler which is an overhead.

Existing research work on scheduling applications for reconfigurable devices has been focused on context-scheduling. A context is the bit-level information that is used to configure any particular circuit to do a given task. A brief survey of research done in this area is given here.

Noguera [7] proposes a dynamic scheduler and four possible scheduling algorithms to schedule contexts. These contexts are used to configure the Dynamic Reconfiguration Logic (DRL) blocks. This is well-suited for applications which have non-deterministic execution times.

Schmidt [8] aims to dynamically schedule tasks for FPGAs. Initially, all the tasks are allocated as they come till the entire real estate is used up. Schmidt proposes methods to reduce the waiting time of the tasks arriving next. A proper rearrangement of tasks currently executing on the FPGA is done in order to place the new task. A major limitation of this method is that it requires knowing the target architecture while designing the rearrangement techniques.

Fernandez [9] discusses a scheduling strategy that aims to allocate tasks belonging to a DFG to the proposed Morpho-Sys architecture. All the tasks are initially scheduled using a heuristic-based method which minimizes the total execution time of the DFG. Context loading and data transfers are scheduled on top of the initial schedule. Fernandez tries to hide context loading and data transfers behind the computation time of kernels. A main drawback is that this method does not apply for CDFG scheduling.

Bhatia [10] proposes a methodology to do temporal partitioning of a DFG and then scheduling the various partitions. The scheduler makes sure that the data dependence between the various partitions is maintained. This method is not suited for our purpose which needs real-time performance.

Memik [11] describes super-scheduler to schedule DFGs for reconfigurable architectures. He initially allocates the resources to the most critical path of the DFG. Then the second most critical path is scheduled and so on. Scheduling of paths is done using Non-crossing Bipartite matching. Though the complexity of this algorithm is less, the schedule is nowhere near optimal.

Jack Liu [12] proposes Variable Instruction Set Computer (VISC) architecture. Scheduling is done at the basic block level. An optimal schedule to order the instructions within a basic block has been proposed. This order of instructions is used to determine the hardware clusters.

An analysis of the existing work on scheduling techniques for reconfigurable architectures has shown that there is not enough work done on static scheduling techniques for CDFGs. This shows the need for a novel method to do the same.

The VLSI chip design cycle includes the steps of system specification, functional design, logic design, circuit design, physical design, fabrication and packaging. The physical design automatic of FPGA involves three steps which include partitioning, placement and routing.

Despite advances in VLSI design automation, the time it takes to market for a chip is unacceptable for many applications. The key problem is time taken due to fabrication of chips and therefore there is a need to find new technologies, which minimize the fabrication time. Gate Arrays use less time in fabrication as compared to full custom chips since only routing layers are fabricated on top of pre-fabricated wafer. However fabrication time for gate arrays is still unacceptable for several applications. In order to reduce the time to fabricate interconnects; programmable devices have been introduced which allow users to program the devices as well as interconnect.

FPGA is a new approach to ASIC design that can dramatically reduce manufacturing turn around time and cost. In its simplest form an FPGA consists of regular array of programmable logic blocks interconnected by a programmable routing network. A programmable logic block is a RAM and can be programmed by the user to act as a small logic module. The key advantage of FPGA is re-programmability.

The VLSI chip design cycle includes the steps of system specification, functional design, logic design, circuit design, physical design, fabrication and packaging. Physical design includes partitioning, floor planning, placement, routing and compaction.

The physical design automation of FPGAs involves three steps, which include partitioning, placement, and routing. Partitioning in FPGAs is significantly different than the partitioning s in other design styles. This problem depends on the architecture in which the circuit has to be implemented. Placement in FPGAs is very similar to the gate array placement. Routing in FPGAs is to find a connection path and program the appropriate interconnection points. In this step the circuit representation of each component is converted into a geometric representation. This representation is a set of geometric patterns, which perform the intended logic function of the corresponding component. Connections between different components are also expressed as geometric patterns. Physical design is a very complex process and therefore it is usually broken into various subsets.

The input to the physical design cycle is the circuit diagram and the output is the layout of the circuit. This is accomplished in several stages such as partitioning, floor planning, placement, routing and compaction.

A chip may contain several transistors. Layout of the entire circuit cannot be handled due to the limitation of memory space as well as computation power available. Therefore it is normally partitioned by grouping the components into blocks. The actual partitioning process considers many factors such as the size of the blocks, number of blocks, and the number of interconnections between the blocks. The set of interconnections required is referred as a net list. In large circuits the partitioning process is hierarchical and at the topmost level a chip may have 5 to 25 blocks. Each block is then partitioned recursively into smaller blocks.

This step is concerned with selecting good layout alternatives for each block as well as the entire chip. The area of each block can be estimated after partitioning and is based approximately on the number and type of commonness in that block. In addition interconnect area required within the block must also be considered. Very often the task of floor plan layout is done by a design engineer rather than a CAD tool due to the fact that human is better at visualizing the entire floor plan and take into account the information flow. In addition certain components are often required to be located at specific positions on the chip. During placement the blocks are exactly positioned on the chip. The goal of placement is to find minimum area arrangement for the blocks that allows completion of interconnections between the blocks while meeting the performance constraints. Placement is usually done in two phases. In the first phase initial placement is done. In the second phase the initial placement is evaluated and iterative improvements are made until layout has minimum area or best performance.

The quality of placement will not be clear until the routing phase has been completed. Placement may lead to un-routable design. In that case another iteration of placement is necessary. To limit the number of iterations of the placement algorithm an estimate of the required routing space is used during the placement process. A good routing and circuit performance heavily depend on a good placement algorithm. This is due to the fact that once the position of the block is fixed; there is not much to do to improve the routing and the circuit performance.

The objective of routing is to complete the interconnection between the blocks according to the specified net list. First the space that is not occupied by the blocks (routing space) is partitioned into rectangular regions called channels and switchboxes. This includes the space between the blocks. The goal of the router is to complete all circuit connections using the shortest possible wire length and using only the channel and switch boxes. This is usually done in two phases referred as global routing and detailed routing phases. In global routing connections are completed between the proper blocks disregarding the exact geometric details of each wire. For each wire global router finds a list of channels and switchboxes to be used as passageway for that wire. Detailed routing that completes point-to-point connections follows global routing. Global routing is converted into exact routing by specifying the geometric information such as location and spacing of wires. Routing is a very well defined studied problem. Since almost all routing problems are computationally hard the researchers have focused on heuristic algorithms.

Compaction is the task of compressing the layout in all directions such that the total area is reduced. By making the chip smaller wire lengths are reduced which in turn reduces the signal delay.

Generally approaches to global routing are classified as sequential and concurrent approaches.

In one approach nets are routed one by one. If a net is routed it may block other nets which are to be routed. As a result this approach is very sensitive to the order of the nets that are considered for routing. Usually the nets are ordered with respect to their criticality. The criticality of a net is determined by the importance of the net. For example a clock net may determine the performance of the circuit so it is considered highly critical. However sequencing techniques don't solve the net ordering problem satisfactorily. An improvement phase is used to remove blockages when further routing is not feasible. This may also not solve the net ordering problem so in addition to that 'rip-up and reroute' technique [Bol79, DK82] and 'shove-aside' techniques are used. In rip-up and reroute the interfering wires are ripped up and rerouted to allow routing of affected nets. Whereas in shove aside technique wires that allow completion of failed connections are moved aside without breaking the existing connection. Another approach [De86] is to first route simple nets consisting of only two or three terminals since there are few choices for routing such nets. After the simple nets are routed, a Steiner Tree algorithm is used to route intermediate nets. Finally a maze routing algorithm is used to route the remaining multi-terminal nets that are not too numerous.

To match the needs of the future moderately complex applications, provided is the first of a series of tools intended to help in the design and development of a dynamically reconfigurable multimedia processor.

BRIEF SUMMARY

In accordance with this invention, designing processing elements based on identifying correlated compute intensive regions within each application and between applications results in large amounts of processing in localized regions of the chip. This reduces the amount of reconfigurations and hence gives faster application switching. This also reduces the amount of on-chip communication, which in turn helps reduce power consumption. Since applications can be represented as Control Data Flow Graphs (CDFGs) such a preprocessing analysis lies in the area of pattern matching, specifically graph matching. In this context a reduced complexity, yet exhaustive enough graph matching algorithm is provided. The amount of on-chip communication is reduced by adopting reconfiguration aware static scheduling to manage task and resource dependencies on the processor. This is complemented by a divide and conquer approach which helps in the allocation of an appropriate number of processing units aimed towards achieving uniform resource utilization.

In accordance with one aspect of the present invention a control data flow graph is produced from source code for an application having complexity approximating that of MPEG-4 multimedia applications. From the control data flow graph are extracted basic blocks of code represented by the paths between branch points of the graph. Intermediate data flow graphs then are developed that represent the basic blocks of code. Clusters of operations common to the intermediate data flow graphs are identified. The largest common subgraph is determined from among the clusters for implementation in hardware.

Efficiency is enhanced by ASAP scheduling of the largest common subgraph. The ASAP scheduled largest common subgraph then is applied to the intermediate flow graphs to which the largest common subgraph is common. The intermediate flow graphs then are scheduled for reduction of time of operation. This scheduling produces data patches representing the operations and timing of the scheduled intermediate flow graphs having the ASAP scheduled largest common subgraph therein. The data patches are then combined to include the operations and timing of the largest common subgraph and the operations and timing of each of the intermediate flow graphs that contain the largest common subgraph.

At this point, it will be appreciated, the utilization of the hardware that represents the ASAP-scheduled largest common subgraph by the operations of each implicated intermediate flow graph needs scheduling. Bearing in mind duration of use of the hardware representing the largest common subgraph by the operations of each of the implicated intermediate flow graphs, hardware usage is scheduled for fastest completion of the combined software and hardware of operations of all affected intermediate flow graph as represented in the combined data patches. Our target architecture is a reconfigurable architecture. This adds a new dimension to the CDFG discussed above. A new type of edge between any two nodes of the CDFG that will be implemented on the same processor is possible. Let us call this a "Reconfiguration edge". A reconfiguration time can be associated with this edge. This information must be accounted for while scheduling this modified CDFG. Method of scheduling according to the present invention treats reconfiguration edges in the same way as communication edges and includes the reconfiguration overhead while determining critical paths. This enables employment of the best CDFG scheduling technique and incorporation of the reconfiguration edges.

To realize the largest common flow graph in hardware, processor component layout and interconnections by connective fabric needs to be addressed.

In accordance with the invention, a tool set that will aid the design of a dynamically reconfigurable processor through the use of a set of analysis and design tools is provided. A part of the tool set is a heterogeneous hierarchical routing architecture. Compared to hierarchical and symmetrical FPGA approaches building blocks are of variable size. This results in heterogeneity between groups of building blocks at the same hierarchy level as opposed to classical H-FPGA approach. Also in accordance with this invention a methodology for the design and implementation of the proposed architecture, which involves packing, hierarchy formation, placement, network scheduler tools, is provided.

The steps of component layout and interconnectivity involve (1) partitioning—cluster recognition and extraction, (2) placement—the location of components in the available area on a chip, and (3) routing—the interconnection of components via conductors and switches with the goal of maximum speed and minimum power consumption.

BRIEF DESCRIPTION OF THE DRAWINGS

FIGS. 2 A and B are illustrations of a pair of control flow graphs from input source code representing separate operations of the application to be run by a reconfigurable circuit;

FIG. 3 is an enlarged illustration of a basic block extracted from one of the control flow graphs of FIG. 2, and shows the individual lines of code represented by the block;

FIG. 10 is a block diagram of a control flow graph having multilevel nested loops;

FIG. 13 A is a diagrammatic illustration of further, modified bin sequence to which have been sorted the edges of the graph of FIG. 13;

FIG. 14 B is a diagrammatic illustration like that of FIG. 14 A with the further graph G2 which is taken from the graph G1 of FIG. 14 A;

FIGS. 29 A and B are comparative task graphs for an exemplary task and show the effect of reconfiguration time on a schedule;

FIG. 31 is a diagrammatic illustration of updating of logic schedule manager and network schedule manager for a pair of processes, PA and PB;

FIG. 41A is a cost matrix of six blocks used in placement of the blocks in configuring the processor being configured in FIG. 39;

FIG. 41B is a block diagram illustration of the preplacement of the blocks of FIG. 41 A;

FIG. 42 is a flow chart illustrative of the design flow for layout of the reconfigurable processor;

FIG. 46 is a diagrammatic illustration of parent-child relationships among modified list structure zones of FIG. 45;

FIG. 47 is a diagrammatic illustration of the zone structure of FIG. 46 indicating link cancellations;

DETAILED DESCRIPTION

Figure 1:
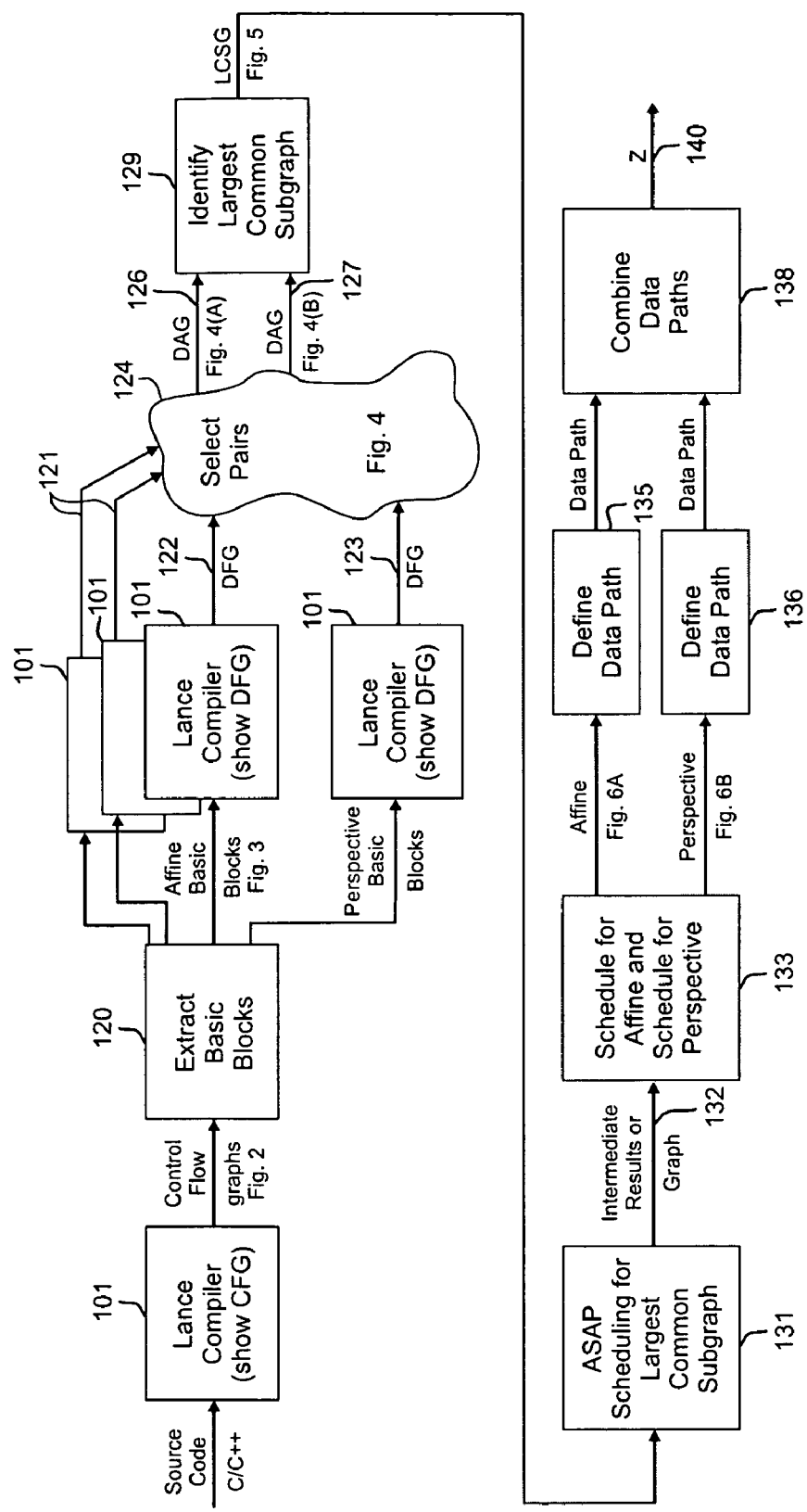
FIG. 1 is a flow chart that indicates major steps in the programming of a reconfigurable circuit device in accordance with the present invention.

Turning to FIG. 1, source code in C or C++ for an MPEG4 multimedia application that includes a pair of its operations "Affine Transform," and "Perspective," are input to a Lance compiler utility 101 running its "Show CFG" operation. This outputs Control Flow Graphs (DFGs). Control Flow Graphs for the Affine Transform and Perspective are shown in FIG. 2. As seen in the Affine CFG of FIG. 2, the Affine Transform Control Flow Graph is composed of a series of basic blocks 106, 108, 110, 112 and 114. The CFG of the multimedia component Perspective is similarly composed of basic blocks. As shown in FIG. 3, CFGs output by the Lance compiler utility 101 are actually more textual than their depictions in FIGS. 2 A and B, but are readily understood to describe basic blocks and their interconnections. The Affine Transform has a number of its blocks 108, 110, 112 arranged in loops. Whereas block 106 is a preloop listing.

Visually, at present, the many CFGs of the multimedia application are inspected for similarity among large control blocks. How big the candidate blocks should be is a judgement call. Similar blocks of more than 50 lines in two or more CFGs are good candidates for development of a Largest Common Flow Graph among them whose operations are to be shared as described below. Smaller basic blocks can similarly be subjected to the development of largest common flow graphs as described below, but at some point the exercise returns insignificant time and cost savings. The Affine Transform preloop basic block 106 has 70 instructions. This is shown in the enlarged depiction of block 106 in FIG. 3. The Perspective preloop basic block 118 has 85 instructions. Those Affine and Perspective preloop instructions are as follows:

Affine Preloop Basic Block 106
```
t541=s_178/2;
t348=2*i0_166;
t349=t348+du0_172;
t350=t541*t349;
t352=2*j0_167;
t353=t352+dv0_173;
t354=t541*t353;
t356=2*i1_168;
t357=t356+du1_174;
t358=t357+du0_172;
t359=t541*t358;
t361=2*j1_169;
t362=t361+dv1_175;
t363=t362+dv0_173;
t364=t541*t363;
t366=2*i2_170;
t367=t366+du2_176;
t368=t367+du0_172
t369=t541*t368;
t371=2*j2_171;
t372=t371+dv2_177;
t373=t372+dv0_173;
t374=t541*t373;
t542=256;
t375=i0_166+t542;
t376=16*t375;
t543=r_179*t359;
t544=16*i1_168;
t21=t543-t544;
t381=-80*t21;
t385=t542*t21;
t386=t381+t385;
t545=176;
t387=t386/t545;
t388=t376+t387;
t546=16*j0_167;
t547=r_179*t354;
t22=t547-t546;
t394=-80*t22;
t395=r_179*t364;
t396=16*j1_169;
t397=t395-t396;
t398=t542*t397;
t399=t394+t398;
t400=t399/t545;
t401=t546+t400;
t548=16*i0_166;
t404=r_179*t350;
t406=t404-t548;
t407=-112*t406;
t408=r_179*t369;
``` t409=16*i2__170;
t410=t408−t409;
t411=t542*t410;
t412=t407+t411;
t549=144;
t413=t412/t549;
t414=t548+t413;
t415=j0__167+t542;
t416=16*t415;
t421=−112*t22;
t422=r__179*t374;
t423=16*j2__171;
t424=t422−t423;
t425=t542*t424;
t426=t421+t425;
t427=t426/t549;
t428=t416+t427;
i__185=0;
Perspective Preloop Basic Block 118
t744=s__221/2;
t542=2*i0__205;
t543=t542+du0__213;
t544=t744*t543;
t546=2*j0__206;
t547=t546+dv0__214;
t548=t744*t547;
t550=2*i1__207;
t551=t550+du1__215;
t552=t551+du0__213;
t553=t744*t552;
t555=2*j1__208;
t556=t555+dv1__216;
t557=t556+dv0__214;
t558=t744*t557;
t560=2*i2__209;
t561=t560+du2__217;
t562=t561+du0__213;
t563=t744*t562;
t565=2*j2__210;
t566=t565+dv2__218;
t567=t566+dv0__214;
t568=t744*t567;
t570=2*i3__211;
t571=t570+du3__219;
t572=t571+du2__217;
t573=t572+du1__215;
t574=t573−du0__213;
t575=t744*t574;
t577=2*j3__212;
t578=t577+dv3__220;
t579=t578+dv2__218;
t580=t579+dv1__216;
t581=t580+dv0__214;
t582=t744*t581;
t745=t544−t553;
t28=t745−t563;
t34=t28+t575;
t746=t568−t582;
t587=t34*t746;
t747=t563−t575;
t748=t548−t558;
t29=t748−t568;
t35=t29+t582;
t592=t747*t35;
t593=t587−t592;
t749=144;
t594=t593*t749;

t750=t553−t575;
t599=t35*t750;
t751=t558−t582;
t604=t751*t34;
t605=t599−t604;
t752=176;
t606=t605*t752;
t609=t750*t746;
t612=t747*t751;
t613=t609−t612;
t614=t553−t544;
t615=t613*t614;
t616=t615*t749;
t617=t594*t553;
t618=t616+t617;
t619=t563−t544;
t620=t613*t619;
t621=t620*t752;
t622=t606*t563;
t623=t621+t622;
t624=t613*t544;
t625=t624*t752;
t626=t625*t749;
t627=t558−t548;
t628=t613*t627;
t629=t628*t749;
t630=t594*t558;
t631=t629+t630;
t632=t568−t548;
t633=t613*t632;
t634=t633*t752;
t635=t606*t568;
t636=t634+t635;
t637=t613*t548;
t638=t637*t752;
t639=t638*t749;
i__228=0;

At 120 in FIG. 1 the basic blocks are extracted from the CFGs 103 and 104 of FIGS. 2 A and B developed by the Lance utility 101. The exemplary Affine and Perspective basic blocks are shown in FIG. 1 being input to the Lance compiler utility running its "Show DFG" operation to develop an Affine data flow graph and a Perspective data flow graph at outputs 122 and 123. The extraction of the basic blocks at 120 in FIG. 1 may be effected manually or by a simple program discarding low instruction count basic blocks prior to passing them along to the Lance compiler 101 for the production of the data flow graphs. The data flow graphs out of the Lance compiler are input to an operation by which pairs of data flow graphs are selected as candidates for development of a largest common subgraph.

Figure 4A:
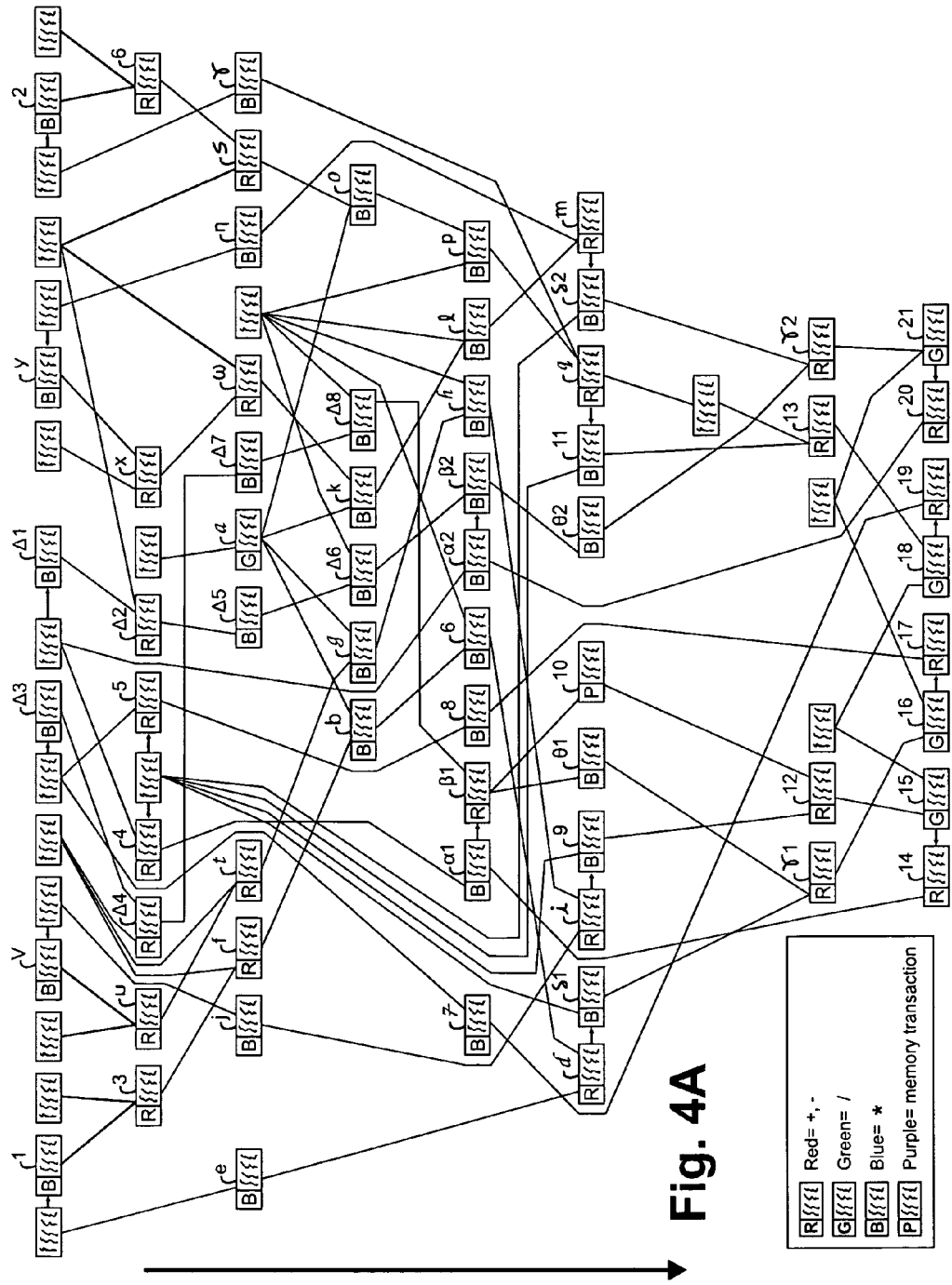
FIGS. 4 A and B are illustrations of a pair of intermediate data flow graphs derived from a pair of basic blocks of FIGS. 2 A and 2B.
Figure 4B:
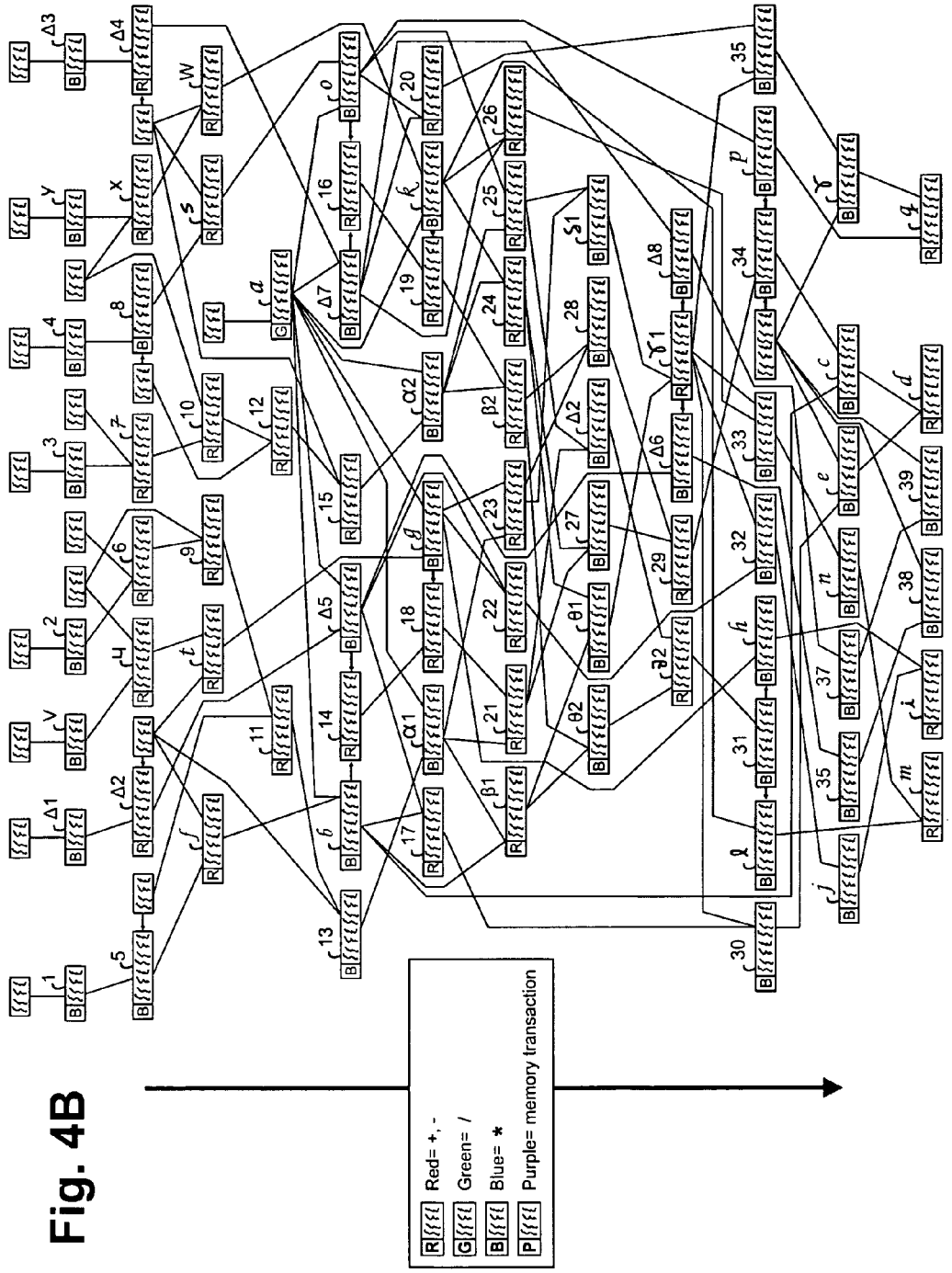

Remembering that many data flow graphs may have been produced from the multimedia application initially input to the Lance compiler utility 101, it is at this point that a selection process identifies the Affine and Perspective as good candidates for pairing to develop the desired largest common subgraph. That selection process is indicated at 124 in FIG. 1. Data flow graphs of the kind selected are shown in FIGS. 4 A and B. These are directed acyclic graphs (DAGs). This is to say, as indicated by the arrows in FIGS. 4 A and B, the operations move in a single direction from top to bottom and do not loop back. The rectangles of FIG. 4 A represent the instructions of the Affine preloop basic block 106 and the rectangles of FIG. 4 B represent the instructions of the Perspective preloop basic block 118.

Again visually, using the color coding indicated in FIGS. 4 A and 4 B as currently implemented, these data flow graphs are compared for similarity and two or more are chosen. Again a simple program may be implemented for the same purpose as will be apparent. See the color key of FIGS. 4 A and 4 B—the instructions contained in the individual rectangles of the data flow graphs like those of FIGS. 4 A and 4 B are add (+), divide (/), multiply (*), subtract (−) and memory transaction (the last not present in FIGS. 4 A and 4 B). To make it visually easier to identify similarities, then, in the present, human visual implementation, each type of instruction is identically color-coded blue, red, green, etc. In the example of FIG. 1, the data flow graphs for the Affine and Perspective preloop basic blocks have been chosen and are input at 126 and 127 to a routine 129 to identify the Largest Common Subgraph (LCSG) shared by the two data flow graphs. One approach to identification of the LCSG based on finding seed basic blocks and building on these is discussed below under "Proposed Approach."

Description of LCSG Scheduling for Shared Resources

Figure 5:
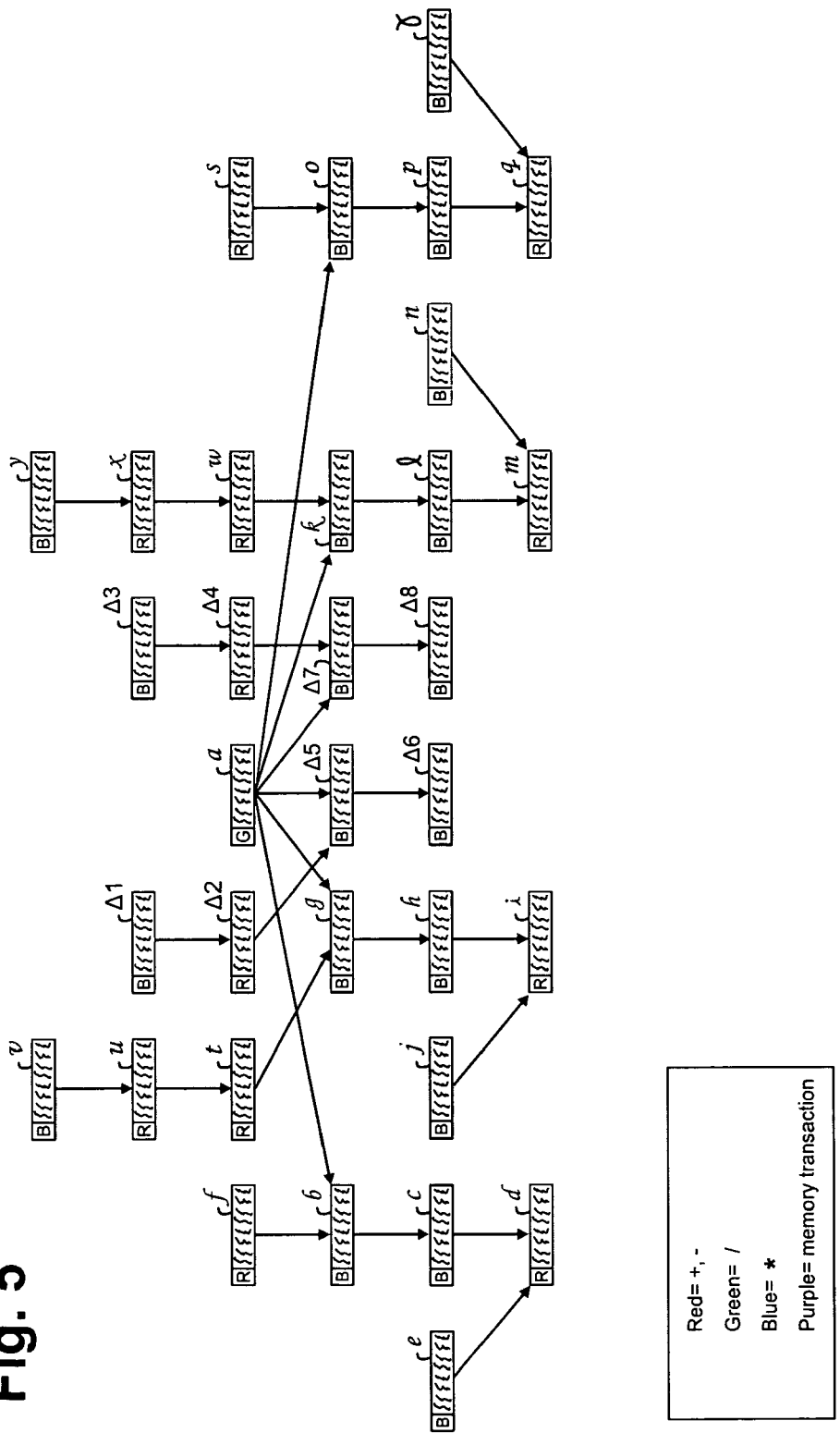
FIG. 5 is an illustration of a largest common subgraph shared by the intermediate data flow graphs of FIGS. 4 A and 4B.

FIG. 5 illustrates the largest common subgraph developed from the Affine and Perspective preloop basic blocks. At 131 and 133 of FIG. 1, ASAP scheduling of the LCSG takes place in known fashion iteratively with the LCSG individually and with the LCSG inserted into the Data Flow Graphs until the most efficient scheduling of the Data Flow Graphs is realized at block 133.

Figure 6A:
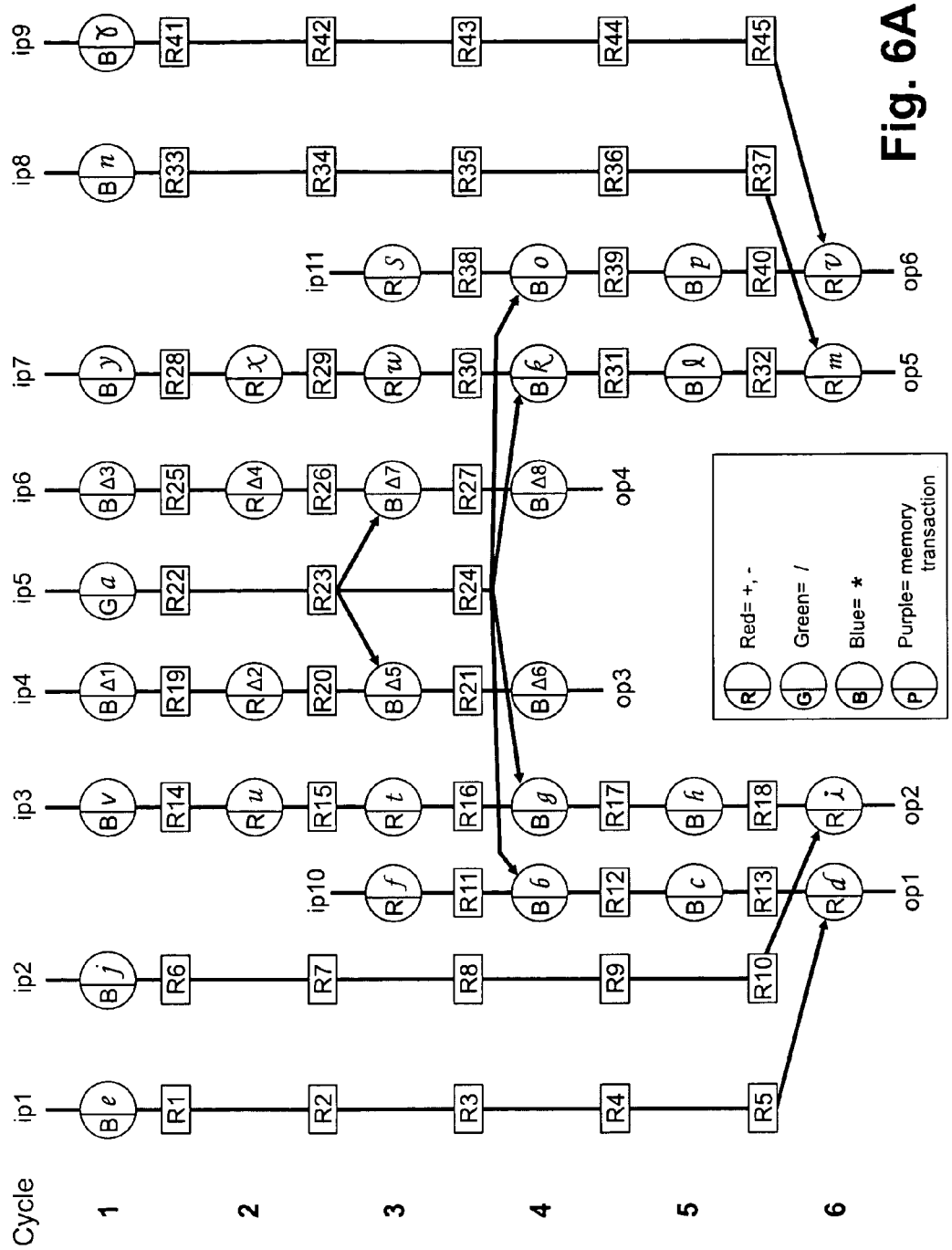
FIGS. 6 A and B are illustrations of the data flow graphs of FIGS. 4 A and 4B incorporating the largest common subgraphs of FIG. 5 and following ASAP scheduling.

ASAP scheduling is a known technique. In the LCSG of FIG. 5 ASAP scheduling is accomplished by moving elements representing instructions upward where possible to permit their use more quickly and perhaps more quickly freeing a circuit component that effects that instruction for a further use. From the LCSG of FIG. 5 it will be seen that 33 instructions from each of the Affine and Perspective codes have now been identified to be implemented in hardware and shared by the two multimedia operations represented by the Affine and Perspective CFGs originally developed at 101. The same will be done for other Control Flow Graphs representing other portions of the multimedia application introduced at the compiler 101. Instructions not covered by a LCSG will be accomplished by general purpose processing look up tables (LUTs) on the ultimate chip. The output from the ASAP scheduling that occurs at 131 in FIG. 1 is an intermediate result or graph at 132. Affine and Perspective DAGs with ASAP scheduling and the inclusion of the common LCSG are shown in FIGS. 6 A and 6 B. In FIG. 6 A, for example, it will be seen that the instruction Δ1 has been moved up from line 2 in FIG. 5's unscheduled LCSG to the same line (line 1) as the instruction V. Likewise the instruction Δ3 has been moved up so that there are now four like instructions in the first line of the LCSG portion of the FIG. 6 A Affine DAG requiring four processing elements. In the second line instruction Δ2 and Δ4 have been moved up and are now at the same line as instruction U and instruction X. These are all like instructions, so four like processing elements will be required to simultaneously run the four instructions. However, the LCSG may, but will not necessarily include, a lesser number of circuit elements of a kind in a single line. The resistors $R_1$, $R_2$ . . . in FIGS. 6 A and 6 B are inserted delays between executions of instructions.

Output from the block 133 of FIG. 1 are the scheduled Affine and Perspective graphs of FIGS. 6 A and 6B. At blocks 135 and 136 data paths are defined for each of these and at block 138 data paths are combined to produce at 140 the code for a circuit Z in VHDL. That code for the combined preloop basic blocks of Affine and Perspective follows:

--- preloop_common.vhd

---

```
library ieee;
use ieee.std_logic_1164.all;
use ieee.std_logic_arith.all;
use ieee.std_logic_unsigned.all;
use ieee.numeric_std.all;
entity preloop_common_datapath is
port(
-- inputs
ip_1, ip_2, ip_3, ip_4, ip_5, ip_6, ip_7, ip_8, ip_9, ip_10, ip_11 :in std_logic_vector(15 downto 0);
-- constant inputs
constant_1, constant_2, constant_3, constant_4, constant_5, constant_6, constant_7,
constant_8, constant_9, constant_10, constant_11, constant_12, constant_13, constant_14,
constant_15, constant_16,
constant_17, constant_18, constant_19, constant_20, constant_21, constant_22 : in
std_logic_vector(15 downto 0);
-- 2 input mux select lines
sel_1, sel_2, sel_11, sel_12, sel_21, sel_22, sel_23, sel_24, sel_25, sel_26,
sel_27, sel_28, sel_29, sel_30 : in std_logic;
-- 3 input mux select lines
sel_3, sel_4, sel_5, sel_6, sel_7, sel_8, sel_9, sel_10, sel_13, sel_14, sel_15,
sel_16, sel_17, sel_18, sel_19, sel_20 : in std_logic_vector(1 downto 0);
-- enable signals for tri-state buffers at output of muxs
en_1, en_2, en_3, en_4, en_5, en_6, en_7, en_8, en_9, en_10, en_11, en_12, en_13, en_14,
en_15,
en_16, en_17, en_18, en_19, en_20, en_21, en_22, en_23, en_24, en_25, en_26, en_27,
en_28,
en_29, en_30 : in std_logic;
-- output signals
op_1, op_2, op_3, op_4, op_5, op_6 : out std_logic_vector(15 downto 0);
clk : in std_logic ;
rst :in std_logic
);
end preloop_common_datapath ;
architecture arch_preloop_common_datapath of preloop_common_datapath is
```

-continued

| preloop_common.vhd |
| --- |

```vhdl
component xcv2_mult16×16s is
Port (
a : in std_logic_vector(15 downto 0);
b : in std_logic_vector(15 downto 0);
clk : in std_logic;
prod : out std_logic_vector(31 downto 0)
);
end component;
-- these muxs are those controlling inputs to adders and multipliers
signal mux_1out, mux_2out, mux_3out, mux_4out, mux_5out, mux_6out : std_logic_vector(
15 downto 0);
signal mux_7out, mux_8out, mux_9out, mux_10out, mux_11out, mux_12out:
std_logic_vector( 15 downto 0);
signal mux_13 out, mux_14out, mux_15out, mux_16out, mux_17out,
mux_18out:std_logic_vector( 15 downto 0);
signal mux_19out, mux_20out : std_logic_vector( 15 downto 0);
-- these muxs are those controlling register delay paths that differentiate
-- affine and perspective transform configurations
signal mux_21out, mux_22out, mux_23out, mux_24out, mux_25out, mux_26out,
mux_27out, mux_28out, mux_29out, mux_30out : std_logic_vector(15 downto 0);
-- these signals capture the 32 bit outputs from multipliers and are
-- fed to filters that remove the 31 - 16 MSBs
signal temp_1, temp_2, temp_3, temp_4, temp_5, temp_6, temp_7, temp_8, temp_9,
temp_10: std_logic_vector(31 downto 0);
-- these signals get the 16 bit outputs from the temp signals and feed to register inputs
signal input_reg_1, input_reg_12, input_reg_14, input_reg_19, input_reg_25, input_reg_28,
input_reg_39, input_reg_41, input_reg_6, input_reg_33, input_reg_20, input_reg_15,
input_reg_26, input_reg_29, input_reg_22 : std_logic_vector(15 downto 0);
-- these signals are the outputs of tri_state buffers present after the muxs
-- which control the exit points of the adjusted delayed paths
signal tri_state21, tri_state22, tri_state23, tri_state24, tri_state25, tri_state26, tri_state27,
tri_state28, tri_state29, tri_state30 : std_logic_vector(15 downto 0);
signal reg_1, reg_2, reg_3, reg_4, reg_5, reg_6, reg_7, reg_8, reg_9, reg_10,
reg_12, reg_14, reg_15, reg_19, reg_20,
reg_22, reg_23, reg_24, reg_25, reg_26, reg_28, reg_29, reg_33,
reg_34, reg_35, reg_36, reg_37, reg_39,
reg_41, reg_42, reg_43, reg_44, reg_45, reg_46, reg_47, reg_48, reg_49, reg_50,
reg_51, reg_52, reg_53, reg_54, reg_55, reg_56, reg_57, reg_58, reg_59, reg_60,
reg_61, reg_62, reg_63, reg_64, reg_65, reg_66, reg_67, reg_68, reg_69, reg_70,
reg_71, reg_72, reg_73, reg_74, reg_75, reg_76, reg_77, reg_78, reg_79, reg_80,
reg_81 : std_logic_vector(15 downto 0);
begin
-- the following are the multiplexers controlling the inputs to multipliers
mux_1out <= reg_20 when sel_1= '0' else tri_state22;
mux_2out <= reg_24 when sel_2= '0' else constant_2;
with sel_3 select mux_3out <=
        ip_3 when "00",
        reg_15 when "01",
        tri_state23 when "10",
        (others =>'Z') when others;
with sel_4 select mux_4out <=
        constant_3 when "00"
        reg_24 when "01",
        constant_4 when "10",
        (others =>'Z') when others;
with sel_5 select mux_5out <=
        ip_4 when "00",
        reg_20 when "01",
        tri_state24 when "10",
        (others =>'Z') when others;
with sel_6 select mux_6out <=
        constant_5 when "00",
        reg_23 when "01",
        constant_6 when "10",
        (others =>'Z') when others;
with sel_7 select mux_7out <=
        ip_6 when "00",
        reg_23 when "01",
        tri_state25 when "10",
        (others =>'Z') when others;
with sel_8 select mux_8out <=
        constant_7 when "00",
        reg_23 when "01",
        constant_8 when "10",
        (others =>'Z') when others;
with sel_9 select mux_9out <=
        ip_7 when "00",
        reg_24 when "01",
``` preloop_common.vhd

```
                tri_state26 when "10",
                (others =>'Z') when others;
with sel_10 select mux_10out <=
                constant_9 when "00",
                reg_29 when "01",
                constant_10 when "10",
                (others =>'Z') when others;
mux_11out <= reg_24 when sel_11= '0' else tri_state27;
mux_12out <= reg_26 when sel_12= '0' else constant_11;
-- the following are the multiplexers controlling the input to adders
with sel_13 select mux_13out <=
                reg_19 when "00",
                ip_10 when "01",
                tri_state21 when "10",
                (others =>'Z') when others;
with sel_14 select mux_14out <=
                constant_15 when "00",
                constant_16 when "01",
                reg_12 when "10",
                (others =>'Z') when others;
with sel_15 select mux_15out <=
                reg_14 when "00",
                reg_15 when "01",
                tri_state29 when "10",
                (others =>'Z') when others;
with sel_16 select mux_16out <=
                constant_17 when "00",
                constant_18 when "01",
                reg_14 when "10",
                (others =>'Z') when others;
with sel_17 select mux_17out <=
                reg_25 when "00",
                ip_11 when "01",
                reg_39 when "10",
                (others =>'Z') when others;
with sel_18 select mux_18out <=
                constant_19 when "00",
                constant_20 when "01",
                tri_state28 when "10",
                (others =>'Z') when others;
with sel_19 select mux_19out <=
                reg_28 when "00",
                reg_29 when "01",
                reg_28 when "10",
                (others =>'Z') when others;
with sel_20 select mux_20out <=
                constant_21 when "00",
                constant_22 when "01",
                tri_state30 when "10",
                (others =>'Z') when others;
-- the following are the statements implementing the multipliers
multp_inst1 : xcv2_mult16x16s
port map ( ip_1, constant_1, clk, temp_1);
input_reg_1 <= temp_1(15 downto 0);
multp_inst2 : xcv2_mult16x16s
port map ( mux_1out, mux_2out, clk, temp_2);
input_reg_12 <= temp_2(15 downto 0);
multp_inst3 : xcv2_mult16x16s
port map ( mux_3out, mux_4out, clk, temp_3);
input_reg_14 <= temp_3(15 downto 0);
multp_inst4 : xcv2_mult16x16s
port map ( mux_5out, mux_6out, clk, temp_4);
input_reg_19 <= temp_4(15 downto 0);
multp_inst5 : xcv2_mult16x16s
port map ( mux_7out, mux_8out, clk, temp_5);
input_reg_25 <= temp_5(15 downto 0);
multp_inst6 : xcv2_mult16x16s
port map ( mux_9out, mux_10out, clk, temp_6);
input_reg_28 <= temp_6(15 downto 0);
multp_inst7 : xcv2_mult16x16s
port map ( mux_11out, mux_12out, clk, temp_7);
input_reg_39 <= temp_7(15 downto 0);
multp_inst8 : xcv2_mult16x16s
port map ( ip_9, constant_12, clk, temp_8);
input_reg_41 <= temp_8(15 downto 0);
multp_inst9 : xcv2_mult16x16s
port map ( ip_2, constant_13, clk, temp_9);
input_reg_6 <= temp_9(15 downto 0);
```

| preloop_common.vhd |
| --- |

```
multp_inst10 : xcv2_mult16×16s
port map ( ip_8, constant_14, clk, temp_10);
input_reg_33 <= temp_10(15 downto 0);
-- the following are the statements implementing the adders
input_reg_20 <= mux_13out + mux_14out;
input_reg_15 <= mux_15out + mux_16out;
input_reg_26 <= mux_17out + mux_18out;
input_reg_29 <= mux_19out + mux_20out;
-- the following are the statements implementing the divide / shifter
--input_reg_22 <= ip_5 and "0011111111111111"; -- performing srl by 2
input_reg_22 <= "00" & ip_5(15 downto 2); --SRL 3 ; -- performing srl by 2
-- the following are the statements implementing register transfers
-- sel line here being '1' represents state machine for Perspective Transform
-- enable line of the tristate buffers here is '1' when either Affine or Perspective State machine
-- selects the associated mux.
mux_21out <= reg_1 when sel_21= '1' else reg_5;
tri_state21 <= mux_21out when en_21 = '1' else (others => 'Z');
mux_22out <= reg_12 when sel_22 = '1' else reg_51;
tri_state22 <= mux_22out when en_22 = '1' else (others => 'Z');
mux_23out <= reg_14 when sel_23 = '1' else reg_57;
tri_state23 <= mux_23out when en_23 = '1' else (others => 'Z');
mux_24out <= reg_19 when sel_24 = '1' else reg_63;
tri_state24 <= mux_24out when en_24 = '1' else (others => 'Z');
mux_25out <= reg_25 when sel_25 = '1' else reg_69;
tri_state25 <= mux_25out when en_25 = '1' else (others => 'Z');
mux_26out <= reg_28 when sel_26 = '1' else reg_75;
tri_state26 <= mux_26out when en_26 = '1' else (others => 'Z');
mux_27out <= reg_39 when sel_27 = '1' else reg_81;
tri_state27 <= mux_27out when en_27 = '1' else (others => 'Z');
mux_28out <= reg_41 when sel_28 = '0' else reg_45;
tri_state28 <= mux_28out when en_28 = '1' else (others => 'Z');
mux_29out <= reg_6 when sel_29 = '0' else reg_10;
tri_state29 <= mux_29out when en_29 = '1' else (others => 'Z');
mux_30out <= reg_33 when sel_30 = '0' else reg_37;
tri_state30 <= mux_30out when en_30 = '1' else (others => 'Z');
reg_pr :process (clk,
rst,reg_80,input_reg_1,reg_1,reg_2,reg_3,reg_4,input_reg_12,reg_12,reg_46,reg_52,reg_53,
reg_54,
         reg_47,reg_48,reg_49,reg_50,input_reg_14,reg_14,reg_55,reg_56,input_reg_19,
            reg_19,reg_58,reg_59,reg_60,reg_61,reg_62,input_reg_25,reg_25,reg_64,
               reg_65,reg_66,reg_67,reg_68,input_reg_28,reg_28,reg_70,reg_71,reg_72,
               reg_73,reg_74,input_reg_39,reg_39,reg_76,reg_77,reg_78,reg_79,
               input_reg_41,reg_41,reg_42,reg_43,reg_44,input_reg_6,reg_6,
               reg_7,reg_8,reg_9,input_reg_33,reg_33,reg_34,reg_35,reg_36,
               input_reg_15,input_reg_20,input_reg_22,input_reg_26,input_reg_29,
               reg_22,reg_23)
begin
      if (rst='1') then
                  reg_1<=(others =>'0');
         reg_2<=(others =>'0') ;
         reg_3<=(others =>'0') ;
         reg_4<=(others =>'0') ;
         reg_5<=(others=>'0') ;
         reg_6<=(others =>'0') ;
               reg_7<=(others =>'0');
         reg_8<=(others =>'0') ;
         reg_9<=(others =>'0') ;
         reg_10<=(others =>'0') ;
         reg_12<=(others =>'0') ;
               reg_14<=(others =>'0') ;
         reg_15<=(others =>'0') ;
         reg_19<=(others =>'0');
         reg_20<=(others =>'0') ;
         reg_22<=(others =>'0') ;
         reg_23<=(others=>'0') ;
         reg_24<=(others =>'0') ;
               reg_25<=(others =>'0');
         reg_26<=(others =>'0') ;
         reg_28<=(others =>'0') ;
         reg_29<=(others=>'0') ;
         reg_33<=(others =>'0') ;
         reg_34<=(others =>'0') ;
         reg_35<=(others=>'0') ;
         reg_36<=(others =>'0') ;
               reg_37<=(others =>'0');
         reg_39<=(others =>'0') ;
         reg_41<=(others=>'0') ;
         reg_42<=(others =>'0') ;
```

-continued preloop_common.vhd

```
        reg_43<=(others =>'0');
reg_44<=(others =>'0') ;
reg_45<=(others =>'0') ;
reg_46<=(others =>'0') ;
reg_47<=(others=>'0') ;
reg_48<=(others =>'0') ;
        reg_49<=(others =>'0');
reg_50<=(others =>'0') ;
reg_51<=(others =>'0') ;
reg_52<=(others =>'0') ;
reg_53<=(others=>'0') ;
reg_54<=(others =>'0') ;
        reg_55<=(others =>'0');
reg_56<=(others =>'0') ;
reg_57<=(others =>'0') ;
reg_58<=(others =>'0') ;
reg_59<=(others=>'0') ;
reg_60<=(others =>'0') ;
        reg_61<=(others =>'0');
reg_62<=(others =>'0') ;
reg_63<=(others =>'0') ;
reg_64<=(others =>'0') ;
reg_65<=(others=>'0') ;
reg_66<=(others =>'0') ;
        reg_67<=(others =>'0');
reg_68<=(others =>'0') ;
reg_69<=(others =>'0') ;
reg_70<=(others =>'0') ;
reg_71<=(others=>'0') ;
reg_72<=(others =>'0') ;
reg_73<=(others =>'0') ;
        reg_74<=(others =>'0');
reg_75<=(others =>'0') ;
reg_76<=(others =>'0') ;
reg_77<=(others =>'0') ;
reg_78<=(others=>'0') ;
reg_79<=(others =>'0') ;
        reg_80<=(others =>'0');
reg_81<=(others =>'0') ;
elsif (rising_edge(clk))then
   reg_1 <= input_reg_1;
   reg_2 <= reg_1;
      reg_3 <= reg_2;
      reg_4 <= reg_3;
      reg_5 <= reg_4;
      reg_12 <= input_reg_12;
      reg_46 <= reg_12;
      reg_47 <= reg_46;
      reg_48 <= reg_47;
      reg_49 <= reg_48;
      reg_50 <= reg_49;
      reg_51 <= reg_50;
      reg_14 <= input_reg_14;
      reg_52 <= reg_14;
      reg_53 <= reg_52;
      reg_54 <= reg_53;
      reg_55 <= reg_54;
      reg_56 <= reg_55;
      reg_57 <= reg_56;
      reg_19 <= input_reg_19;
      reg_58 <= reg_19;
      reg_59 <= reg_58;
      reg_60 <= reg_59;
      reg_61 <= reg_60;
      reg_62 <= reg_61;
      reg_63 <= reg_62;
      reg_25 <= input_reg_25;
      reg_64 <= reg_25;
      reg_65 <= reg_64;
      reg_66 <= reg_65;
      reg_67 <= reg_66;
      reg_68 <= reg_67;
      reg_69 <= reg_68;
      reg_28 <= input_reg_28;
      reg_70 <= reg_28;
      reg_71 <= reg_70;
      reg_72 <= reg_71;
      reg_73 <= reg_72;
```

```
                              preloop_common.vhd reg_74 <= reg_73;
            reg_75 <= reg_74;
            reg_39 <= input_reg_39;
            reg_76 <= reg_39;
            reg_77 <= reg_76;
            reg_78 <= reg_77;
            reg_79 <= reg_78;
            reg_80 <= reg_79;
            reg_81 <= reg_80;
            reg_41 <= input_reg_41;
            reg_42 <= reg_41;
            reg_43 <= reg_42;
            reg_44 <= reg_43;
            reg_45 <= reg_44;
            reg_6 <= input_reg_6;
            reg_7 <= reg_6;
            reg_8 <= reg_7;
            reg_9 <= reg_8;
            reg_10 <= reg_9;
            reg_33 <= input_reg_33;
            reg_34 <= reg_33;
            reg_35 <= reg_34;
            reg_36 <= reg_35;
            reg_37 <= reg_36;
            reg_20 <= input_reg_20;
            reg_15 <= input_reg_15;
            reg_26 <= input_reg_26;
            reg_29 <= input_reg_29;
            reg_22 <= input_reg_22;
            reg_23 <= reg_22;
            reg_24 <= reg_23;
        end if;
end process reg_pr;
op_3 <= reg_19;
op_4 <= reg_25;
op_1 <= reg_20;
op_2 <= reg_15;
op_6 <= reg_26;
op_5 <= reg_29;
end architecture;
```

Proposed Approach for Arriving at Largest Common Subgraph

Returning to LCSG development, in the following approaches, an exemplary preferred embodiment of the invention starts with control data flow graphs, CDFGs, representing the entire application and which have been subjected to zone identification, parallelization and loop unrolling. The zones/Control Points Embedded Zones (CPEZ) that can be suitable candidates for reconfiguration will be tested for configurable components through the following approaches. Note: Each Zone/CPEZ will be represented as a graph.

Seed Selection:

This approach is to find seed basic blocks and proceed on the CFG to grow these seeds. Note that all basic blocks which have outgoing edges whose destination basic block's first instruction line number is less than or equal to the line number of the first instruction of the source basic block, then those outgoing edges are loop back edges.

Figure 7:
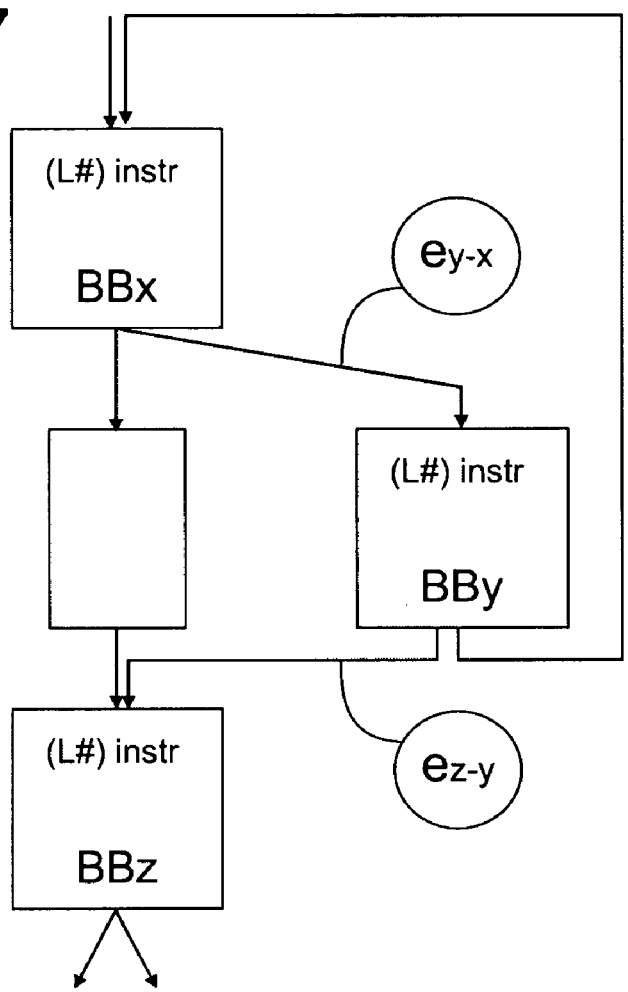
FIG. 7 is an illustrative block diagram of a control flow graph having one of its basic blocks in a loop.

For example, if, in FIG. 7, basic block Y's (BBy's) first instruction line number (as extracted from the *.ir.c file) is <= equivalent line numbers of basic blocks X or Y, then that edge is a loop-back edge ($e_{y-x}$) and BBx will be the start of the loop and BBy will be the seed. Since C/C++ are sequential languages the Lance compiler does not build loop in any other manner that is erroneous.

Figure 8:
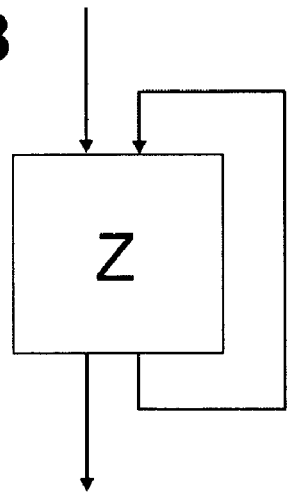
FIG. 8 is a block diagram of a control flow graph having only a single basic block also in a loop.
Figure 9A:
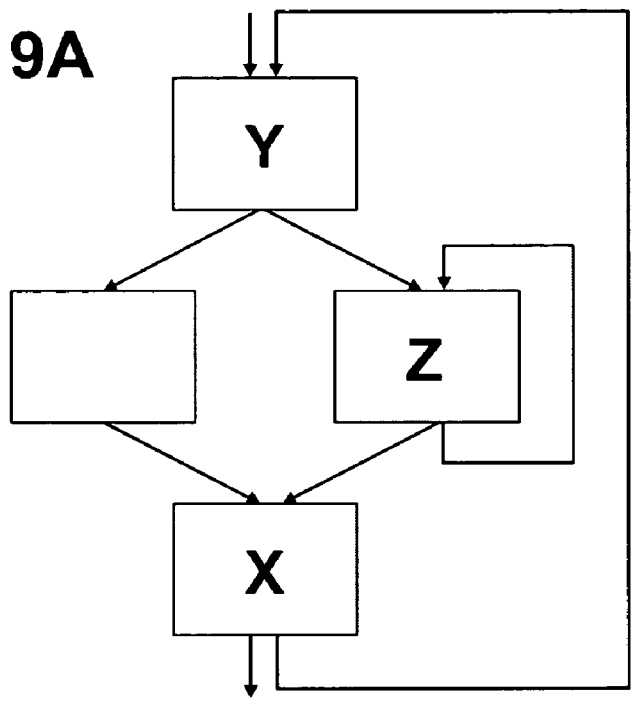
FIGS. 9 A and B are block diagrams of control flow graphs having a single nested loop with more than one basic block.
Figure 9B:
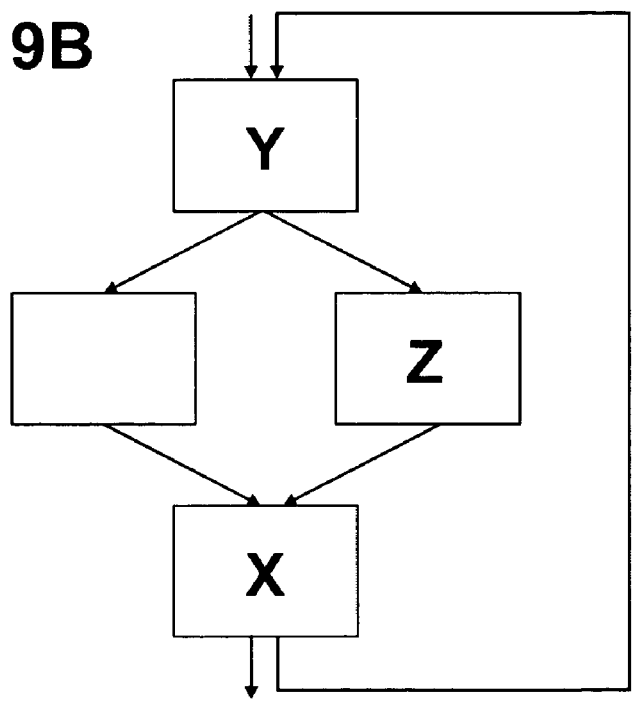

In this approach, the seed is a basic block that lies inside a loop because the loop is done over and over. This process can result in 3 types of loops:
  (i) A single nested level loop with only 1 basic block as shown in FIG. 8,
  (ii) A single nested level loop with >1 basic block as shown in FIGS. 9 A and B, Z is not considered a loop in FIG. 9 A, and
  (iii) Multi-level nested loop as shown in FIG. 10.

To proceed further we will consider as seeds only basic blocks of class X as in types (ii) and (iii). This step is a simple construct to start off and yet allows the growth of the constructs to include multiple level nested loops, without one growing construct overlapping another growing construct/cluster.

Figure 11:
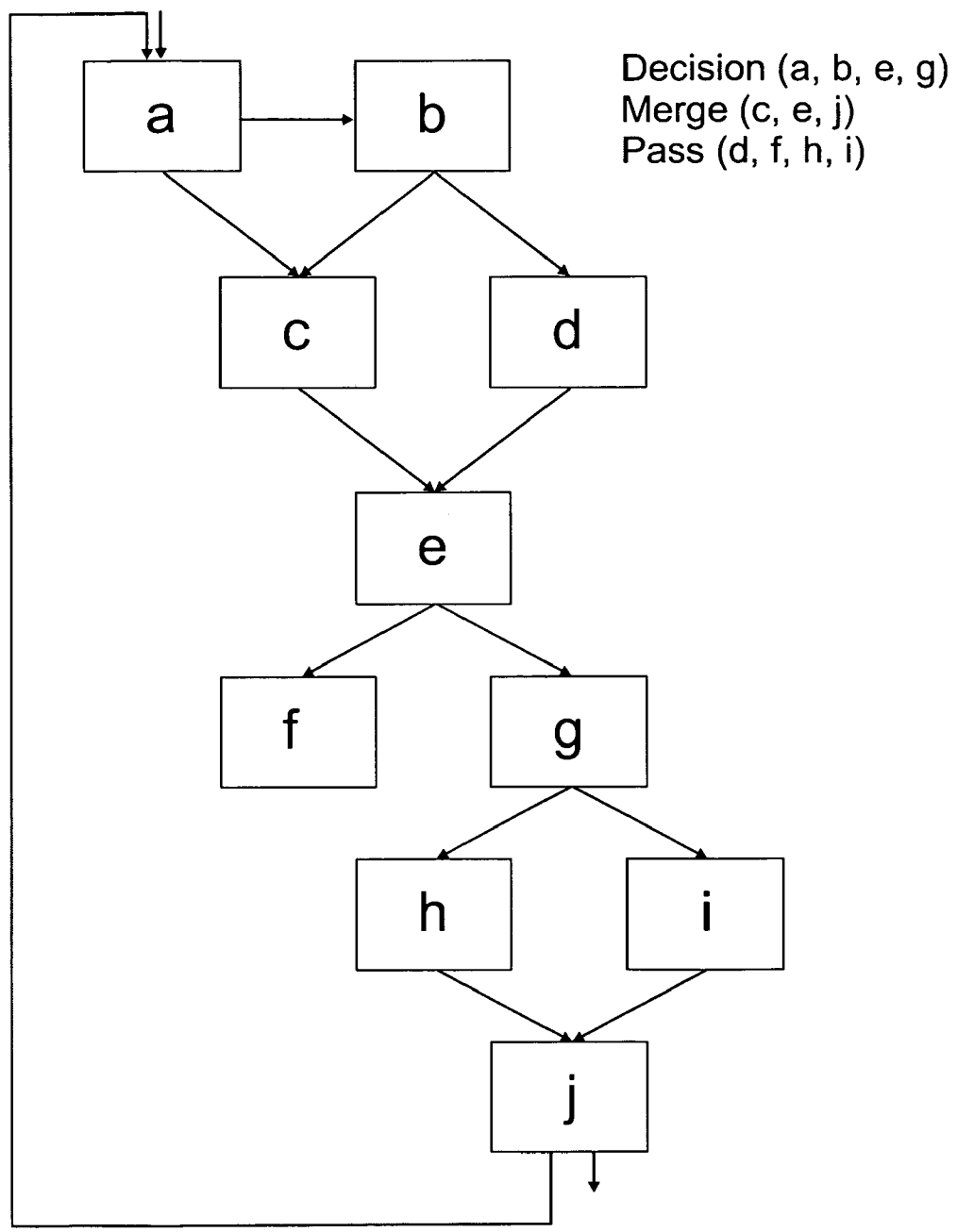
FIG. 11 is a block diagram of a control flow graph with basic blocks classified into decision, merge and pass categories.

The next step is to identify all basic blocks that come under the control umbrella of X and Y. All such basic blocks lie between the linked list entries of V i.e. G(E,V) of X and Y. These blocks are classified into 3 categories (i) Decision (ii) Merge (iii) Pass as shown for example in FIG. 11.

The same block might be included in both Decision and Merge classes. Therefore the number of blocks in this umbrella under (a, j)<=(Decision+Merge+Pass). This feature vector is one of the vectors used to quickly estimate the similarity of clusters.

Another feature vector will be the vector of operation type count for blocks in the Decision, Merge and Pass classes.

Example

| Merge (c, e, j) | | | | + * √ / |
|---|---|---|---|---|
| c = | 5 | 3 | 2 | ... 1 |
| e = | 2 | 0 | 1 | ... 0 |
| j = | 0 | 3 | 0 | ... 0 |
| Total = | (7, | 6, | 3, | ... , 1) |

These steps should be used to form candidate clusters from the CFG that can be classified as similar/reconfigurable. This result could vary based on programmer's skill. Highly skilled programmers could lead to faster grouping because of encompassing repeated versions of a complex construct into a function and perform repeated function calls.

Finer comparisons for performing the extraction of the largest common sub-graph, is carried out on this group.

Identifying the Largest Common Sub-graph or Common set of Sub-graphs between two candidate Data Flow Graphs representing a Basic Block each.

Each edge in a DFG is represented by a pair of nodes (Source and Destination). Each node represents an operation such as add (+), multiply (*), divide (/) etc. All the edges are represented by a doubly linked list as part of the graph representation G(V,E). These edges are now sorted based on the following criteria into several bins.

Figure 12:
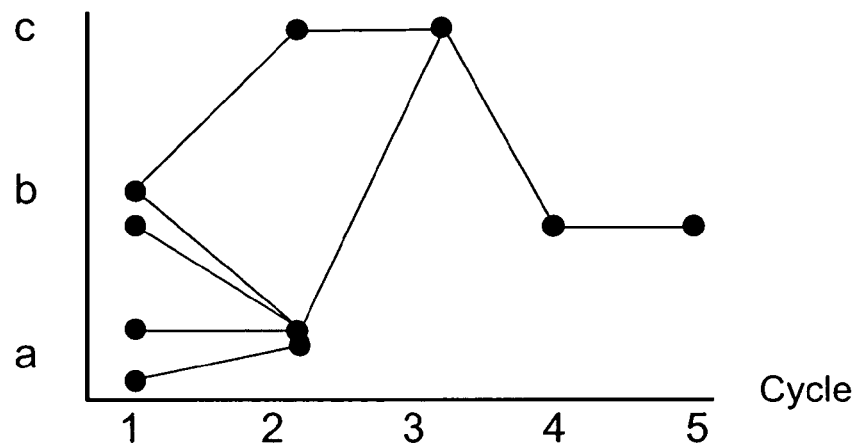
FIG. 12 is a flow graph plotted with flow left to right, plotting operations against cycles.

The criteria for sorting is based on the fact that an edge consists of two basic elements, Source Operation (SO) and Destination Operation (DO). A graph like that of FIG. 12 is prepared. This plots operations a, b and c of the nodes against cycles of the process graphed. Operations a, b and c could be (and often will be) add (+), multiply (*) and divide (/). In the example shown in FIG. 12, source operation 'a' has a lower rank than 'b' and 'c'. If the SO of the edges are the same, then their DO are compared. The same rule applies: the DO with the lower rank, is placed to the left. In this manner, the string is sorted. Say for example a sorted string of a first, candidate graph (graph number 1) is:

aa, aa, ac, ba, ba, bb, bc, cb, cc

Figure 12A:
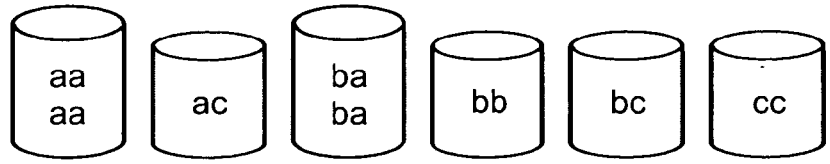
FIG. 12A is a diagrammatic illustration of "bins" into which edges in the graph of FIG. 12 have been sorted.

Now these pairs of alphabetic designators will be placed into bins. In order to place them the first or the left most pair (aa in our example) is assumed to be the head of the queue. It is placed in the first bin. Then all the following elements in the queue are compared with the head, till a mismatch is obtained. If a match occurs then, that pair is placed in the same bin as the head. Now the first mismatched pair is designated as new head of the queue. This is now placed in a new bin and the process is followed till all elements are in a set of bins as shown in FIG. 12A.

Figure 13:
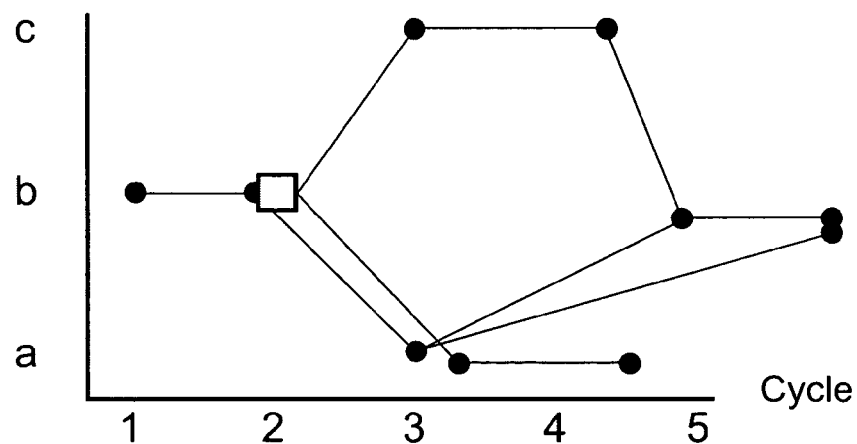
FIG. 13 is a flow graph plotted with flow left to right, plotting operations against cycles.
Figure 13A:
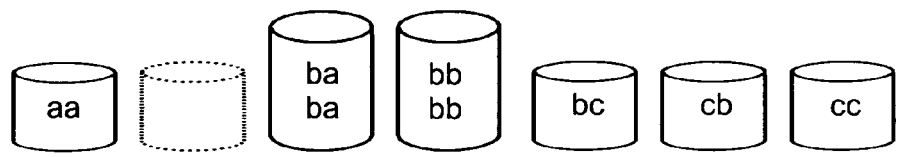

The next step is to perform a similar (but not exactly the same) process for the graph that needs to be compared with the candidate graph, graph number 1. Consider a second graph, graph number 2 as shown in FIG. 13. (In graph 2 flow is left to right rather than top to bottom).

This graph is converted to a string format in the same manner as graph #1 and this string, as shown below needs to be placed into a new set of bins.

aa, ab, ab, ba, ba, bb, bb, bc, cb, cc

This is done by assigning the leftmost element in the queue to be the head. It is first compared to the element type in the first bin of the old set(aa) [This is termed as the reference bin]. If it checks to be the same, then the first bin of the new set is created and all elements up to the first mismatch are placed in this bin. Then the reference bin is termed as checked. Now the new head type is compared to the first unchecked bin of the reference set. If there is a mismatch, then the comparison is done with the next unchecked bin and so on, until the SO of the element type is different from the SO of the element type in the reference bin. At this point, a comparison of all successive element pairs in the current queue are compared with the head, till a mismatch is met. Then the matched elements are eliminated.

But in case, a match is found between the head of queue and a reference bin, then a new bin in the current set is created and suitably populated. The corresponding reference bin is checked and all previously/predecessor unchecked reference set bins are eliminated.

Figure 14A:
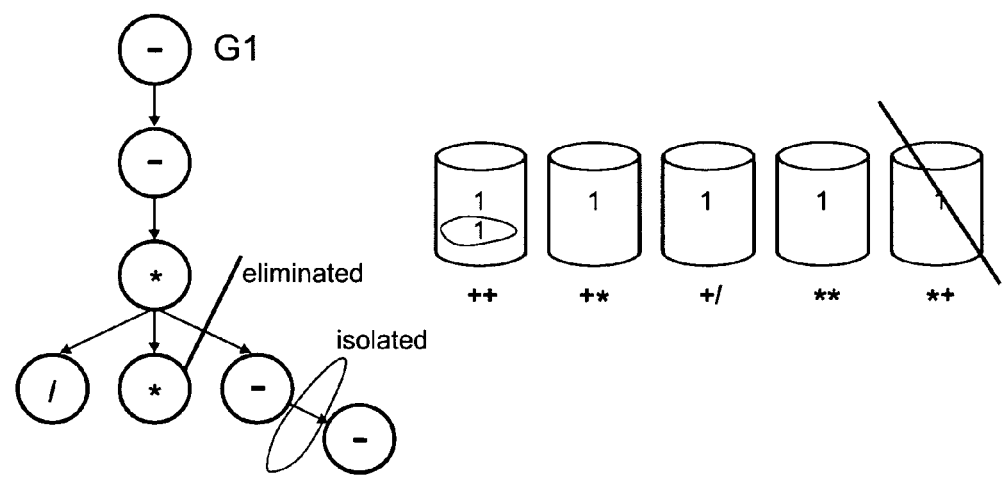
FIG. 14 A is a graphical illustration of a sorting into bins of edges of a shown graph G1 for comparison with a further graph G2 of FIG. 14 B.
Figure 14B:
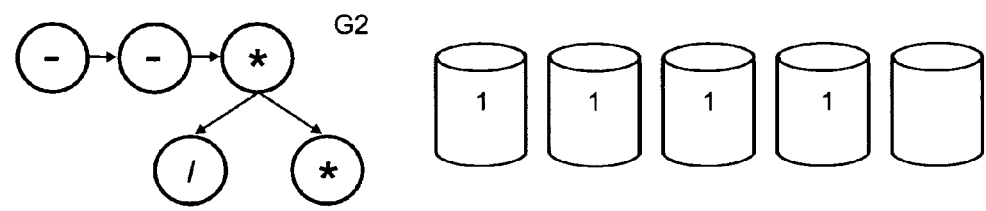

By this approach, we are eliminating comparison between unnecessary edges in the graphs. Now a new set of bins for graph 2 is obtained as shown (FIG. 13 A). Thus the edges in a Data Flow Graph, representing a Basic Block, are arranged into bins as described above. Only note that when it said that a bin should be eliminated if its corresponding type is not found in the previous pair, then what is meant is that the bin should be marked for elimination. Thus one will have a pair of bin sequences, in which some bins might have been marked as 'eliminated' type. Consider any such bin and track all edges connected to edges in that bin. If any of these connected edges are isolated edges (i.e. all their connected edges=<predecessors+siblings+companions+successors are marked as 'eliminated') then mark them as 'eliminated'. This is illustrated in FIGS. 14 A and B.

Now for all the remaining 'un-eliminated' edges, quadruple associativity information is obtained (Predecessor, Siblings, Companions, and Successors). At this point measure the associativity counts for all edges in a bin pair.

For example, if we have 3 bins in each graph, say Add-Divide, Divide-Multiply and Add-Multiply, then redistribute edges in each bin of each graph, into the corresponding associativity columns. This will result in the tables (called Associativity-Bin matrices) shown below, where 'x' represents edges belonging to a particular associativity number in a bin.

Associativity Bin Matrix 1

| G1 | 5 | 4 | 3 | 2 | 1 |
|---|---|---|---|---|---|
| +/ |   |   | Z | A |   |
| /* | P |   |   | T |   |
| +* |   |   | E | F |   |

Associativity Bin Matrix 1

| G2 | 5 | 4 | 3 | 2 | 1 |
|---|---|---|---|---|---|
| +/ |   |   | B | Q |   |
| /* |   |   | R |   | U |
| +* |   |   |   |   | S | X |

The following pseudo code in C describes the matching or the discovery of the largest common sub-graph or sets of common subgraphs between the two candidate DAGs using the Associativity-Bin Matrices.

```
*************************Pseudo C code
begin****************************
**********************Comment
begin******************************
```
Given 2 sorted Directed Acyclic Graphs G1 and G2 the matrix form such that
height of both matrixes = height, and -continued

```
        width of graph 1 = width_G1
        width of graph 2 = width_G2
As an example,
                Graph1                              Graph2
                        Associativity Count
```

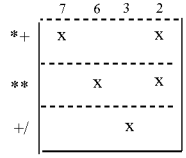

width of Graph 1 = 4

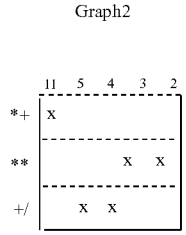

width of Graph 2 = 5

```
    here x marks those row, column intersections where edges of the graph are distributed into
    and an x represents a Primary Group of Edges (PGE) or Secondary Group of Edges (SGE)
    *************************Comment
    end*******************************
main( )
{
        initialize i = height;
        initialize k = width_G2;
        for (j = width_G2; j <= 1 OR G1(i,j)==Null; j--)
        {
                for (i = height; i<=1 OR G1(i,j)==Null; i--)
                {
                        while (G2 (i,k) ==Null)
                        {
                                k++;
                                if(k>width_G2)
                                        exit and goto LOC_1;
                        }
                        /* function call*/
                        compare (G1 (i,j).edges, G2 (i,k).edges);
                        reset value of k to width_G2;
label:  LOC_1
                }
                reset value of i to height;
        }
}
void compare (group_of_edges1, group_of_edges2)
{
        if (group_of_edges1.#of_edges > group_of_edges2.#of_edges)
        {
                group_of_edges1 is Primary_Group_of_Edges or PGE;
                group_of_edges2 is Secondary_Group_of_Edges of SGE;
        }
        else
                the other way around;
    *************************Comment
    begin******************************
    Assuming that a group of edges (PGE / SGE) is arranged in the data structure
    that looks like this:
    Here a, g, etc... are Nodes.
    and a-g, a-k , etc... are Edges.
```

TABLE 1

| | | | | | | | | | | |
|---|---|---|---|---|---|---|---|---|---|---|
| Edges of type div2mul ||||||||||||
| | | column1 | | Column2 | | Column3 | | Column4 | | |
| | C_E | Predecesors | | Siblings | | Companions | | Succesors | | A# |
| row1 | edge#1 | slot (*2/) | Φ | slot (/2*) | a-δ5 | slot (+2*) | f-g | slot (*2*) | b-c | 7 |
| | | slot (/2/) | Φ | | a-g | slot (/2/) | Φ | slot (*2/) | Φ | |
| | | slot (+2/) | Φ | | a-k | slot (*2*) | Φ | slot (*2+) | Φ | |
| | | | | | a-o | | | | | |
| | | | | | a-δ7 | | | | | |
| | | | | slot (/2+) | Φ | | | | | |
| | | | | slot (/2/) | Φ | | | | | |
| row2 | edge#2 | ● | ● | ● | ● | ● | ● | ● | ● | ● |
| ● | ● | ● | ● | ● | ● | ● | ● | ● | ● | ● |

Note that edges in each slot are divided into 2 baskets:
1) uncovered basket
2) covered basket Initially when the graph comparison begins all Associated Edges (Predecessors, Siblings, Companions, Successors) in all slots will be in the respective uncovered baskets. But as we begin covering edges, those Associated Edges will start filling their respective covered baskets !! For reasons of simplicity the above example assumes all the AssociatedEdges are in their respective uncovered baskets.

```
***************************Comment
begin********************************
/* outer for loop */
for(prow = 1; prow <=PGE.#of_edges; prow++)
{
        /* inner for loop */
        for(srow = 1; srow <= SGE.#of_edges; srow++)
        {
                /* function call*/
                Result = Test_for_compatibility(PGE(prow),SGE(srow));
                if (Result == fail)
                {
                    prow --;
                }
                else /* if Result == pass */
                {
                    /* function call */
                    cover(PGE(prow), SGE(srow));
                    exit(1); /* this should exit the inner for loop and continue with
the outer for loop */
                }
        }
        /* inner for loop */
}
/* outer for loop */
return ( );
}
int Test_for_compatibility (PGE(prow),SGE (srow))
{
        if (PGE(prow).candidate_edge.covered_flag ==
        SGE (srow).candidate_edge.covered_flag)
        {
                if (PGE(prow).candidate_edge.Source_node.touched_flag ==
                SGE(srow).candidate_edge.Source_node.touched_flag)
                {
                        if (PGE(prow).candidate_edge.Destination_node.touched_flag ==
                        SGE(srow).candidate_edge.Destination_node.touched_flag)
                        {
                                if (PGE(prow).covered_count == SGE(srow).covered_count)
                                {
                                        for(column = 1; column <= 4; column++)
                                        {
                                            for(slot = 1; slot <=3 AND
                                            PGE(prow,column,slot) != null AND
                                            SGE(srow,column,slot) != null; slot++)
                                            {
                                            if(PGE(prow,column,slot).covered_count ==
                                            SGE(srow,column,slot).covered_count)
                                            {
                                                        return pass;
                                                        /* this indicates a potential for covering
                                                        to be peformed*/
                                            }
                                            else
                                                    return fail;
                                            }
                                        }
                                }
                                else
                                        return fail;
                        }
                        else
                                return fail;
                }
                else
                        return fail;
        }
        else
                return fail;
}
void cover(PGE(prow), SGE(srow))
{
        if(PGE(prow).candidate_edge.covered_flag != 1)
        {
                PGE(prow).candidate_edge.covered_flag = 1;
```

```
            SGE(srow).candidate_edge.covered_flag = 1;
            update_flags_and_counts(PGE(prow).candidate_edge,
            SGE(srow).candidate_edge);
        }
    for(column = 1; column <= 4, column ++)
    }
            for(slot = 1; slot <=3 AND PGE(prow,column,slot) != null AND
            SGE(srow,column,slot) != null AND
            PGE(prow,column,slot).uncovered_count != null AND
            SGE(srow,column,slot).uncovered_count != null; slot++)
            {
                /* outer for loop */
                for(pedge = 1; pedge <= PGE(prow,column,slot).uncovered_count;
                pedge++)
                {
                    /* inner for loop */
                    for(sedge = 1; sedge <=
                    SGE(srow,column,slot).uncovered_count; sedge++)
                    {
                        if(PgE(prow,column,slot,uncovered_basket[pedge]).
                        Source_node.touched_flag ==
                        SGE(srow,column,slot,uncovered_basket[sedge]).
                        Source_node.touched_flag
                        AND
                        PGE(prow,column,slot,uncovered_basket[pedge]).
                        Destination_node.touched_flag ==
                        SGE(srow,column,slot,uncovered_basket[sedge]).
                        Destination_node.touched_flag)
                        {
                            push_this_edge_into_covered_basket
                            (PGE(prow,column,slot,uncovered_basket[pedge]),
                            SGE(srow,column,slot,uncovered_basket[sedge]));
                            update_flags_and_counts
                            (PGE(prow,column,slot,uncovered_basket[pedge]),
                            SGE(srow,column,slot,uncovered_basket[sedge]));
                            exit (1);
                            /* this should exit the inner for loop and
                            continue with the outer for loop */
                        }
                    }
                    /*inner for loop */
                }
                /* outer for loop */
            }
        }
    return ( );
}
void push_this_edge_into_covered_basket (pedge, sedge)
{
    /* this does a transfer of the covered edge from the uncovered basket of a slot to the
    covered basket of a slot */
}
void update_flags_and_counts (edge_from_PGE, edge_from_SGE)
{
    /* this does an update on all covered flags of edges
        and on all touched flags of nodes
        and on covered and uncovered counts of all slots
        and the total count for candidate edges
    */
}
***************************Pseudo C code
end***************************
```

The complexity of this algorithm is estimated to be of the order $O(N^5)$, where N represents the number of edges in the smaller of the 2 candidate graphs.

Although this complexity is high, yet when compared to the $O(P*N^4)$ complexity algorithm proposed by Cicirello at Drexel University, the differences are:
  a. Cicirello's algorithm delivers a large enough common sub-graph, which is an approximate result.
  b. The proposed algorithm not only derives the largest common sub-graph or a large-common sub-graph but also potentially derives other common-sub-graphs. All such common sub-graphs result in potential savings when implemented as an ASIC computation unit.
  c. Cicirello's algorithm relies on a random number of attempts (P) to start the initial mapping. In the worst case, if all possible mappings are tried, then the solution becomes exponential.

Therefore after subjecting the CFG to the above set of processes, 2 types of entities are obtained: (i) Basic Blocks with Large Common Sub-graphs & (ii) Basic Blocks without any common sub-graphs. For the purpose of scheduling, Basic Blocks that share common sub-graphs will be termed as 'Processes' or nodes in the CFGs that share resources. As an example 2 DAGs (Affine and Perspective preloop) were analyzed for common sub-graphs. The common sub-graph obtained is that shown in the FIG. 5.

Architectures of Common Sub-graphs:

For a common-sub-graph, an ASAP schedule is performed. Although many other types of scheduling are possible, here the focus is placed primarily on extracting maximal parallelism and hence speeds of execution. The earliest start times of individual nodes, are determined by the constraint imposed by the ASAP schedule of the parent graph in which the common sub-graph is being embedded/extracted.

Since the schedule depends on the parent graph, the same sub-graph has different schedules based on the parent graph (Affine transform preloop DAG/Perspective transform preloop DAG). In order to derive a single architecture that can be used with minimal changes in both instantiations of the common sub-graph, the sharing of resources is performed based on the instance that requires the larger number of resources. This policy is applied to each resource type, individually. For example, the sharing of multiplier nodes in instance 1 (Affine) can be formed as:

e|j, b, c|v, g, h|$\Delta$1, $\Delta$5, $\Delta$6|$\Delta$3, $\Delta$7, $\Delta$8|y, k, l|n, o, p|r and the sharing of multiplier nodes in instance 2 (perspective) can be formed as:

e|b, c|v, g, h|$\Delta$1, $\Delta$5, $\Delta$6|$\Delta$3, $\Delta$7, $\Delta$8|y, k, l|o, p|r|j|n|

Since the instance 2, requires a greater number of resources, the resource sharing in instance 1 is modified to match that of instance 2.

The same process is followed for the adder nodes and a common sharing is obtained:

$\Delta$2, f, d|u, t, i|$\Delta$4, s, q|x, w, m|

Figure 15:
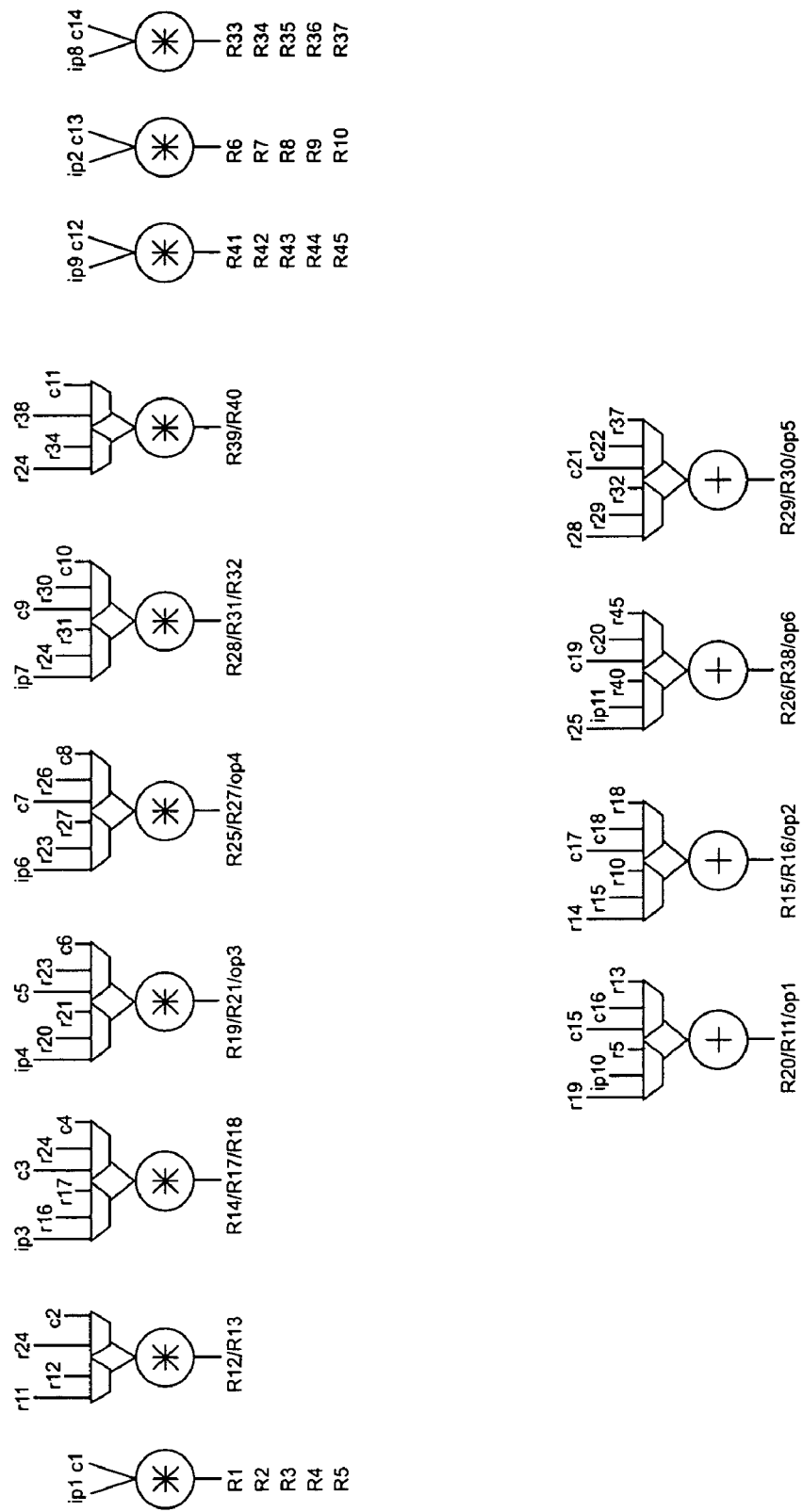
FIG. 15 is a graphical illustration of an architecture for effecting the operation represented by the first control flow graph of FIG. 2.
Figure 16:
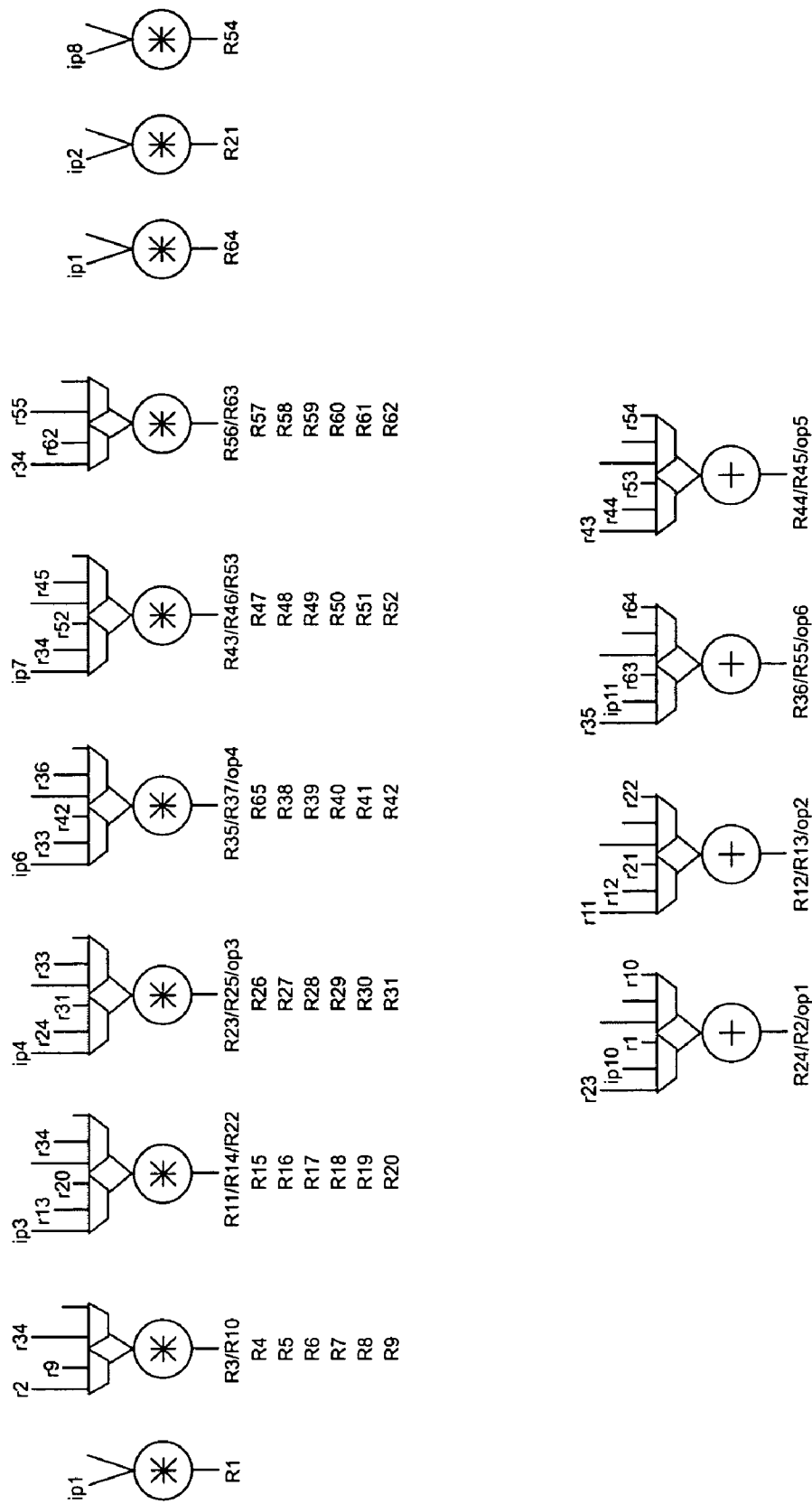
FIG. 16 is a graphical illustration of architecture for effecting the operation represented by the second control flow graph of FIG. 2.

Implementing an architecture for each instance with the common resource sharing distribution results in 2 similar architectures (shown in FIGS. 15 and 16), which differ in the number of delays present on certain paths.

Figure 17:
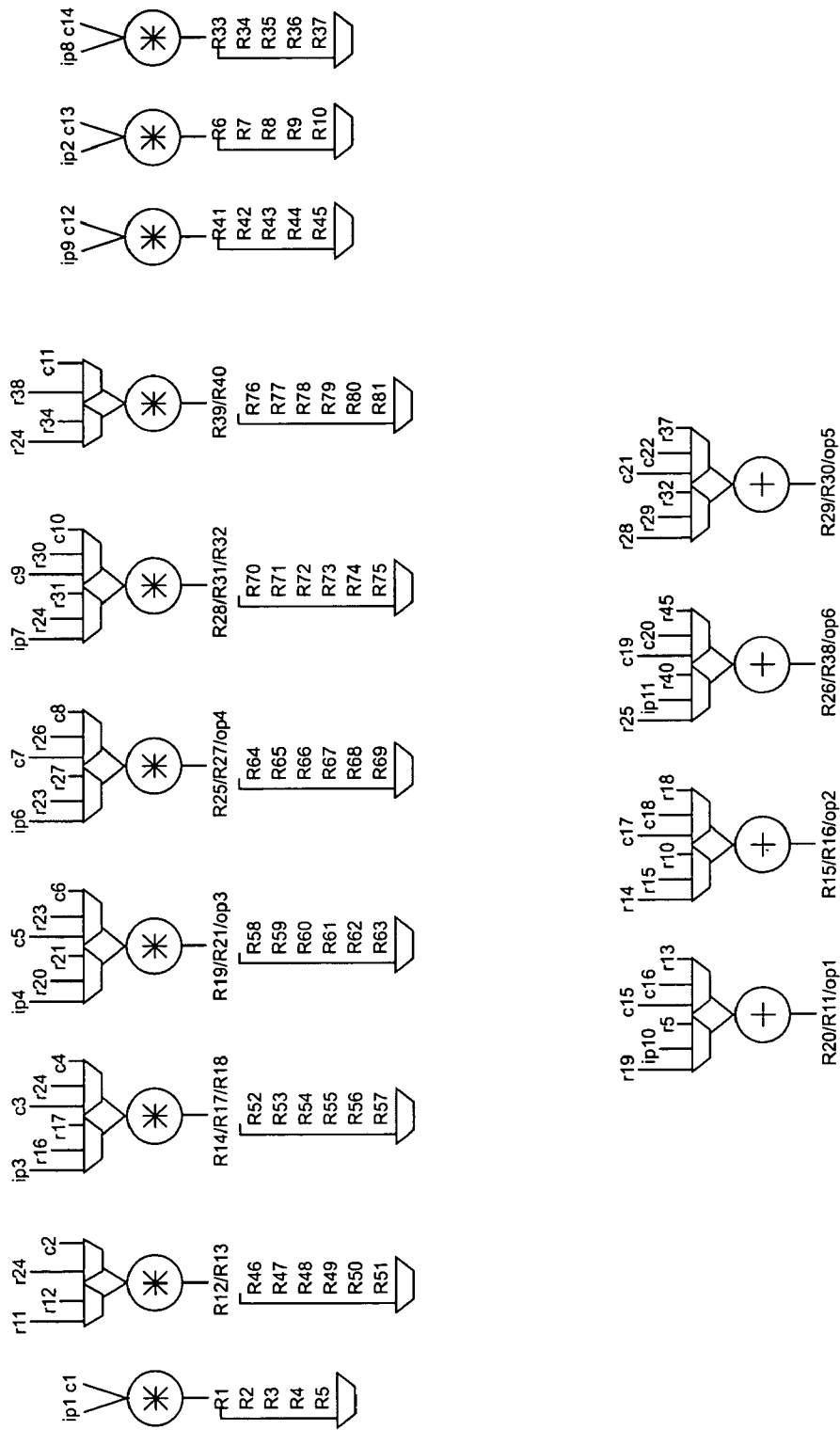
FIG. 17 is a graphical representation of an architecture combining the architectures of FIGS. 15 and 16 through the use of multiplexers.

This problem is overcome by adding multiplexers along paths that have different delays while connecting the same source and destination(s). This is shown in FIG. 17.

In this research effort, the common architectures are implemented as ASICS in VHDL. The regions of the DAGs that are not covered by common architectures are left for generic LUT style implementation. For the above example of complex warping applications, we have synthesized the common architectures and obtained gate counts based on Xilin's estimates using the Xilinx Synthesis Tool. We have further translated this architecture onto LUTs on a Xilinx Spartan 2E FPGA. Based on well accepted procedures, gate count and bit stream estimates for the translated architecture have been obtained [refer to Trenz Electronic paper]. These results show the potential savings that can be achieved in 2 modes of implementation: (i) A completely LUT based architecture with flexible partial reconfigurability and (ii) An ASIC-LUT based architecture. In type (i) the savings are expressed in terms of time taken to perform the redundant reconfiguration (assuming that the configuration is performed at the peak possible level of 8 bits in parallel at 50 MHz), over one run/execution of the preloop basic block and over an expected run of 30 iterations per second (since there are 30 frames per second of video, and the preloop basic block is executed for every frame). In type (ii) the savings are expressed in terms of number of gates required to represent the architecture in an ASIC versus the number of gates required to represent the architecture in an LUT format of the Spartan 2E processor. In both types, significant savings are obtained.

Overall Scheduling for Circuit Configuring

Once the number of processing units has been chosen, the CDFGs have to be mapped onto these units. This involves scheduling, i.e. allocating of tasks to the processing units in order to complete execution of all possible paths in the graphs with the least wastage of resources but avoiding conflicts due to data and resource dependencies.

Figure 18:
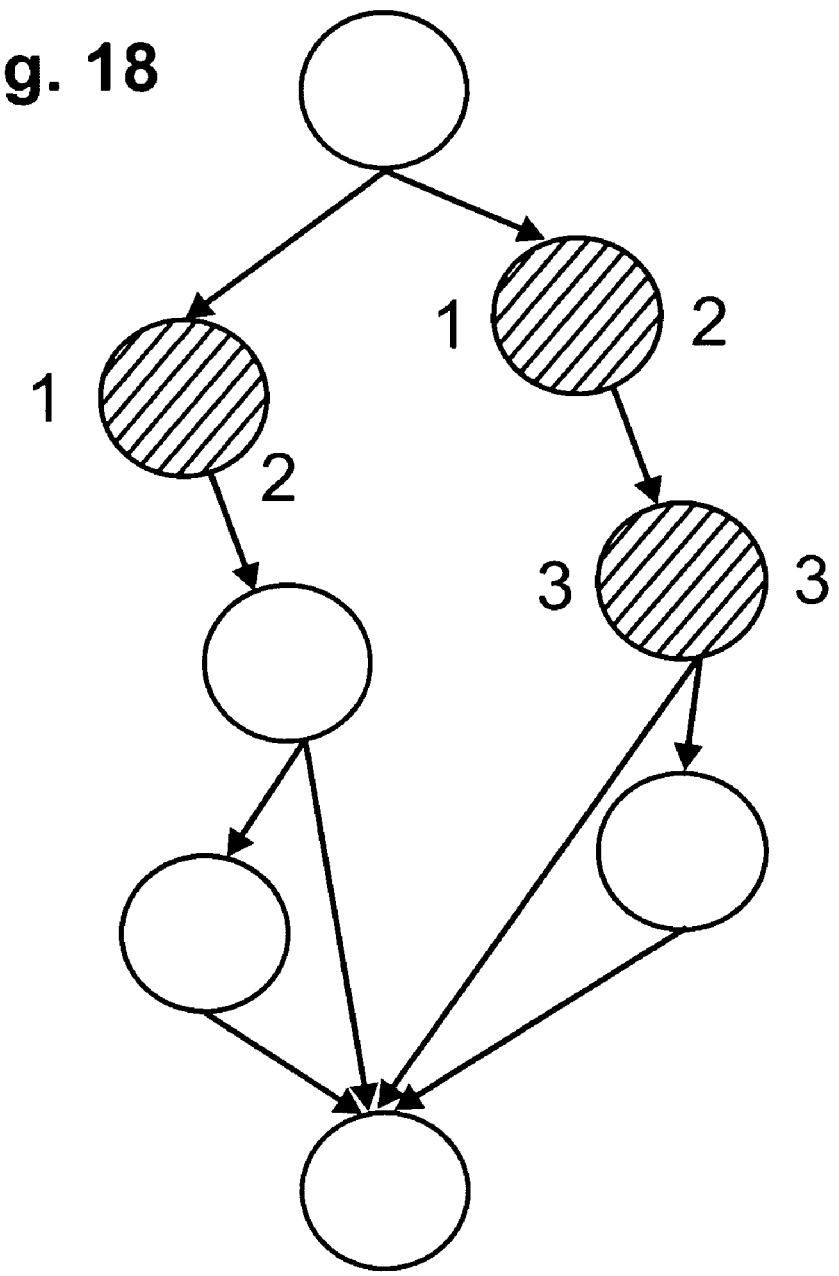
FIG. 18 is diagrammatic illustration of an exemplary data flow graph with nodes cross-hatched to indicate those needing scheduling onto the same processor.

In the graph matching, one can include branch operations to reduce the number of graphs. This can be done, if one of the paths of a branch operation leads to a very large graph compared to the other path, or is a subset of the other path. This still leaves us with the problem of conditional task scheduling with loops involved. Since scheduling is applicable to many diverse areas of research, in this section all the work done in scheduling is not discussed. Instead this focuses on those that are relevant to mapping data flow graphs on processors, proposes a method most suitable for the purpose of reconfiguration, and compares it with contemporary methods. Several researchers have addressed task scheduling and one group has also addressed loop scheduling with conditional tasks [57]. A detailed survey of data and control dominated scheduling approaches can be found in [58], [59] and [60]. Jha [57] addresses scheduling of loops with conditional paths inside them. This is a good approach as it exploits parallelism to a large extent and uses loop unrolling. But the drawback is that the control mechanism for having knowledge of 'which iteration's data is being processed by which resource' is very complicated. This is useful for one or two levels of loop unrolling. It is quite useful where the processing units can afford to communicate quite often with each other and the scheduler. In the present case, the network occupies about 70% of the chip area [1] and hence cannot afford to communicate with each other too often. Moreover the granularity level of operation between processing elements is beyond a basic block level and hence this method is not practical. And within a processing element, since the reconfiguration distance (edit distance) is more important, fine scale scheduling is compromised because the benefits with the use of very fine grain processing units is lost due to high configuration load time. [68] paper discusses a 'path based edge activation' scheme. This basically means, if for a group of nodes (which must be scheduled onto the same processing unit and whose schedules are affected by branch paths occurring at a later stage) one knows ahead of time the branch controlling values, then one can at run time prepare all possible optimized list schedules for every possible set of branch controller values. In the following simple example shown in FIG. 18, the nodes with cross-hatching need to be scheduled on the same processing unit. The branch controlling variable is b which can take values of 0 or 1. In case it takes a 0, one branch path is taken, else the other path is taken. In the case where one can know at run time, yet ahead of time of occurrence of the branch paths, the value of 'b', one can prepare schedules for the 3 cross-hatched nodes and launch either one, the moment b's value is known.

This method is very similar to the partial critical path based method proposed by [69]. It involves the use of a hardware scheduler and is quite well suited for our application. But one needs to add another constraint to the scheduling: the amount of reconfiguration or the edit distance. In [69] the authors tackles control task scheduling in 2 ways. The first is partial critical path based scheduling, which is discussed above. Although they do not assume that the value of the conditional controller is known prior to the evaluation of the branch operation. They also propose the use of a branch and bound technique for finding a schedule for every possible branch outcome. This is quite exhaustive, but it provides an optimal schedule. Once all possible schedules have been obtained, the schedules are merged. The advantages are that it is optimal, but its has the drawback of being quite complex. It also does not consider loop structures. Other papers that discuss scheduling onto multiprocessor systems include [70], [71] and

[72]. Among other works carried out on static scheduling by ([73] and [74]) involve linearization of the data flow graphs. Some others have also taken fuzzy approaches [75] and [76].

Proposed Approach

Given a control-data flow graph, one needs to arrive at an optimal schedule for the entire device. A method is provided to obtain near optimal schedules. This involves a brief discussion of the PCP scheduling strategy followed by an enhancement to the current approach to arrive at a more optimal schedule. In addition the scheduling involves reconfiguration time as additional edges in the CDFG. Ways to handle loops embedded with mutually exclusive paths and loops with unknown execution cycles are dealt with as well.

A directed cyclic graph developed by the Lance compiler 101 from source code has been used to model the entire application. It is a polar graph (macrograph) with both source and sink nodes. The graph can be denoted by G (V, E). V is the list of all processes that need to be scheduled. E is the list of all possible interactions between the processes. The processes can be of three types: Data, communication and reconfiguration. The edges can be of three types: unconditional, conditional and reconfiguration. A simple example with no reconfiguration and no loops is shown in FIG. 19.

Figure 19:
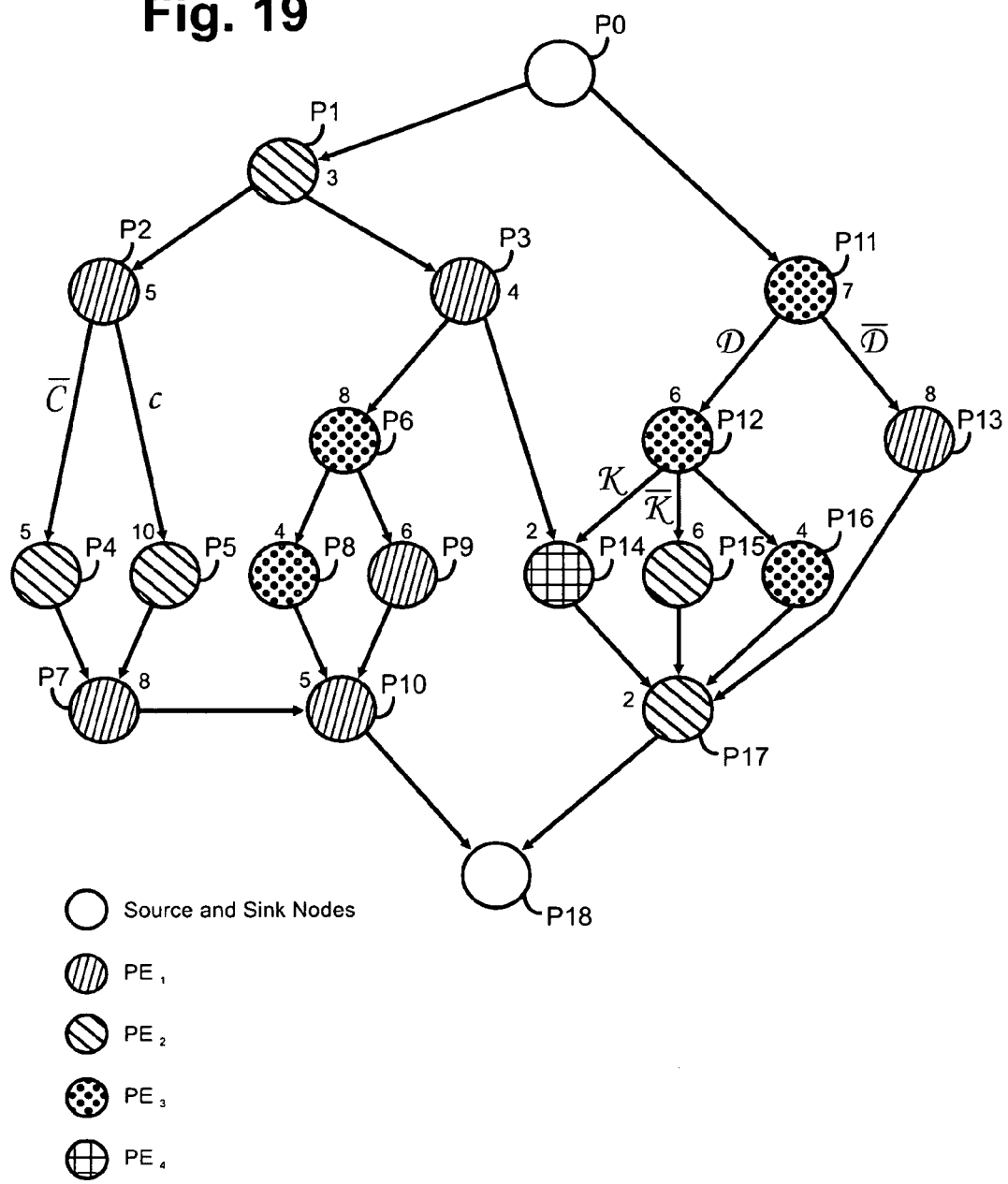
FIG. 19 is a further diagrammatic illustration of a common data flow graph indicating those nodes needing to be scheduled onto the same processors.
Figure 20:
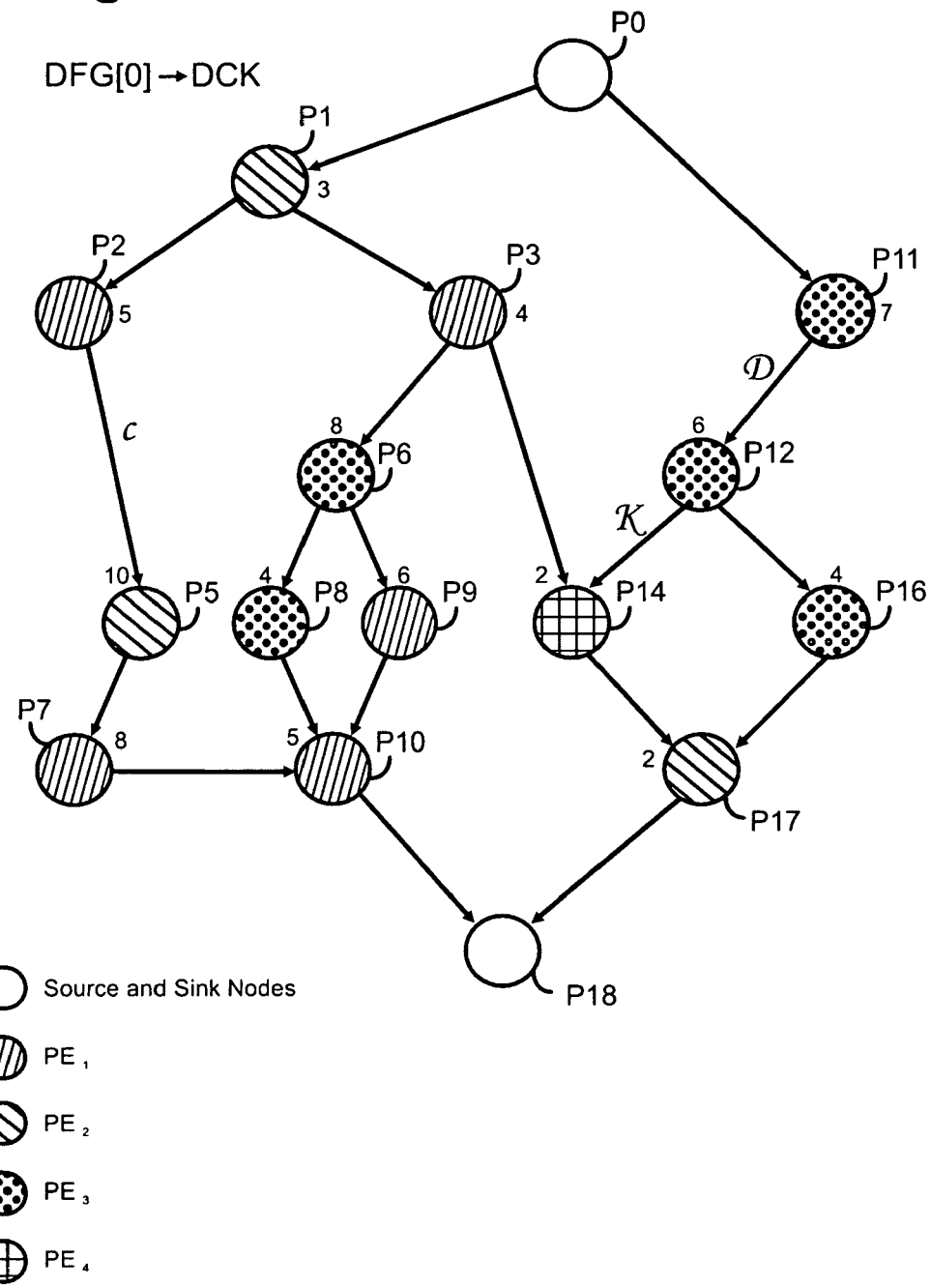
FIGS. 20-25 are individual data flow graphs common to the common data flow graph of FIG. 19 in increasing order of modified partial critical path method delay.
Figure 21:
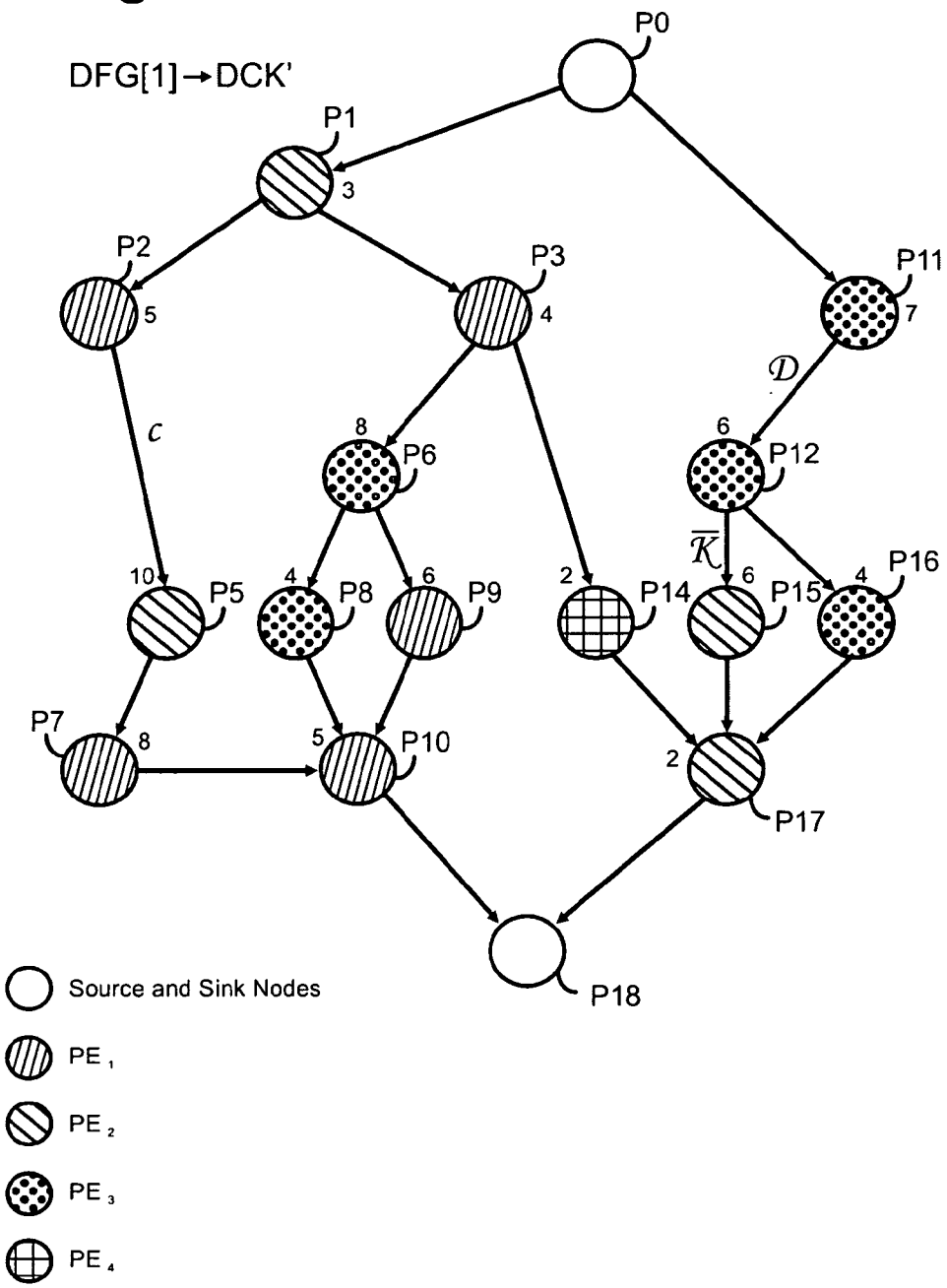
Figure 22:
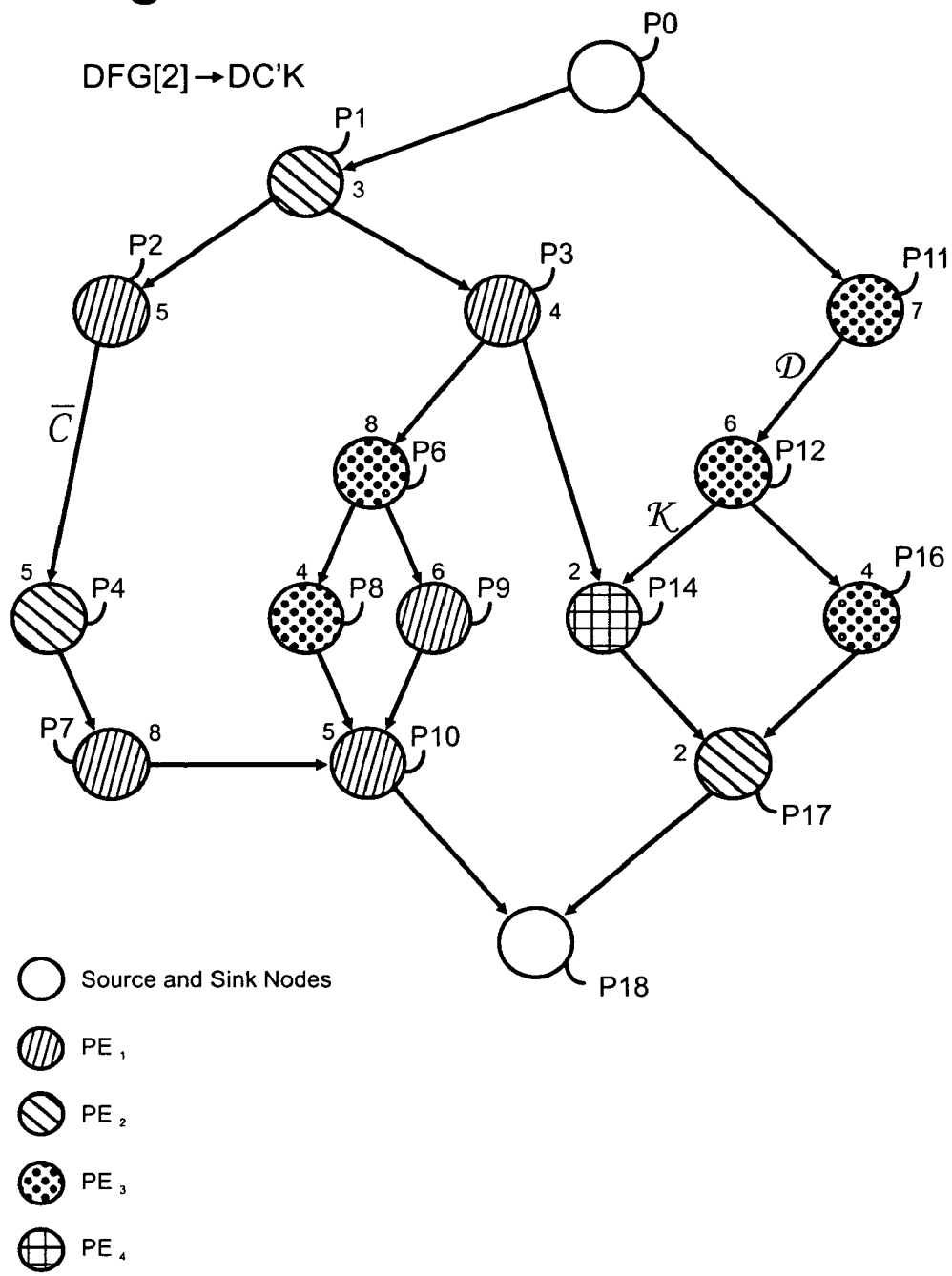
Figure 23:
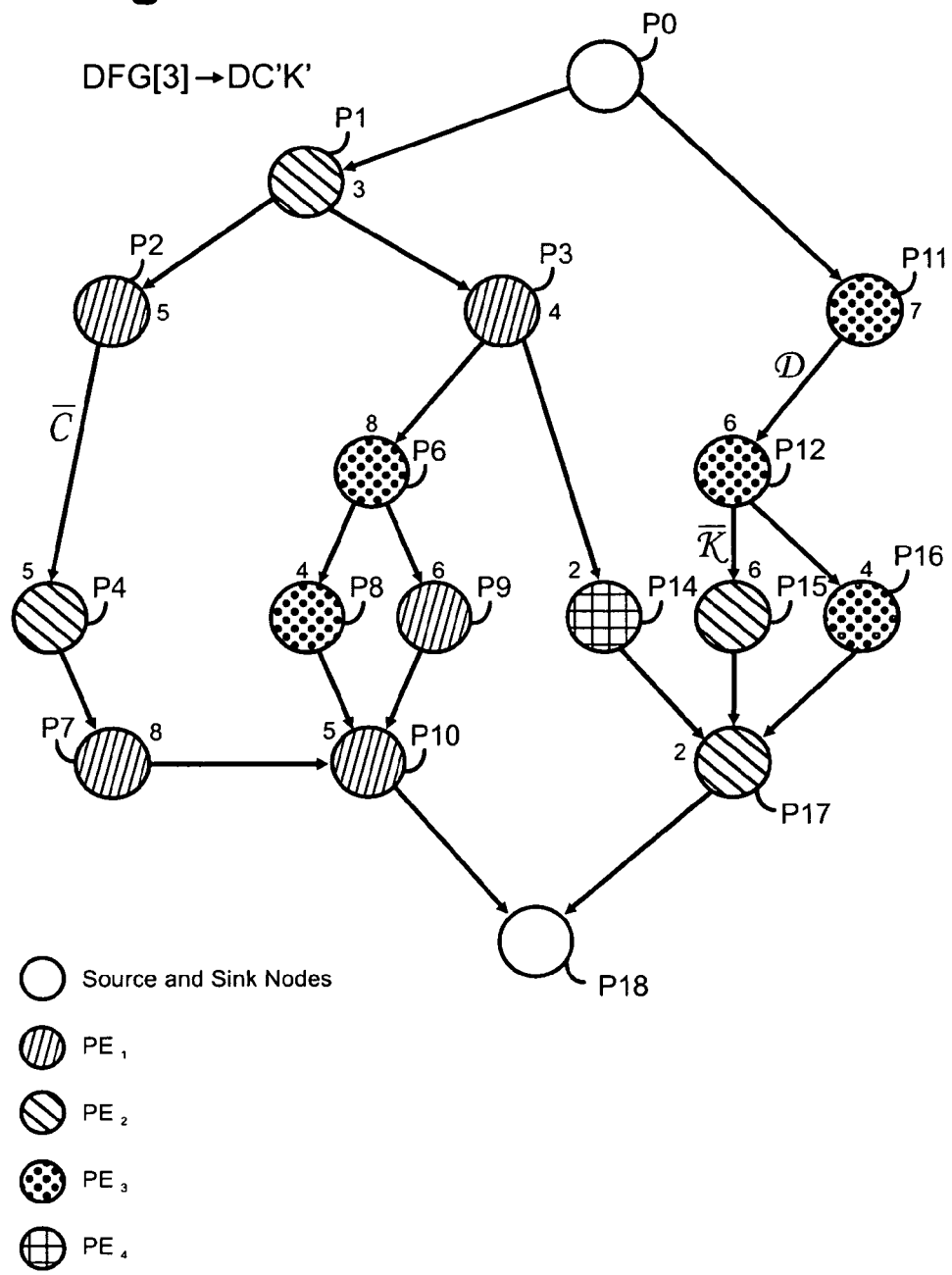
Figure 24:
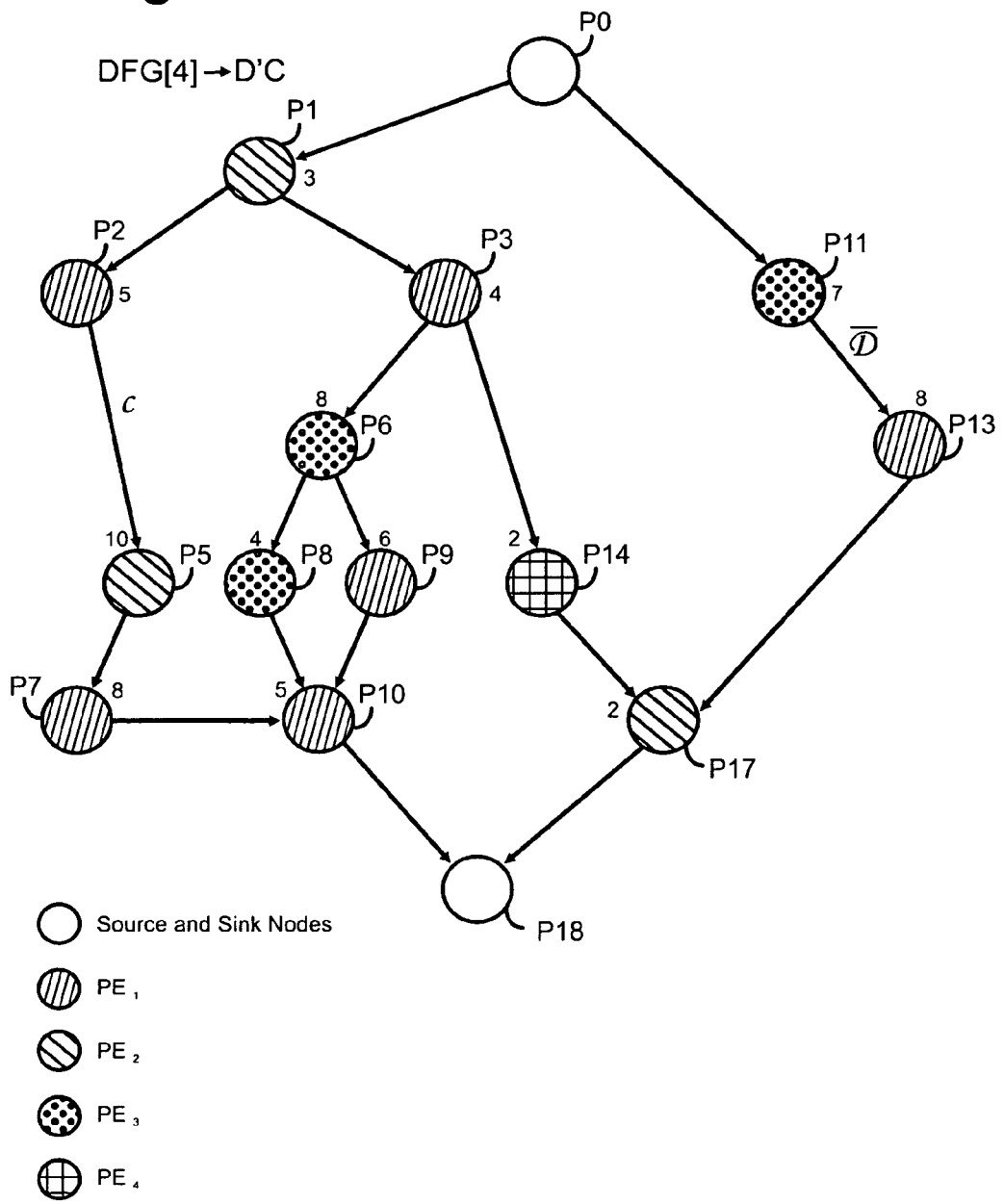
Figure 25:
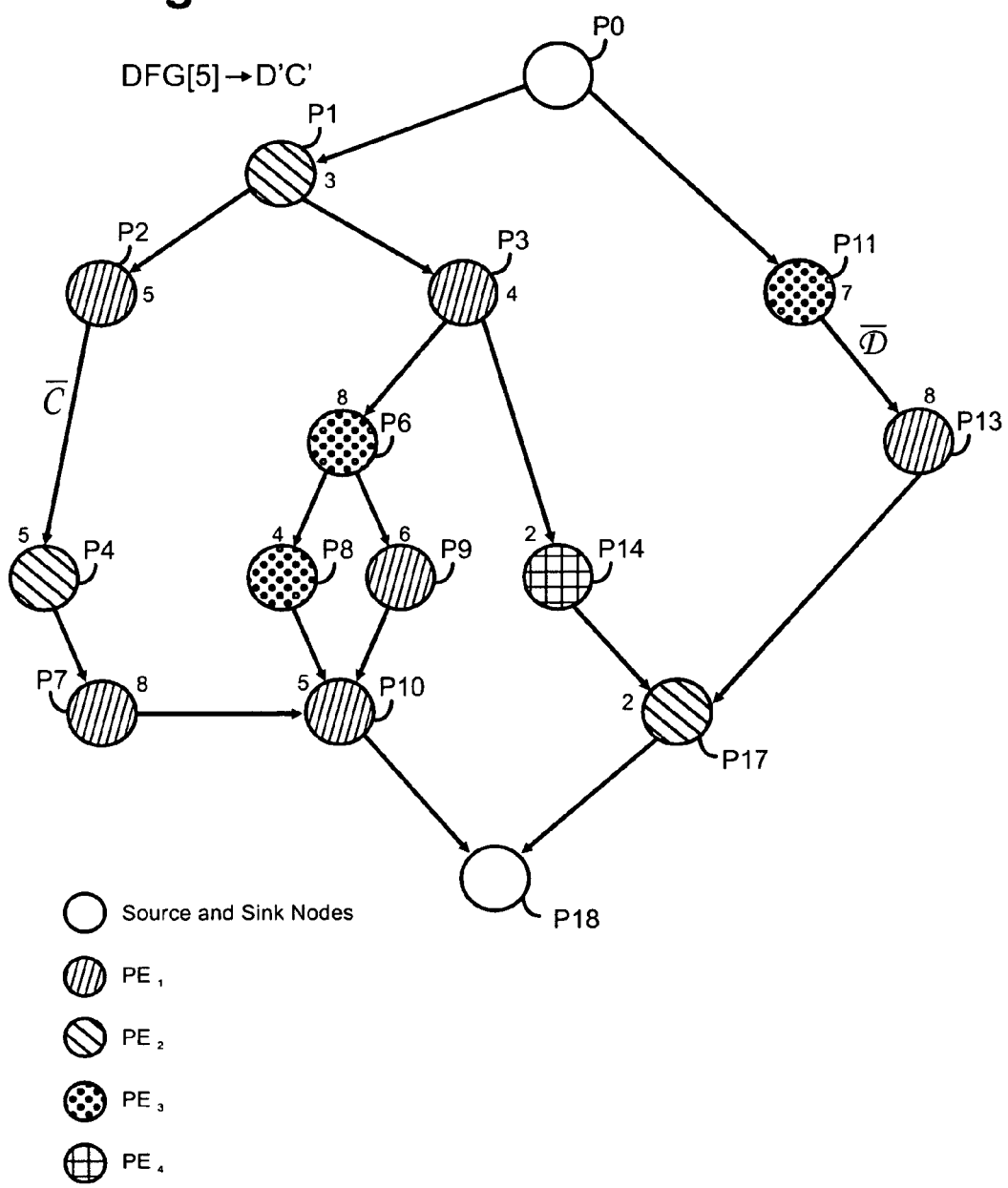

In the graph of FIG. 19, each of the circles represents a process. Sufficient resources are assumed for communication purposes. All the processes have an execution time associated with them, which has been shown alongside each circle. If any process is a control-based process, then the various values to which the condition evaluates are shown on the edges emanating from that process circle (e.g. P11 evaluates to D, or $\overline{D}$. The method may be summarized as follows:

i. Use known Partial Critical Path (PCP) scheduling to determine the delays for each possible path of the CDFG and arrange the list of paths in descending order of the delays.
  ii. Perform branch and bound based scheduling (which need not be done for every path to reduce the complexity).
  iii. Once the final list of all schedules is ready, merge all the schedules by respecting data and resource dependencies.

This example demonstrates the initialization strategy. It describes how the CDFG is split into individual DFGs. Moreover, it also shows the various fields required for each node and edge. For the CDFG of FIG. 19, initialization of CDFG data structure and Branching tree proceeds as follows:

Var_indices: var[0]=D; var[1]=C; var[2]=K;
Assume number of processing elements of type=1
Branching tree paths: DCK, DC$\overline{K}$, D$\overline{C}$K, D$\overline{C}$$\overline{K}$, $\overline{D}$CK, $\overline{D}$C$\overline{K}$, $\overline{D}$$\overline{C}$K, $\overline{D}$$\overline{C}$$\overline{K}$
Branching tree paths not possible: $\overline{D}$CK, $\overline{D}$C$\overline{K}$, $\overline{D}$$\overline{C}$K, $\overline{D}$$\overline{C}$$\overline{K}$
Removing K we get: $\overline{D}$C, $\overline{D}$$\overline{C}$
Final Branching tree paths: DCK, DC$\overline{K}$, D$\overline{C}$K, D$\overline{C}$$\overline{K}$, $\overline{D}$C, $\overline{D}$$\overline{C}$.

Tables 2 and 3 are the node and edge lists, respectively, for the CDFG of FIG. 19. FIGS. 20-25 are the individual Data Flow Graphs (DFGs) of the CDFG of FIG. 19.

TABLE 2

Node list for the CDFG

| Node_index | exec_time | pe_index | is_true_var_index | true_or_false | # is_true_var_indices |
|---|---|---|---|---|---|
| 1 | 3 | 1 | [ ] | [ ] | 0 |
| 2 | 4 | 1 | [ ] | [ ] | 0 |
| 3 | 12 | 2 | [ ] | [ ] | 0 |
| 4 | 5 | 1 | [1] | [0] | 1 |
| 5 | 3 | 2 | [1] | [0] | 1 |
| 6 | 5 | 1 | [1] | [1] | 1 |
| 7 | 3 | 2 | [1] | [0] | 1 |
| 8 | 4 | 3 | [1] | [1] | 1 |
| 9 | 5 | 1 | [1] | [1] | 1 |
| 10 | 5 | 1 | [ ] | [ ] | 0 |
| 11 | 6 | 2 | [ ] | [ ] | 0 |
| 12 | 6 | 3 | [0] | [1] | 1 |
| 13 | 8 | 1 | [0] | [0] | 1 |
| 14 | 2 | 2 | [0 2] | [1 1] | 2 |
| 15 | 6 | 2 | [0 2] | [1 0] | 2 |
| 16 | 4 | 3 | [0] | [1] | 1 |
| 17 | 2 | 2 | [ ] | [ ] | 0 |

TABLE 3

Edge list for the CDFG:

| Edge_index | parent_node_id | child_node_id | is_control | variable_index |
|---|---|---|---|---|
| 1 | 1 | 2 | 0 | |
| 2 | 1 | 3 | 0 | |
| 3 | 2 | 4 | 1 | 1 |
| 4 | 2 | 5 | 1 | 1 |
| 5 | 2 | 6 | 1 | 1 |
| 6 | 3 | 6 | 0 | |
| 7 | 4 | 5 | 0 | |
| 8 | 4 | 7 | 0 | |
| 9 | 6 | 8 | 0 | |
| 10 | 6 | 9 | 0 | |
| 11 | 7 | 10 | 0 | |
| 12 | 8 | 10 | 0 | |
| 13 | 9 | 10 | 0 | |
| 14 | 11 | 12 | 1 | 0 |
| 15 | 11 | 13 | 1 | 0 |
| 16 | 3 | 14 | 0 | |
| 17 | 12 | 14 | 1 | 2 |
| 18 | 12 | 15 | 1 | 2 |
| 19 | 12 | 16 | 0 | |
| 20 | 13 | 17 | 0 | |
| 21 | 14 | 17 | 0 | |
| 22 | 15 | 17 | 0 | |
| 23 | 16 | 17 | 0 | |

Figure 26:
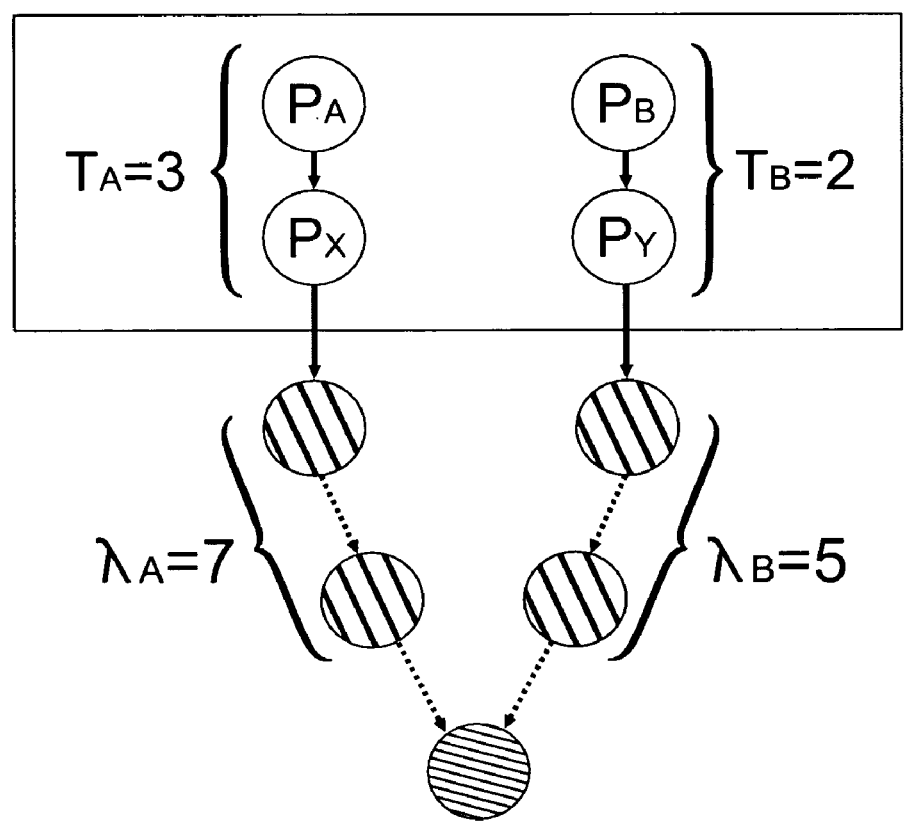
FIG. 26 is a graphical illustration of two processes to be scheduled by partial critical path.

PCP scheduling is a modified list-based scheduling algorithm. The basic concept in a partial Critical Path based scheduling algorithm is that if, as shown in FIG. 26, Processing Elements $P_A, P_B, P_X, P_Y$ are all to be mapped onto the same resource say Processor Type 1. $P_A$ and $P_B$ are in the ready list and a decision needs to be taken as to which will be scheduled first. $\lambda_A$ and $\lambda_B$ are times of execution for processes in the paths of $P_A$ and $P_B$ respectively, but which are not allocated on the Processors of type 1 and also do not share the same type of resource.

Figure 27:
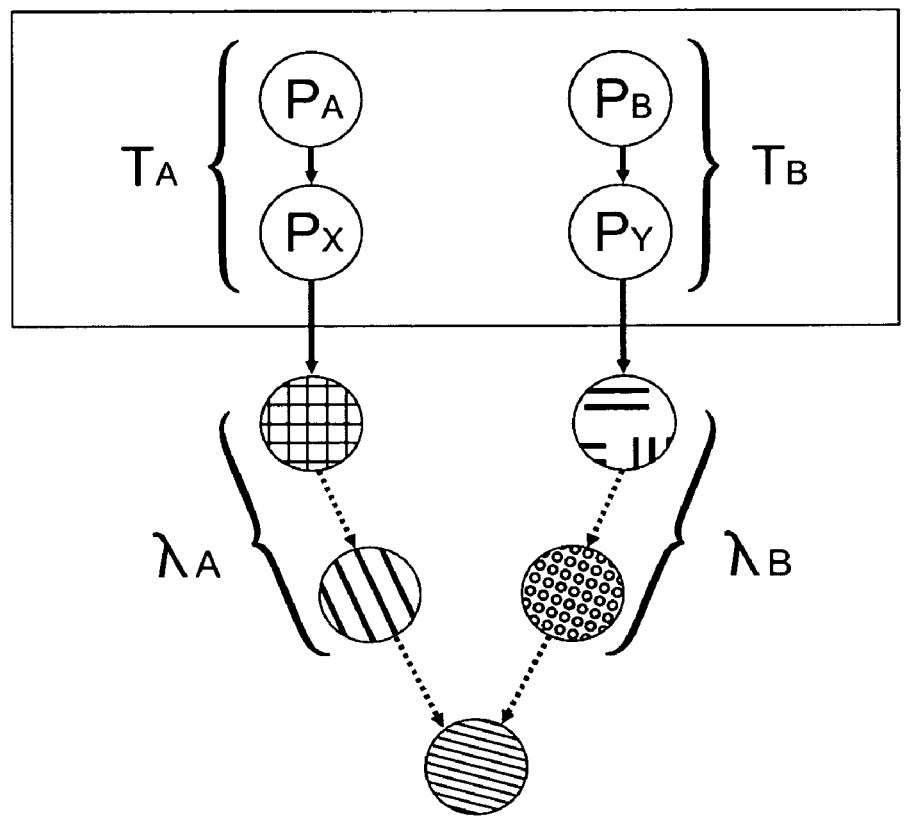
FIG. 27 is a diagrammatic illustration of a pair of processes to be scheduled by partial critical path, like those of FIG. 26.

If $P_A$ is assigned first, then the longest time of execution is decided by the $\text{Max}(T_A+\lambda_A, T_A+T_B+\lambda_B)$. If $P_B$ is assigned first, then the longest time of execution is decided by the $\text{Max}(T_B+\lambda_B, T_B+T_A+\lambda_A)$. The best schedule is the minimum of the two quantities. This is called the partial critical path method because it focuses on the path time of the processes beyond those in the ready list. Therefore if $\lambda_A$ is larger than $\lambda_B$, a better schedule is obtained if Process A is scheduled first. But this does not consider the resource sharing possibility between the processes in the path beyond those in the ready list. A simple example (FIG. 27) shows that if $T_A=3$, $T_B=2$, $\lambda_A=7$, $\lambda_B=5$, where in processes in the $\lambda_A$ and $\lambda_B$ sections share the same resource, say Processor type 2, then scheduling Process A first gives a time of 15 and scheduling B first gives a time of 14. But both the critical path and PCP as proposed by Pop [69] suggest scheduling A first.

The difference is because, if the resource constraint of the post ready list processes is considered, the best schedule is a min of 2 max quantities:

$\text{Max}(T_B, \lambda_A) \ \& \ \text{Max}(T_A, \lambda_B)$.

Pop [69] uses the heuristic obtained from PCP scheduling to bound the schedules in a typical branch and bound algorithm to get to the optimal schedule. But branch and bound algorithm is an exponentially complex algorithm in the worst-case. So there is a need for a less complex algorithm that can produce near-optimal schedules. From a higher view point of scheduling one needs to limit the need for branch and bound scheduling as much as possible.

Initially, the control variables in the CDFG are extracted. Let $c1, c2, \ldots, cn$ be the control variables. Then there will be at most $2^n$ possible data-flow paths of execution for each combination of these control variables from the given CDFG. An ideal aim is to get the optimal schedule at compile time for each of these paths. Since the control information is not available at compile time, one needs to arrive at an optimal solution for each path with every other path in mind. This optimal schedule is arrived at in two stages. First the optimal individual schedule for each path is determined. Then each of these optimal schedules is modified with the help of other schedules.

Stage 1: There are $m=2^n$ possible Data Flow Graphs (DFG's). For each DFG, the PCP scheduling is done. Then, the DFG's are ordered in the decreasing order of their total delays. An optimal solution can be obtained by doing branch and bound scheduling for each of these PCP scheduled DFG's. But branch and bound is a highly complex algorithm with exponential complexity. In this case, this complex operation needs to be done $2^n$ times, where n is the number of control variables. This increases the complexity way beyond control. Hence branch and bound is done only when it is essential to do so. Then branch and bound scheduling is done for DFG1, which has the largest delay. For DFG2, the PCP delay is compared with the branch and bound delay of DFG1. If the PCP delay is smaller, then the PCP scheduling is taken as the optimal schedule for that path. If not, then the branch and bound scheduling is done to get the optimal schedule. It is reasonable to do this, as the final delay of each DFG after modification is going to be close to the delay of the worst delay path. In the same way, the optimal schedule is arrived at for each of the DFG.

Stage 2: Once the optimal schedule is arrived at, a schedule table is initialized with the processes on the rows and the various combinations of control variables on the column. A branching tree is also generated, which shows the various control paths. This contains only the control information of the CDFG. There exists a column in the schedule table corresponding to each path in this branching tree. The branching tree is shown in FIG. 26. The path corresponding to the maximum delay is taken and the schedule for that corresponding path is taken as the template (DCK'). Now the DCK path is taken and the schedule is modified according to that of DCK'. This is done for all the paths. The final schedule table obtained will be the table that resides on the processor.

The pseudo code of this process is summarized here.

Algorithm:

```
Task schedule (G(V,E), CTRL_VARS[N], PE = {PE1,PE2.....PEM})
For each combination of CTRL_VARS do
{
   Generate a DFG Gsub(V,E,CTRL_VARS[I]) which is a sub-graph of G(V,E). Only the
   nodes and edges in the control flow corresponding to the current combination of
   CTRL_VARS are included in this sub-graph.
   Generate the PCP schedule of Gi. Let the schedule be PCP_sched[I] and the delay be
   PCP_delay[I].
}
Sort PCP_sched and PCP_delay and Gsub in decreasing order of PCP_delay[I].
Generate the Branch and bound schedule for Gsub[0], the sub-graph with the worst
PCP_delay. Let the schedule be BB_sched[I=0] and the delay be BB_delay[I=0].
Initialize worst_bb_delay = BB_delay[0]
For all the other sub-graphs do
{
   if (PCP_delay[I] < worst_bb_delay) then
         BB_sched[I] = PCP_sched[I];
         BB_delay[I] = PCP_delay[I];
     else
         Generate BB_sched[I] and BB_delay[I];
         If (BB_delay[I] > worst_bb_delay[I]) then
             Worst_bb_delay = BB_delay[I];
}
Generate the branching tree with the help of the G(V,E). In this branching tree, the edge
represents the choices (K and K') and the node represents the variable (K)
Initialize the current path to the one leading from the top to the leaf in such a way that the
DFG corresponding to this path gives the worst_bb_delay. The path is nothing but a list
of edges tracing from the top node till the leaf.
```

Processes with large execution times have a greater impact on the schedule than the shorter processes. Hence, large processes are scheduled in a special way. The shorter processes can be scheduled using the PCP scheduling algorithm. Since PCP scheduling is done for most of the processes, the complexity stays closer to O(N), where N is the number of processes to be scheduled.

a) Identify the first set of processes that need to be scheduled onto the same processor which are computationally complex. Let's call them MP1, MP2 ... (Macro process 1 etc.)
b) Schedule all the processes till these macro processes in the data flow graph using PCP scheduling.
c) Calculate the estimated execution time of the smaller processes to find the start time of each of the macro process.
d) Determine the next set of such macro processes in the DFG. Let's call them MP_sub1, MP_sub2 ...
e) For processes amidst these two sets of macro processes, PCP scheduling is used.
f) For processes occurring after the second set of macro processes, the execution times are added up to get the total execution time.
g) Now, determine the order of execution of these processes by estimating the worst-case execution time in each case and selecting the best amongst them.
h) After this scheduling, the block after the second set of macro processes is taken as the current DFG and steps a-g re implemented.
i) Step h is repeated till the end of DFG is reached.

Schedule Merging:

In the schedule table there are some columns representing paths that are complete and some that are not. The incomplete paths can be now referred to as parent paths of possible complete paths.

Figure 28:
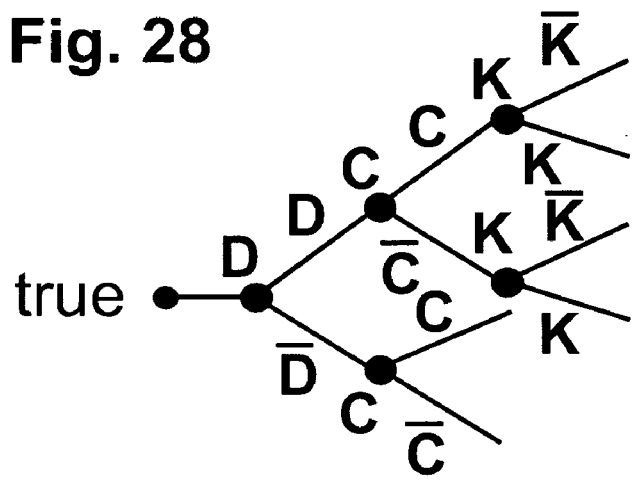
FIG. 28 is a diagrammatic illustration of a tree of possible paths used in scheduling the example of FIG. 19.

In the example shown in FIG. 19, for earliest evaluation of all conditional variables (viz. D, C, K) it is necessary to evaluate D first, then C and then K. Therefore the tree of possible paths is as shown in FIG. 28. Now, while creating the schedule table, initially only considered are the full possible paths i.e., the 6 paths listed in FIG. 28. Scheduling is performed by the suggested algorithm. This will fill these columns. Then the remaining column of partial paths (i.e., D, $\overline{DC}$, ... etc) is created. These are now just empty columns. Now if a process has the same start times in multiple columns, it is pushed into the parent empty column.

For example, from the FIG. 4 of Pop's paper "scheduling of conditional process graphs for the synthesis of embedded systems" one sees that processes P1, P2, P6, P9, P10, P11, Pe and so on have the same time of occurrences in both paths. Therefore one can push them into the parent column, of $\overline{DC}$ because it means that these processes can be scheduled for execution (not necessarily executed) by the logic schedule manager after C has been evaluated.

This approach tries to obtain the worst case delay and merge all paths to that timeline. Since the $\overline{DCK}$ path had the worst case optimal delay, all other full paths were adjusted to match this path. But it is also necessary to consider the probability of the occurrence of all the full paths (6 of them). Then preferably the bottom 10% of the paths are pruned out. That is, one disregards those full paths whose probability of occurrence is less than a threshold value when compared to the path with most probable occurrence.

Then a path is selected from the remaining ones, whose probability of occurrence is the highest. This will be the new reference to which all the remaining paths will adjust. Now it is likely that these chosen full paths and the disregarded full paths, share certain partial paths (parent paths). Therefore, while allocating the start times for the processes that fall under these shared partial paths, one must allocate them based on the worst (most delay consuming) disregarded path which needs (shares) these processes. While performing schedule merging, all data dependencies must be respected.

Example

Modified PCP for the DFG[1] Corresponding to the Branching Tree Path DCK'

This example shows how the modified PCP approach of this invention out-performs the conventional PCP algorithm. Decision taken at each schedule step has been illustrated.
Current time=1
Ready List: 1, 11
Schedule 1→PE2 (next schedule time=4) 11→PE3 (Next schedule time=8)
Current_time=4
Ready list: 2,3
There is a conflict;
one needs to determine the next possible conflict between the remaining tasks dependent on 2,3.
Possible conflicts on the conflict table:

TABLE 4

Conflict Table

| Node_index | List of possible conflicts | Processing Element |
|---|---|---|
| 7 | [9] | 1 |
| 9 | [7] | 1 |
| 10 | [ ] | 1 |
| 5 | [17] | 2 |
| 17 | [5] | 2 |
| 6 | [ ] | 3 |
| 8 | [ ] | 3 |

Case 1: 7, 9
Case 2: 5, 17

ASAP and ALAP times are used to determine the amount of conflict for each case. For this example, Case 1 has more conflict. Hence, consider case 1.
Now, possible orders of execution: [2,3,7,9],[2,3,9,7],[3,2,7,9],[3,2,9,7].
Determine the worst-case execution time for each of these paths and select the order with minimum worst-case execution time.
Worst-Case Execution Times:
[2,3,7,9]→34
[2,3,9,7]→36
[3,2,7,9]→38
[3,2,9,7]→32
Hence, the best execution order is [3,2,9,7].
Schedule 3→PE1 (next schedule time=8)
Current time=8 (min(next schedule times not yet used as current time))
Ready list: 12,2,14,6
Schedule 14→PEx (nst=10) 2→PE1 (nst=13)
There now is a conflict between 6 and 12.
There are no conflicts between the remaining tasks dependent on 6,12. Therefore the only possible orders of execution are: 6,12 and 12,6
Worst-Case Execution Times:
[6,12]→22
[12,6]→25

Therefore, [6,12] is a better choice.
Schedule 6→PE3 (nst=16)
Current time=13
Ready list: 5
Schedule 5→PE2 (nst=23)
Current time=16
Ready list: 12, 8, 9
Schedule 9→PE1 (nst=22)
There is now a conflict between 8 and 12.
There are no conflicts between the remaining tasks dependent on 8,12. Therefore the only possible orders of execution are:
8,12 and 12,8
Worst-Case Execution Times:
[8,12]→18
[12,8]→15
Therefore, [12,8] is a better choice.
Schedule 12→PE3 (nst=22)
Current time=22
Ready list: 16,8
There is now a conflict between 8 and 16.
There are no conflicts between the remaining tasks dependent on 8,16. Therefore the only possible orders of execution are:
8,16 and 16,8
Worst-Case Execution Times:
[8,16]→10
[16,8]→13
Therefore, [8.16] is a better choice.
Schedule 8→PE3 (nst=26)
Current time=23
Ready list: 15,7
Schedule 15→PE2 (nst=28) 7→PE1 (nst=31)
Current time=26
Ready list: 16
Schedule 16→PE3 (nst=30)
Current time=30
Ready list: 17
Schedule 17→PE2 (nst=32)
Current time=31
Ready list: 10
Schedule 10→PE1 (nst=36)
Schedule table entry for DFG[1] for our method and PCP method.

TABLE 5

Schedule Table for DFG (1)

| Process | Our DC$\overline{K}$ | PCP DC$\overline{K}$ |
|---|---|---|
| 1 | 1 | 1 |
| 2 | 8 | 4 |
| 3 | 4 | 9 |
| 4 | | |
| 5 | 13 | 9 |
| 6 | 8 | 14 |
| 7 | 23 | 19 |
| 8 | 22 | 22 |
| 9 | 16 | 27 |
| 10 | 31 | 33 |
| 11 | 1 | 1 |
| 12 | 16 | 8 |
| 13 | | |
| 14 | 8 | 25 |
| 15 | 23 | 19 |
| 16 | 26 | 26 |
| 17 | 30 | 30 |
| Exec. Time | 35 | 37 |

Similarly, Schedule table entries can be generated for the remaining DFGs

TABLE 6

Schedule Table for Remaining DFGs

| Process | Our DC$\overline{K}$ | PCP DC$\overline{K}$ | DCK | D$\overline{C}$K | DC$\overline{K}$ | $\overline{D}$C | $\overline{DC}$ |
|---|---|---|---|---|---|---|---|
| 1 | 1 | 1 | 1 | 1 | 1 | 1 | 1 |
| 2 | 8 | 4 | 8 | 4 | 4 | 8 | 4 |
| 3 | 4 | 9 | 4 | 9 | 9 | 4 | 9 |
| 4 | | | | 9 | 9 | | 9 |
| 5 | 13 | 9 | 13 | | | 13 | |
| 6 | 8 | 14 | 8 | 13 | 13 | 8 | 13 |
| 7 | 23 | 19 | 23 | 14 | 14 | 23 | 21 |
| 8 | 22 | 22 | 22 | 21 | 21 | 16 | 21 |
| 9 | 16 | 27 | 16 | 22 | 22 | 16 | 29 |
| 10 | 31 | 33 | 31 | 28 | 28 | 31 | 35 |
| 11 | 1 | 1 | 1 | 1 | 1 | 1 | 1 |
| 12 | 16 | 8 | 16 | 8 | 8 | | |
| 13 | | | | | | 13 | 13 |
| 14 | 8 | 25 | 22 | 13 | 13 | 8 | 13 |
| 15 | 23 | 19 | | | 19 | | |
| 16 | 26 | 26 | 26 | 25 | 25 | | |
| 17 | 30 | 30 | 30 | 29 | 29 | 21 | 21 |
| Exec. T | 35 | 37 | 35 | 32 | 32 | 35 | 39 |

Branch and Bound Scheduling

Arranging the DFG in the decreasing order of their MPCP_delay (Exec T in the tables), one gets DFG[0] → $\overline{DC}$   MPCP_delay[0] = 39
DFG[1] → DCK   MPCP_delay[1] = 35
DFG[2] → DC$\overline{K}$   MPCP_delay[2] = 35
DFG[3] → $\overline{D}$C   MPCP_delay[3] = 35
DFG[4] → D$\overline{C}$K   MPCP_delay[4] = 32
DFG[5] → DC$\overline{K}$   MPCP_delay[5] = 32

Now, one needs to determine the Branch and Bound Schedule for DFG[0]. Branch and Bound gives the optimal schedule. Here, the schedule produced by the modified PCP approach of the invention was the optimal schedule in this case. Hence, branch and bound also produces the same schedule. Since, the remaining delays are all lesser than the branch and bound delay produced, there is no need to do branch and bound scheduling for the remaining DFGs.

Schedule Merging:

Schedule merging gives the optimal schedule for the entire CDFG. Optimal schedule should take care of the fact that the common processes have the same schedule. If the common processes have different schedules, one modifies the schedule with lesser delay. Schedule merging for (DCK, DC$\overline{K}$) to give the optimal schedule for DC is done here.

Processes common: 1,2,3,5,6,7,8,9,10,11,12,14,16,17

From the schedule table, it can be observed that only 14 has a different schedule time. To make it equal, we push 14 down the schedule. The modified table is shown below.

TABLE 7

Modified Schedule Table for DC$\overline{K}$ and DC$\overline{K}$

| Process | DCK | DC$\overline{K}$ before | DC$\overline{K}$ after |
|---|---|---|---|
| 1 | 1 | 1 | 1 |
| 2 | 8 | 8 | 8 |
| 3 | 4 | 4 | 4 |
| 4 | | | |

TABLE 7-continued

Modified Schedule Table for $D\overline{C}K$ and $DC\overline{K}$

| Process | DCK | $DC\overline{K}$ before | $DC\overline{K}$ after |
|---|---|---|---|
| 5 | 13 | 13 | 13 |
| 6 | 8 | 8 | 8 |
| 7 | 23 | 23 | 23 |
| 8 | 22 | 22 | 22 |
| 9 | 16 | 16 | 16 |
| 10 | 31 | 31 | 31 |
| 11 | 1 | 1 | 1 |
| 12 | 16 | 16 | 16 |
| 13 | | | |
| 14 | 22 | 8 | 22 |
| 15 | | 23 | 23 |
| 16 | 26 | 26 | 26 |
| 17 | 30 | 30 | 30 |
| Exec. Time | 35 | 35 | 35 |

Schedule merging for $D\overline{C}K$ and $DC\overline{K}$ to obtain optimal schedule for $D\overline{C}$ Processes common: 1,2,3,4,6,7,8,9,10,11,12,14,16,17

Here, all the processes have the same schedule. Hence, there is no need to do schedule merging.

Schedule merging for DC and $D\overline{C}$ to obtain optimal schedule for D

Processes common: 1,2,3,6,7,8,9,10,11,12,14,16,17

Here, 2,3,6,8,9,10,14,16 have different schedules.

Hence, one needs to modify the schedules of $D\overline{C}K$ as it has a lesser delay E.g. Interchange schedules of 2 and 3.

TABLE 8

Modified Schedule Table for DC and $D\overline{C}$.

| Process | DC | $D\overline{C}$ before | $D\overline{K}$ after |
|---|---|---|---|
| 1 | 1 | 1 | 1 |
| 2 | 8 | 4 | 8 |
| 3 | 4 | 9 | 4 |
| 4 | | 9 | 13 |
| 5 | 13 | | |
| 6 | 8 | 13 | 8 |
| 7 | 23 | 14 | 23 |
| 8 | 22 | 21 | 22 |
| 9 | 16 | 22 | 16 |
| 10 | 31 | 28 | 31 |
| 11 | 1 | 1 | 1 |
| 12 | 16 | 8 | 16 |
| 13 | | | |
| 14 | 22 | 13 | 22 |
| 15 | 23 | | |
| 16 | 26 | 25 | 26 |
| 17 | 30 | 29 | 30 |
| Exec. Time | 35 | 32 | 35 |

Schedule merging for $\overline{D}C$ and $\overline{DC}$ to obtain optimal schedule for $\overline{D}$ Processes common: 1,2,3,6,7,8,9,10,11,13,14,17

Here, 2,3,6,7,8,9,10,14 have different schedules.

Hence, one needs to modify the schedules of $\overline{D}C$ as it has a lesser delay.

TABLE 9

Modified Schedule Table for $\overline{D}C$ and $\overline{DC}$

| Process | $\overline{DC}$ | $\overline{D}C$ before | $\overline{D}C$ after |
|---|---|---|---|
| 1 | 1 | 1 | 1 |
| 2 | 4 | 8 | 4 |
| 3 | 9 | 4 | 9 |
| 4 | 9 | | |
| 5 | | 13 | 13 |
| 6 | 13 | 8 | 13 |
| 7 | 21 | 23 | 21 |
| 8 | 21 | 16 | 21 |
| 9 | 29 | 16 | 29 |
| 10 | 35 | 31 | 35 |
| 11 | 1 | 1 | 1 |
| 12 | | | |
| 13 | 13 | 13 | 13 |
| 14 | 13 | 8 | 13 |
| 15 | | | |
| 16 | | | |
| 17 | 21 | 21 | 21 |
| Exec. Time | 39 | 35 | 39 |

Schedule merging for D and D' to obtain optimal schedule for 'true' condition

Processes common: 1,2,3,6,7,8,9,10,11,14,17

Here, 2,3,6,7,8,9,10,14,17 have different schedules.

Hence, one needs to modify the schedules of D as it has a lesser delay.

TABLE 10

Modified Schedule Table for D and $\overline{D}$

| Process | $\overline{D}$ | D before | D after |
|---|---|---|---|
| 1 | 1 | 1 | 1 |
| 2 | 4 | 8 | 4 |
| 3 | 9 | 4 | 9 |
| 4 | | 13 | 13 |
| 5 | 13 | | |
| 6 | 13 | 8 | 13 |
| 7 | 21 | 23 | 21 |
| 8 | 21 | 22 | 21 |
| 9 | 29 | 16 | 29 |
| 10 | 35 | 31 | 35 |
| 11 | 1 | 1 | 1 |
| 12 | | 16 | 25 |
| 13 | 13 | | |
| 14 | 22 | 22 | 22 |
| 15 | | | |
| 16 | | 26 | 31 |
| 17 | 35 | 30 | 35 |
| Exec. Time | 39 | 35 | 39 |

Here, schedule for $\overline{D}$ also needed to be modified without changing the total delay.

Sometimes, the delay could be worsened due to schedule merging.

TABLE 11

Final Schedule Table.

| Process | $DC\overline{K}$ | DCK | $D\overline{C}K$ | $D\overline{CK}$ | DC | $\overline{D}C$ |
|---|---|---|---|---|---|---|
| 1 | 1 | 1 | 1 | 1 | 1 | 1 |
| 2 | 4 | 4 | 4 | 4 | 4 | 4 |
| 3 | 9 | 9 | 9 | 9 | 9 | 9 |
| 4 | | | 9 | 9 | | 9 |
| 5 | 13 | 13 | | | 13 | |
| 6 | 13 | 13 | 13 | 13 | 13 | 13 |
| 7 | 21 | 21 | 21 | 21 | 21 | 21 |

TABLE 11-continued

Final Schedule Table.

| Process | DCK̄ | DCK | D̄CK | D̄C̄K | DC | D̄C |
|---|---|---|---|---|---|---|
| 8 | 21 | 21 | 21 | 21 | 21 | 21 |
| 9 | 29 | 29 | 29 | 29 | 29 | 29 |
| 10 | 35 | 35 | 35 | 35 | 35 | 35 |
| 11 | 1 | 1 | 1 | 1 | 1 | 1 |
| 12 | 16 | 16 | 16 | 16 | | |
| 13 | | | | | 13 | 13 |
| 14 | 22 | 22 | 22 | 22 | 22 | 22 |
| 15 | 23 | | | 19 | | |
| 16 | 26 | 26 | 26 | 26 | | |
| 17 | 35 | 35 | 35 | 35 | 35 | 35 |
| Exec. T | 39 | 39 | 39 | 39 | 39 | 39 |

Reconfiguration

Reconfiguration times have not been taken into account in the scheduling of CDFGs. An example shows how this time can influence the tightness of a schedule. Consider the following task graph (FIG. 29). X, V and Z are processes performed by the same processing element.

In the task graph, say 'a' is a variable that influences the decision on which of the two mutually exclusive paths (dash-dotted or dotted) will be taken, and a is known during run time but much earlier than 'm' and 'z' have started. Let x, v, z and λ be the times taken by processes in the event that 'a' happens to force the dash-dotted path to be taken. Let θ, δ, η be the reconfiguration times for swapping between the processes on the unit. Given these circumstances, if run time scheduling according to [68] is applied, it neglects the reconfiguration times and provides a schedule of five cycles as shown on the left hand side. But if reconfiguration time were to have been considered, a schedule more like the one on the right hand side is tighter with 4 clock cycles. This example shows the importance of considering reconfiguration time in a reconfigurable processor, if fast swaps of tasks on the processing units need to be performed.

Therefore incorporating Reconfiguration time into Control flow graphs involves the following steps:
 i. Special edges are added onto the control flow graphs between a similar set of processes, which will be executed on the same processor with or without reconfiguration. In other words, these additional edges are inserted and the modified PCT scheduling as above is carried out with these in place.
 ii. Reconfiguration times affect the worst-case execution time of loopy codes. So this has to be taken care of, when loopy codes are being scheduled.
 iii. Care needs to be taken to schedule the transfer of reconfiguration bit-stream from the main memory to the processor memory.

Loop-Based Scheduling

In static scheduling, loops whose iteration counts are not known at compile time impose scheduling problems on tasks which are data dependent on them, and those tasks that have resource dependency on their processing unit. Therefore, this preferred, exemplary embodiment takes into account cases which are likely to impact the scheduling to the largest extent and provided solutions.

Case 1: Solitary loops with unknown execution time. Here, the problem is the execution time of the process is known only after it has finished executing in the processor. So static scheduling is not possible.

Solution: (Assumption) Once a unit generates an output, this data is stored at the consuming/target unit's input buffer. Referring to the scheduled chart of FIG. 30, each row represents processes scheduled on a unique type of unit (Processing Element). Let P1 be the loopy process.

Figure 30:
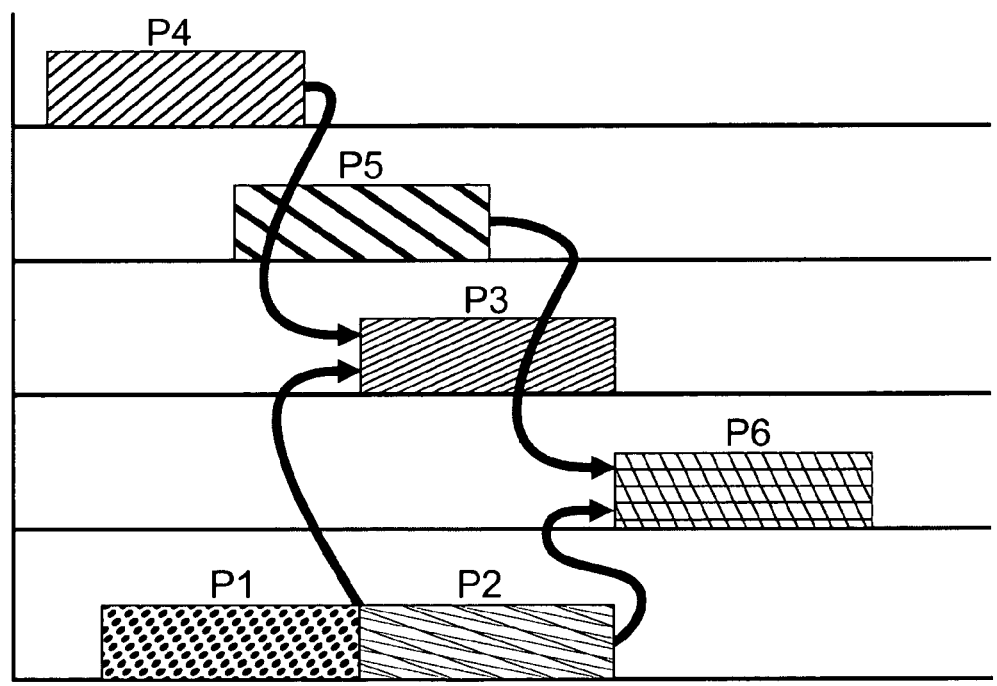
FIG. 30 is a scheduling chart, each row representing processes scheduled on a unique processing element.

From FIG. 30 we see that
P3 depends on P1 and P4,
P2 depends on P1,
P6 depends on P2 and P5.

Figure 32:
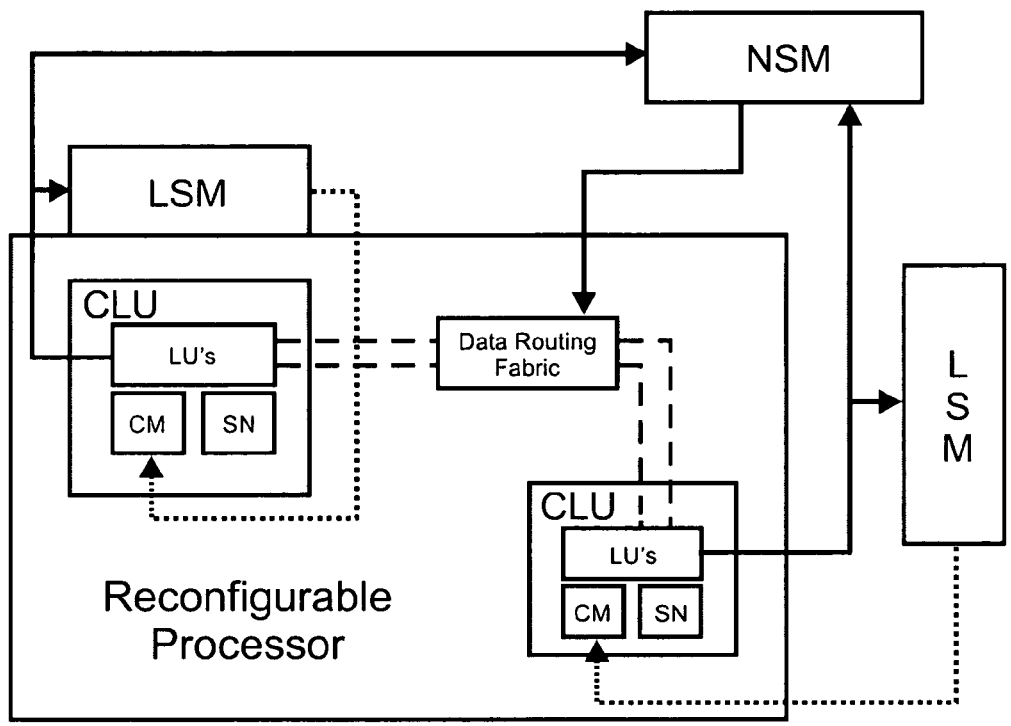
FIG. 32 is a diagrammatic block diagram of a reconfigurable processor having its data routing fabric scheduled by a network schedule manager and its logic units scheduled by logic schedule managers.

If P1's lifetime exceeds the assumed lifetime (most probable lifetime or a unit iteration), then all dependents of P1 and their dependents (both resource and data) should be notified and the respective Network Schedule Manager (NSM) and Logic Schedule Manager (LSM), of FIG. 32, should be delayed. Of course, this implies that while preparing the schedule tables, 2 assumptions are made.

1) The lifetimes of solitary loops with unknown execution times are taken as per the most probable case obtained from prior trace file statistics (if available and applicable). Otherwise unitary iteration is considered.

2) All processes that are dependent on such solitary loop processes are scheduled with a small buffer at their start times. This is to provide time for notification through communication channels about any deviation from assumption 1 at run time.

If assumption 1 goes wrong, the penalty paid is:

Consider the example in FIG. 26 where two processes in the ready list are being scheduled based on PCP. Now by PCP method if $\lambda_A > \lambda_B$ and P1 and P2 do not share the same resource, then PA is scheduled earlier than PB. It has been assumed that $\lambda_A$ is due to most probable execution time of Loop P1. But at runtime if Loop P1 executes a lesser number of times than predicted and therefore resulting in $\lambda_A$ being $<\lambda_B$, then the schedule of PA earlier than PB results in a mistake.

The time difference between both possible schedules is calculated. It is not, at this point, proposed to repair the schedule because all processes before P1 have already been executed. And trying to fit another schedule at run time, requires intelligence on the communication network which is a burden. But on the brighter side, if at run time Loop P1 executes a greater number of times than predicted, then $\lambda_A$ will still be $>\lambda_B$. Therefore the assumed schedule holds true.

Case 2: A combination of two loops with one loop feeding data to the other in an iterative manner.

Solution: Consider a processing element, PA, feeding data to a processing element, PB, in such a manner. For doing static scheduling, if one loop unrolls them and treats it in a manner of smaller individual processes, then it is not possible to assume an unpredictable number of iterations. Therefore if an unpredictable number of iterations is assumed in both loops, then the memory foot-print could become a serious issue. But an exception can be made. If both loops at all times run for the same number of iterations, then the schedule table must initially assume either the most probable number of iterations or one iteration each and schedule PA, PB, PA, PB and so on in a particular column. In case the prediction is exceeded or fallen short of, then the NSM and LSMs must do 2 tasks:

1) If the iterations exceed expectations, then all further dependent processes (data and resource) must be notified for postponement and notified for scheduling upon the iterations completion with an appropriate difference in expected and obtained at run time, schedule times. If the iterations fall short of expectations, then all further schedules must only be preponed (moved up).

2) Since the processes PA and PB should denote single iteration in the table, their entries should be continuously incremented at run time by the NSM and the LSMs. The increment for one process of course happens for a predetermined number of times, triggered off by the schedule or execution of the other process. For example in FIG. 31, we see that PA=10 cycles, PB=20 cycles and hence if both loops run for five times, then the entry in the column increments as shown.

Only in such a situation can there be preparedness for unpredictable loop iteration counts.

Case 3: A loop in the macro level i.e. containing more than a single process.

Solution: In this case, there are some control nodes inside a loop. Hence the execution time of the loop changes with each iteration. This is a much more complicated case than the previous options. Here lets consider a situation where there is a loop covering two mutually exclusive paths, each path consisting of two processes (A,B and C,D) with (3,7 and 15,5) cycle times. In the schedule table there will be a column to indicate an entry into the loop and two columns to indicate the paths inside the loop. Optimal scheduling inside the loop can be achieved, but in the global scheme of scheduling, the solution is non-optimal. However this cannot be helped because to obtain a globally optimal solution, all possible paths have to be unrolled and statically scheduled. This results in a table explosion and is not feasible in situations where infinite number of entries in table are not possible. Hence, from a global viewpoint the loop and all its entries are considered as one entity with the most probable number of iterations considered and the most expensive path in each iteration is assumed to be taken. For example in the above case, path C,D is assumed to be taken all the time.

Now, a schedule is prepared for each path and hence entered into the table under two columns. When one schedule is being implemented, the entries for both columns in the next loop iteration is predicted by adding the completion time of the current path to both column entries (of course while doing this care should be taken not to overwrite the entries of the current path while they are still being used). Then when the current iteration is completed and a fresh one is started, the path is realized and the appropriate (updated/predicted) table column is chosen to be loaded from the NSM to the LSMs.

Network Architecture

In order to coordinate the mapping of portions of the schedule table onto corresponding CLUs, we propose the following architecture. The reconfigurable unit interfaces with a host processor and other I/O and memory modules.

The Network Schedule Manager (FIG. 32) has access to a set of tables, one for each processor. A table consists of possible tentative schedules for processes or tasks that must be mapped onto the corresponding processor subject to evaluation of certain conditional control variables. The Logic Schedule Manager schedules and loads the configurations for the processes that need to be scheduled on the corresponding processor, i.e., all processes that come in the same column (a particular condition) in the schedule table. In PCP scheduling, since the scheduling of the processes in the ready list depends only on the part of the paths following those processes, the execution time of the processes shall initially conveniently include the configuration time.

Once a particular process is scheduled and hence removed from the ready list, another process is chosen to be scheduled based on the PCP criteria again. But this time the execution time of that process is changed or rather reduced by using the reconfiguration time, instead of the configuration time. Essentially, for the first process that is scheduled in a column, the completion time=execution time+configuration time.

For the next or successive processes, completion time=predecessor's completion time+execution time+reconfiguration time.

Assuming that once a configuration has been loaded into the CM, the process of putting in place the configuration is instantaneous, it is always advantageous to load successive configurations into the CM ahead of time. This will mean a useful latency hiding for loading a successive configuration.

The reconfiguration time is dependent on two factors:
1) How much configuration data needs to be loaded into the CM (Application dependent)
2) How many wires are there to carry this info from the LSM to the CM (Architecture Dependent)

The Network Schedule Manager should accept control parameters from all LSMs. It should have a set of address decoders, because to send the configuration bits to the Network fabric consisting of a variety of switch boxes, it needs to identify their location. Therefore for every column in the table, the NSM needs to know the route apriori. One must not try to find a shortest path at run time. For a given set of processors communicating, there should be a fixed route. If this is not done, then the communication time of the edges n the CDFG cannot be used as constants while scheduling the graph.

For any edge the, communication time=a constant and uniform configuration time+data transaction time.

The Network architecture consists of switch boxes and interconnection wires. The architecture will be based on the architecture described in [1]. This will be modeled as a combination of "Behavioral" and "Structural" style VHDL. Modifications that will be made are:

a. The Processing Elements derived in section 3 will be used instead of the four input LUTs that were used in Andre's model.
b. RAM style address access will be used to select a module or a switch box on the circuit.
c. Switch connections that are determined to be fixed for an application will be configured only once (at the start of that application).
d. Switch connections that are determined to be fixed for all applications will be shorted and the RC model for power consumption for that particular connection will be ignored for power consumption calculations.
e. The number of hierarchy levels will be determined by the application that has the maximum number of modules, because there is a fixed number of modules that can be connected There will be one Network Schedule Manager (NSM) modeled in "Behavioral" and "Structural" style VHDL. It will store the static schedule table for the currently running application. The NSM collects the evaluated Boolean values of all conditional variables from every module.

For placing modules on the network two simple criteria are used. These are based on the assumption that the network consists of Groups of four Processing Unit Slots (G4PUS) connected in a hierarchical manner.

Note: A loop could include 0 or more number of CGPEs.

Therefore the following priority will be used for mapping modules onto the G4Pus:
a. A collection of one to four modules which are encompassed inside a loop shall be mapped to a G4PUS.
  i. If there are more than four modules inside a loop, then the next batch of four modules are mapped to the next (neighboring) G4PUS.

ii. If the number of CGPEs in a loop ≧2, then they will have greater priority over any FGPEs in that loop for a slot in the G4PUS.

b. For all other modules:

iii. CGPE Modules with more than one Fan-in from other CGPEs will be mapped into a G4PUS.

iv. CGPE Modules with more than one Fan-in from other FGPEs will be mapped into a G4PUS.

Note: The priorities are based on the importance for amount of communication between modules. Both Fan-ins and Fan-outs can be considered, for simplicity, Fan-ins to CGPEs are considered here only.

Testing Methodology

In this research effort, one focuses mainly on reducing the number of reconfigurations that need to be made for running an application and then running other applications on the same processor. One also aims to reduce the time required to load these configurations from memory in terms of the number of configuration bits corresponding to the number of switches.

Time to execute an application for a given area (area estimate models of XILINX FPGAs and Hierarchical architectures can be used for only the routing portion of the circuit) and a given clock frequency can be measured by simulation in VHDL.

The time taken to swap clusters within an application and swap applications (reconfigure the circuit from implementing one application to another) is dependent on the similarity between the successor and predecessor circuits. The time to make a swap will be measured in terms of number of bits required for loading a new configuration. Since a RAM style loading of configuration bits will be used, it is proven [2] to be faster than serial loading (used in Xilinx FPGAs). Speed above the RAM style is expected for two reasons:

a) The address decoder can only access one switch box at a time. So the greater the granularity of the modules, the fewer the number of switches used and hence configured.

b) Compared to peer architectures which have only LUTs or a mixture of LUTs and CPGEs with low granularity (MAC units), CGPEs are expected to be of moderate granularity for abstract control-data flow structures in addition to FGPEs. Since these CPGEs are derived from the target applications, their granularity to be the best possible choice for a reconfigurable purpose is expected. They are modeled in "Behavioral" VHDL and are targeted to be implemented as ASICs. This inherently would lead to a reduced amount of configurations.

The time taken to execute each application individually will be compared to available estimates obtained for matching area and clock specifications from work carried out by other researchers. This will be in terms of number of configurations per application, number of bits per configuration, number of configurations for a given set of applications and hence time in seconds for loading a set of configurations.

Regarding power consumption, sources of Power consumption for a given application can be classified into four parts:

a. Network power consumption due to configurations with an application. This is due to the Effective Load Capacitance on a wire for a given data transfer from one module to another for a particular configuration of switches.

Note: The more closed switches a signal has to pass through, the more the effective load capacitance and resistance. Shorted switches are not considered to contribute to this power.

b. Data transfer into and out of the Processor

Note: This can have a significant impact on the total power in media rich or communication dominated applications ported onto any processing platform.

c. Processing of data inside a module.

Note: This will require synthesizable VHDL modules. But since the focus here is on reducing power due to reconfiguration, this is presently left for future work.

d. The Clock distribution of the processor.

Note: This can be measured if the all parts of the circuit are synthesizable. But the focus here is on a modeling aspect and this measurement is not presently considered.

At the level of modeling a circuit in VHDL, it is possible to only approximately determine the power consumptions. One can use the RC models of XILINX FPGAs and [1] architectures to get approximate power estimates. Power aware scheduling and routing architecture design are complex areas of research in themselves and are not the focus here. Here the focus is on reducing the amount of reconfigurations, which directly impacts the speed of the processor and indirectly impacts the power consumption to a certain extent.

Overall Architecture

Tool Set: Profiling, Partitioning, Placement and Routing

Figure 33:
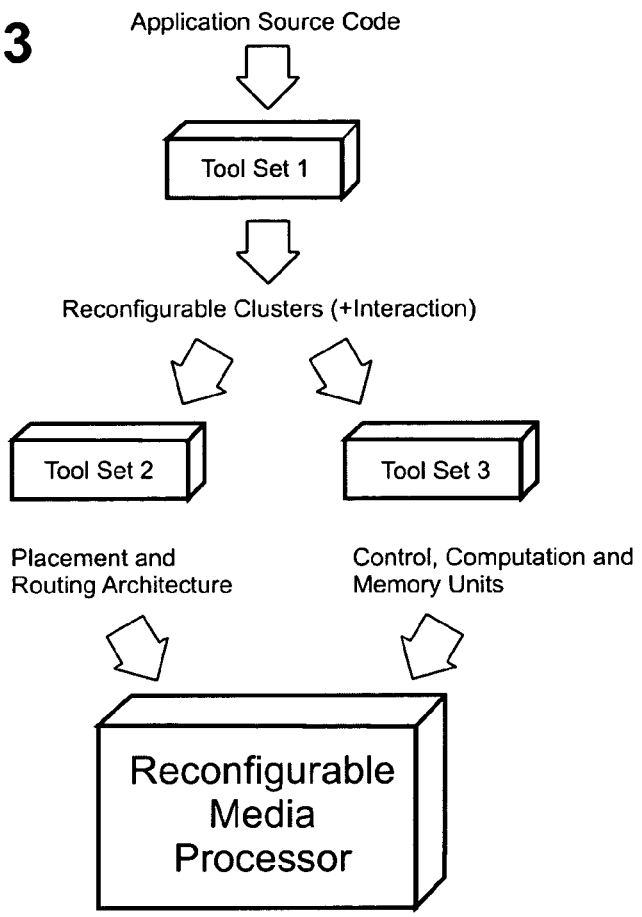
FIG. 33 is a diagrammatic illustration in flow chart form of the configuring of a reconfigurable media processor in accordance with the invention.
Figure 34:
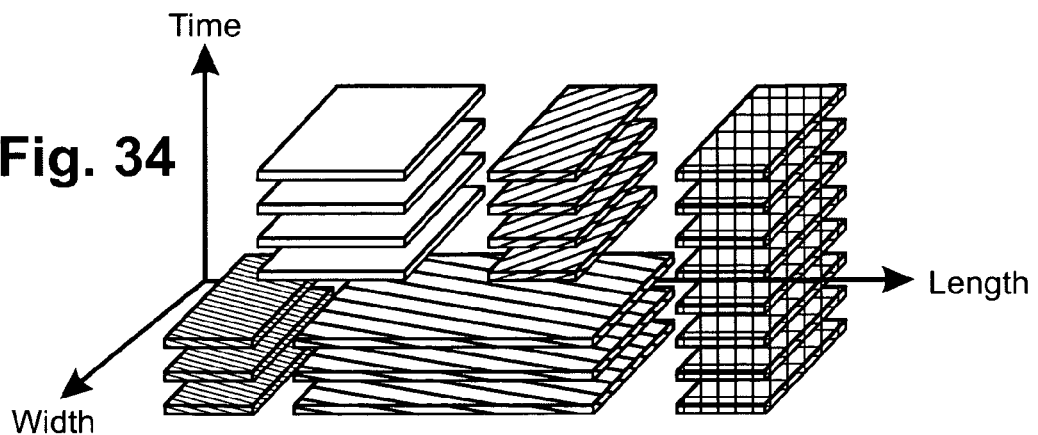
FIG. 34 is a three dimensional graphical illustration of spatial and temporal constraints on the configuration of the processor of FIG. 33.

One aspect of the present invention aids the design, the circuitry or architecture of a dynamically reconfigurable processor through the use of a set of analysis and design tools. These will help hardware and system designers arrive at optimal hardware software co-designs for applications of a given class, moderately complex programmed applications such as multimedia applications. The reconfigurable computing devices thus designed are able to adapt the underlying hardware dynamically in response to changes in the input data or processing environment. The methodology for designing a reconfigurable media processor involves hardware-software co-design based on a set of three analysis and design tools [AK02]. The first tool handles cluster recognition, extraction and a probabilistic model for ranking the clusters. The second tool, provides placement rules and feasible routing architecture. The third tool provides rules for data path, control units and memory design based on the clusters and their interaction. With the use of all three tools, it becomes possible to design media (or other) processors that can dynamically adapt at both the hardware and software levels in embedded applications. The input to the first tool is a compiled version of the application source code. Regions of the data flow graph obtained from the source code, which are devoid of branch conditions, are identified as zones. Clusters are identified in the zones, by representing candidate instructions as data points in a multidimensional vector space. Properties of an instruction, such as location in a sequence, number of memory accesses, floating or fixed-point computation etc., constitute the various dimensions. As shown in FIG. 33, clusters obtained from the previous tool, tool set 1, are placed and routed by tool set 2, according to spatial and temporal constraints (FIG. 34). The processor (of the compiler) can be any general purpose embedded computing core such as an ARM core or a MIPS processor These are RISC cores and hence are similar to general purpose machines such as UltraSPARC. The output of the tool is a library of clusters and their interaction. (A cluster comprises of sequential but not necessarily contiguous assembly level instructions). The clusters represent those groups or patterns of instructions that occur frequently and hence qualify for hardware implementation. To maximize the use of reconfigurability amongst clusters, possible parallelism and speculative execution possibilities must be exploited.

Referring to FIG. 33, the methodology for designing a reconfigurable media processor involves hardware-software co-design based on the set of three analysis and design tools [83,84]. The first tool, tool set 1, is the profiling and partitioning step that handles cluster recognition, extraction and a probabilistic model for ranking the clusters. The second tool, tool set 2, provides placement rules and a feasible routing architecture. The third tool, tool set 3, provides rules for task scheduling, data path, control units and memory design based on the clusters and their interaction. Tool set 3 generates all possible execution paths and corresponding scheduling tables for each. Following that it maps the tasks into the reconfigurable area. As a modification, the proposed approach, instead of using compiled version of, for example, the MPEG4 decoder source code, intermediate three-address code is generated from the high level C code. Machine independence and control flow information are still kept as is with this approach. Partitioning tool analyzes the intermediate code and extracts the control-data flow graph (CDFG). Each bulk of pure data dependent code in between the control structures is defined as a zone. Then the partitioning tool runs a longest common subsequence type of algorithm to find the recurring patterns between potential zones to run on hardware. Building blocks represent those groups or patterns of instructions that occur frequently and hence qualify for hardware implementation. By pattern one means a building block that consists of a control flow structure. A pattern may also include a group of building blocks that are only data dependent. Control structure may be a combination of if-else and loop statements with nested cases. Output of the partitioning tool is a library of building blocks and their interaction. Interaction information includes how many times two building blocks exchange data and size of the data exchanged. The tool also provides number of clock cycles required to execute each building block. In addition, input output pins and area information for each building block are provided. With this information an interconnection pattern can be determined prior to execution. That helps to exploit the locality to thereby simplify the interconnection structure and reduce the usage of global buses, fan-ins and fan-outs. The placement tool places the building blocks that are exchanging data more frequently close together. Clusters obtained from tool set 1 are placed and routed by tool set 2 in FIG. 33, according to spatial and temporal constraints as diagrammatically illustrated in FIG. 34. To maximize the use of reconfigurability amongst clusters, possible parallelism and speculative execution possibilities are exploited.

Heterogeneous Hierarchical Architecture

Figure 35:
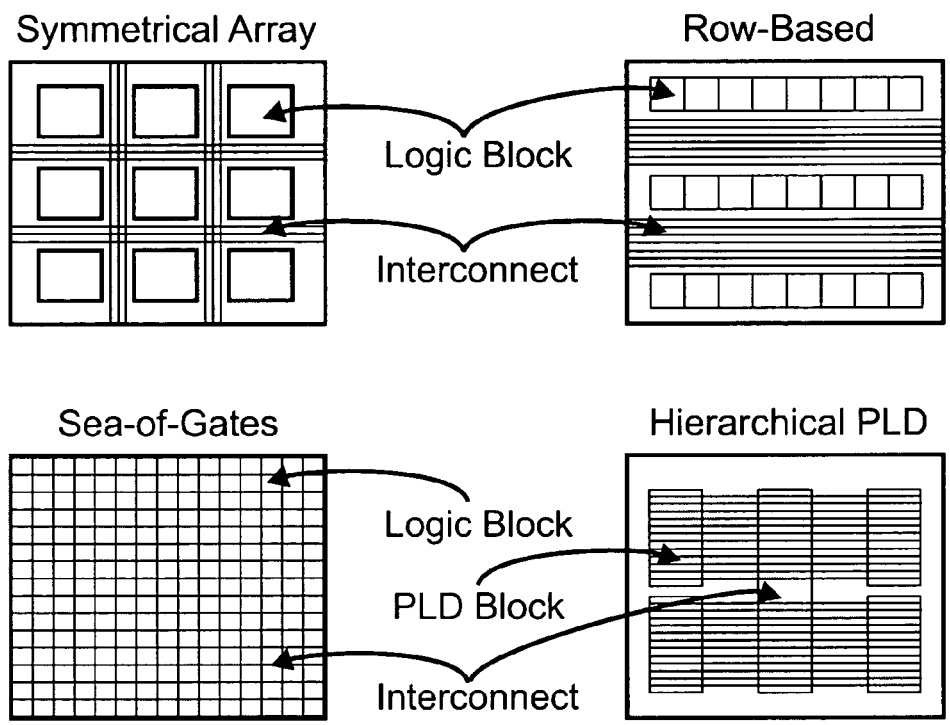
FIG. 35 is graphical comparative illustration for four programmable gate arrays.

Aggarwal [85] says that hierarchical FPGAs (H-FPGAs) (FIG. 35) can implement circuits with fewer routing switches in total compared to symmetrical FPGAs. According to Li [86], for H-FPGAs the amount of routing resources required is greatly reduced while maintaining a good routability. It has been proved that the total number of switches in an H-FPGA is less than in a conventional FPGA under equivalent routability [87]. Having fewer switches to route a net in H-FPGAs reduces the total capacitance of the network. Therefore it can implement much faster logic with much less routing resources compared to standard FPGA. H-FPGAs also offer advantages of more predictable routing with lower delays. Hence the density of H-FPGAs can be higher than conventional FPGAs. In the case of the present invention, compared to hierarchical and symmetrical FPGA approaches, building blocks are of variable size. Classical horizontal, vertical channel will not result in an area efficient solution Consistent channel capacity at each hierarchy level will not work because of the variable traffic between the building blocks even at the same hierarchy. Due to variable traffic among clusters and non-symmetric characteristics, different types of switches are needed at each hierarchy level. All these factors result in heterogeneity between groups of building blocks at the same hierarchy level as opposed to classical H-FPGA approach. Therefore a heterogeneous hierarchical routing architecture that makes use of the communication characteristics is essential to implement power and time efficient solution.

Proposed Architecture

The network scheduler, building blocks, switches and wires form the reconfigurable unit of present invention. A profiling and partitioning tool lists building blocks such as $B=\{B_1, B_2, B_k\}$ where $B_i \in B$. Based on data dependency between the building blocks, disjoint subsets of B are grouped together to form clusters. A building block should appear only in one cluster.

Figure 36:
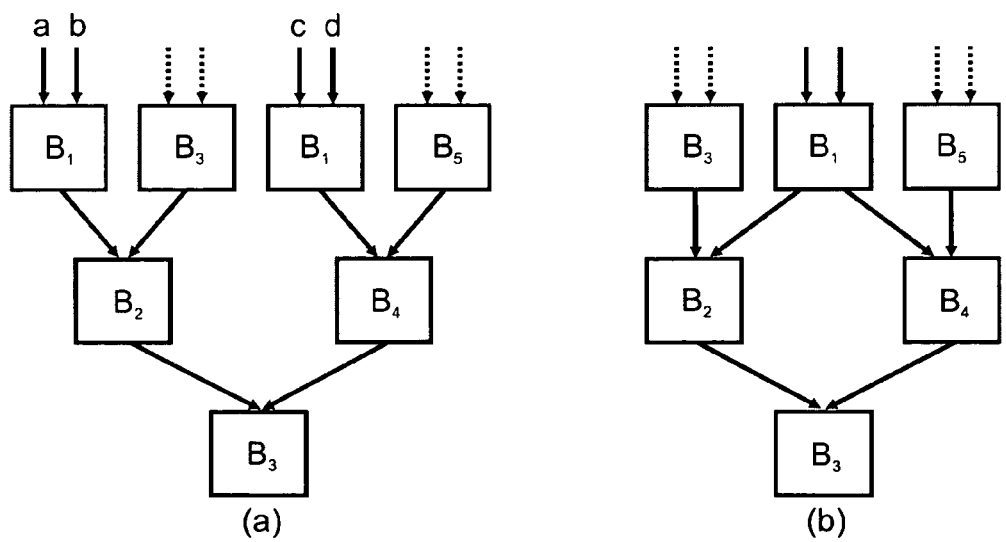
FIGS. 36 A and B are comparative block diagram illustrations of alternative building block arrangements using multiple A and singular B building blocks to form clusters.

In FIG. 36 A, at time $t=t_i$, $B_1$ receives (a,b) and (c,d) from memory. If multiple copies of $B_1$ are available, then without a resource conflict both will run at the same time. However that would work against the definition of a reconfigurable solution. In second scenario (FIG. 36 B), $B_1$ processes data of the most critical path first, (B3 B2 or B5 B4) while the second path is waiting. For such resource or scheduling conflicts we introduce network scheduler module, which is a controller unit over the reconfigurable area. Handling dynamic reconfiguration and context switching are the major tasks of this unit. Most critical path is initially loaded into network scheduler. At run time, if a path that is not on the critical path needs to be executed, it is the network scheduler's job to do context switching and loading the schedule for that new path. The network scheduler offers control mechanism over data transmission between building blocks as well. Buffering is needed when receiver needs to process bulks of data at a time. For a given context if consumer demands data in a block manner then the receiver should rearrange the incoming data format. Both sender and receiver should be context aware. Buffers are only kept at the receiver side. A producer simply dumps the data to the bus as soon as it is available. The receiver should be aware of the context of each request and make a decision based on the priority in order to prevent collision. If the receiver needs to get data from more than one sender, then those senders, which are in the ok list, are allowed to transmit data whereas other requests should be denied. This is again handled by the collusion prevention mechanism. The connection service mechanism brings a control overhead cost however it provides controlled router service, efficient resource usage and parallelism.

Figure 37:
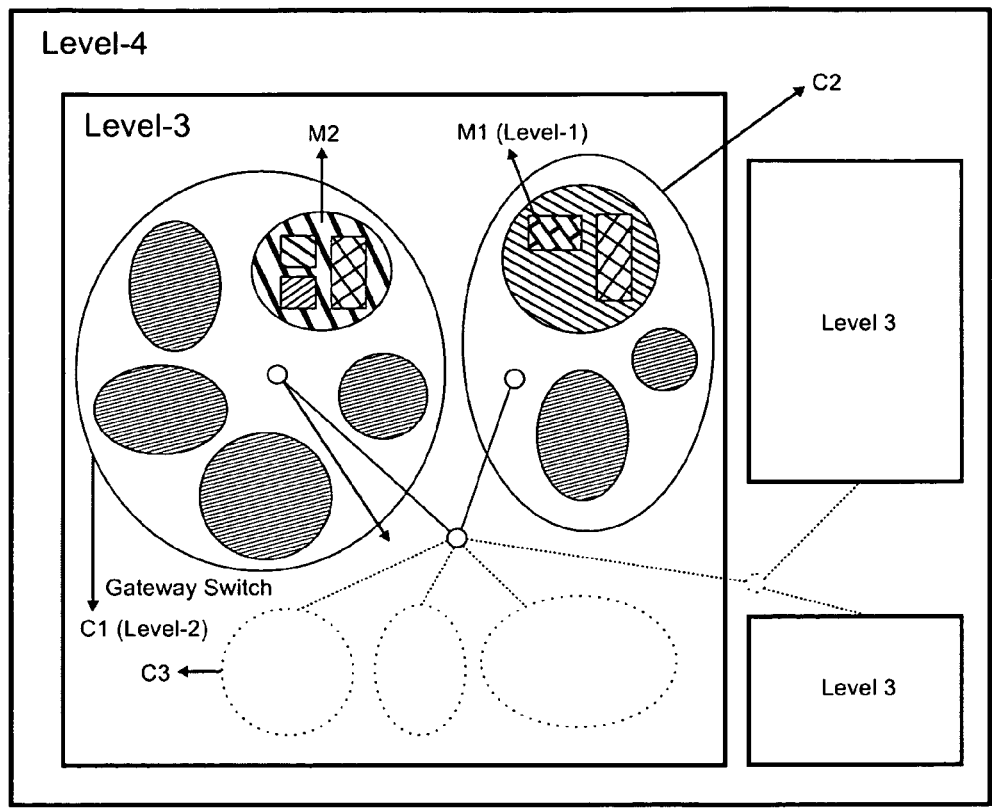
FIG. 37 is a diagrammatic illustration of clusters of building blocks forming modules in the architecture of a reconfigurable processor.
Figure 38:
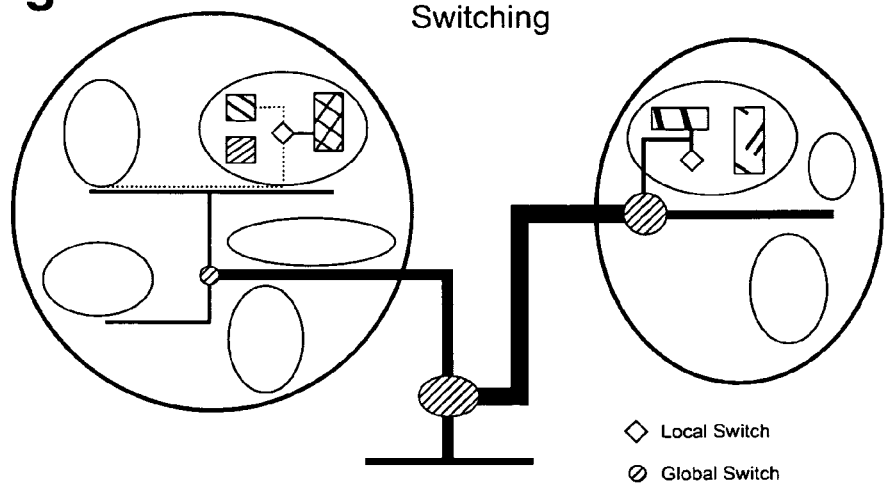
FIG. 38 is a diagrammatic illustration of a destination block to which data is switched via a global gateway switch from a local global bus.

As shown in FIG. 37, clusters of building blocks form level-1 (M) modules. Similarly clusters of M modules form level-2 (C) modules. One defines two types of switches: local (LS) and gateway switches (GS). Local switches function within level-1 and level-2 modules. Gateway switches allow moving from one hierarchy level to another. Depending on the place of LS or GS, there may be multiple LSs needed for LS to LS connections. Connection between the building blocks of the same level-2 module is handled through only local switches. For all other connections gateway switches distribute the traffic as shown in FIG. 38. Building block uses local global bus to connect to gateway switch of the module that building block belongs to. Bus capacity and gateway switch complexity increase as the hierarchy increases and switches are variable in flexibility even at the same hierarchy level.

Level-1 blocks use local global bus to connect to the gateway switch of the cluster that the building block belongs to. If a block in module 2 of cluster 1 sends data to a block in module 1 of cluster 2, data goes through the global buses only following Source Block, GS in C1, GS in Level 3, GS in C2 and finally reaching the Destination Block FIG. 38. Dashed lines represent the local connection through local switches.

Methodology

Figure 39:
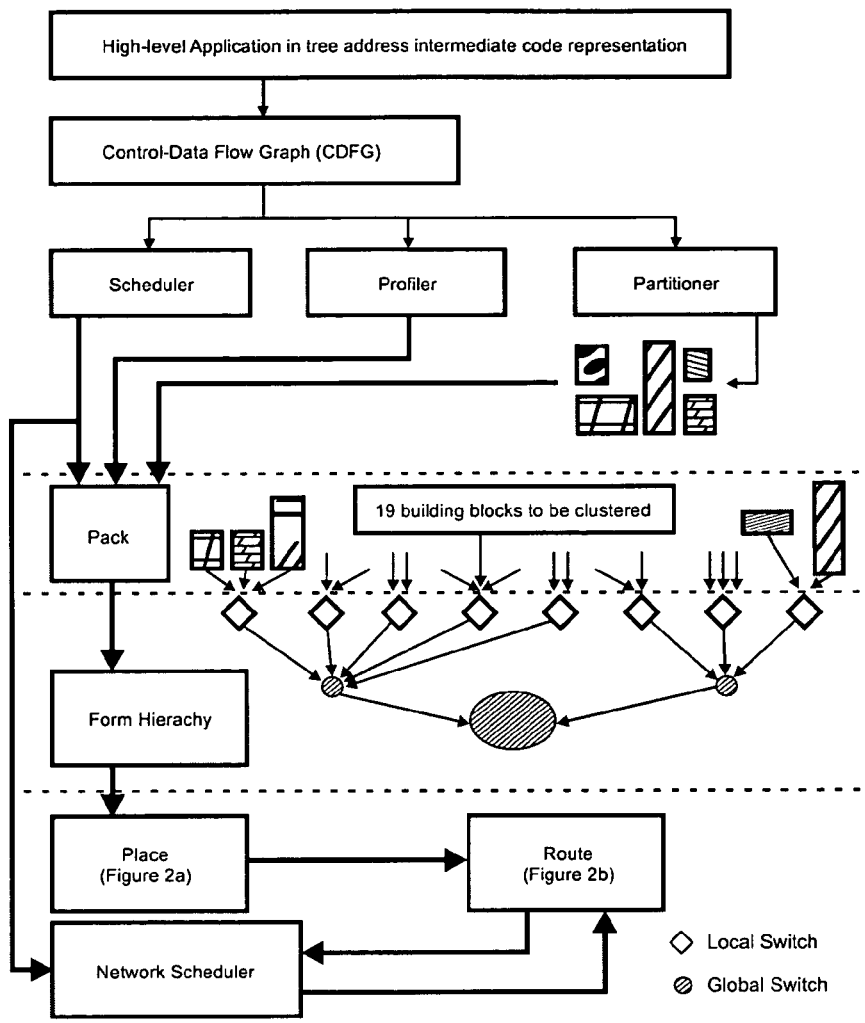
FIG. 39 is a block diagram in the form of a flow chart illustrating the methodology of the invention in configuring a reconfigurable processor.

As indicated in FIG. 39, the methodology in accordance with this invention, involves implementation of packing, hierarchy formation, placement, network scheduling and routing tools. New cost function metrics are generated for the routability driven packing algorithm. The cost function takes into account each possible execution path of the application obtained from a given CDFG, library of variable size building blocks, building block timing and dependency analysis. The cost function will simplify the complexity of the placement and routing steps since constraints of these steps are evaluated as early as at the packing step.

Packing

Several time or area driven packing with bottom-up or top-down approaches have been proposed. As shown in FIG. 39, the present methodology is a bottom-up approach. In Lookup Table (LUT) based, or building block based reconfigurable solutions, increasing the complexity of the processing element increases functionality and hence decreases the total number of logic blocks used by the application and the number of logic blocks on the critical path. For a fine-grained approach, more logic blocks will be required to implement the circuit. The routing area then may become excessive. In coarse-grained logic, much of the logic functionality may be unused wasting area. There is a tradeoff between the complexity of logic blocks and area efficiency. A cost function is needed to make the decision of inserting a building into one of the candidate clusters. [93] uses a sequential packing algorithm with a cost function depending on the number of intersecting nets between a candidate cluster and building block. As a modification to this approach [94] uses time driven packing that has the objective of minimizing the connection between the clusters on critical path. Building blocks are packed sequentially along the critical path. [95] and [96] are routability driven packing approaches that incorporate routability metric such as density of high fan out nets, traffic in and out of the logic block, number of nets and connectivity into packing cost function. All of these approaches are based on fixed K input LUT and N number of LUTs in a cluster. In addition to having variable size building blocks, the present approach takes into account the control data flow graph of each possible execution path to be handled by the reconfigurable unit.

Figure 40A:
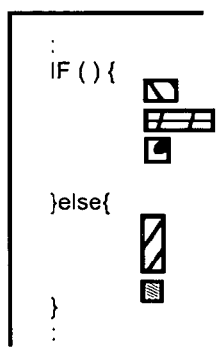
FIGS. 40 A and B are diagrammatic illustrations of the scheduling of an if else statement from the building blocks configured in FIG. 39.
Figure 40B:
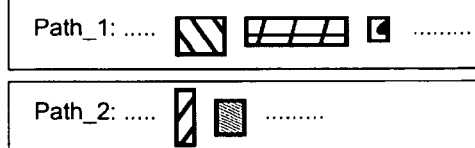

For an if-else statement, at compile time one doesn't know if or the else part of the statement will be executed. Similarly one may not know how many times a loop will execute. Packing of building blocks should be in favor of all possible execution paths. Given that configuration is based on the if part of a control statement, when else part of the path is to be executed, the network scheduler should do least amount of reconfigurations. FIG. 40A shows a simple if-else statement with building blocks inside the control structure. As shown in FIG. 40B, since two paths can't execute at the same time, a clustering tool groups the building blocks that are within the same statement (if or else). If building block that is appearing in the else part happens to occur on the path of Path_1 then the network scheduler handles the connection between the two clusters through global switches. Since the architecture needs to reconfigure at run time, the present approach prioritizes time over the area constraint. Possible waste of area during clustering because of irregular building block or irregular cluster shapes at higher hierarchy level is ignored as long as the time constraint is satisfied. In addition to the metrics defined in [91, 92], the present invention incorporates the scheduling information into its cost function. Cost of adding a building block into a cluster depends on how timing of the circuit is affected at different possible execution paths. At the packing step the tasks of placement and routing are simplified. A set of building blocks, a CDFG for each possible execution scenario, the input, output pins of each building block, the number of cycles required by each building block, the scheduling information for all possible execution scenarios are used by the packing tool. The inventors have encountered no work that has been done on packing variable size building blocks into variable size clusters using CDFG, execution path and scheduling analysis information.

The packing tool groups the building blocks into level-1 type clusters. Then those clusters are grouped together to form level-two and higher levels. At each hierarchy level, existing clusters and their interaction information are used to form higher-level clusters one step at a time. As seen in the example, in the hierarchy formation step (FIG. 39), the process continues recursively until level-three is reached.

Placement

For a level-one cluster, let n be the number of building blocks, $C_{ij}$ be the number of occurrences of a direct link between building blocks $B_i$ and $B_j$; $D_{ij}$ be the amount of data traffic in terms of number of bits transferred between the blocks $B_i$ and $B_j$ through direct links where $1 \leq i \leq n, 1 \leq j \leq n$. Then cost of data exchange between the two library modules $B_i$ and $B_j$ is defined as:

$$Cost_{ij} = C_{ij} \times D_{ij}$$

Pre-Placement: building blocks are virtually placed on a grid style to specify if a block should be placed to north, south, east or west of another block. This is established by using the dependency information. Then placement algorithm uses modified simulated annealing method by incorporating the orientation information obtained in this step, which helps making intelligent placement decisions. The objective of pre-placement is to place the pairs of building blocks that have the most costly data exchange closest to each other. As the cost of the link decreases the algorithm tolerates to have a Manhattan distance of more than one hop between the pairs of building blocks. This phase guarantees area allocation improvement because building blocks are placed based on their dependency leading to usage of less number of switches or shorter wires to establish a connection between them. Integer programming technique is used to make the decision of the orientation of the building blocks with respect to each other. Given that there are n numbers of building blocks, in the worst-case scenario, if the blocks are placed diagonally on a grid (assuming that each block is unit size of one) then the placement is done on an n×n matrix. Let $P_i(x,y)$ denote the (x,y) coordinates of the building block $B_i$ and no other building block have the same (x,y) coordinates. The objective function is:

$$\min\left(\sum_{i=1}^{n} \sum_{j=i+1}^{n} f(x, y)\right) \text{ Where}$$

$$f(x, y) = (|P_i(x) - P_j(x)| + |P_i(y) - P_j(y)| \times Cost_{ij}).$$

FIG. 41A shows the cost matrix of given six blocks (A, B, C, D, E, F). Those six nodes are treated as points to be placed on a 6×6 matrix. The output of pre-placement is shown in FIG. 41B.

Since scheduling, CDFG and timing constraints have already been incorporated in the packing algorithm, the placement problem is made simpler. After completing virtual placement for each level-one cluster, the same process continues recursively for level-two and higher levels of clusters.

Implementation Results:
Target Device: x2s200e
Mapper Version: spartan2e—$Revision: 1.16 $

| 1 Resource | 2 Bits |
|---|---|
| 1) Configuration file size | 1,442,016 |
| 2) Block RAM bits | 57,344 |
| 3) bits used for logic | 1,384,672 |
|  | (1-2) |
| Bits/Slice | ~588 |

| Resource | Bits |
|---|---|
| Configuration Storage | |
| 588 bits/slice * 4 gates/bit Behavior | 2352 |
| 588 bits/slice * 1 gate/bit | 588 |
| Total gates/slice | 2940 |

The Common Part of the Affine-Perspective Loop/Pre-Loop:
Total number of slices used=893/1590 slices
Number of bits=893/1590 slices×588 bits/slice
=525,084/1,419,870 bits of configuration
Number of gates=2940 gates/slice*893/1590 slices
=2,625,420/4,674,600
Number of equivalent gates (ASIC) as given by Xilinx map report=23,760/32,548
(Actual gate counts are accepted to be exaggerated by a factor of 5 by Xilinx)
Therefore a better estimate of the equivalent gate count=4752/6509
Configuration:
Configuration speed for Xilinx Spartan 2E chip=400 Mb per sec (approx.)
Time to configure pre-loop bits=3.549 ms (1,419,870 divided by 400 Mb per sec)
Time to configure loop bits=1.312 ms (525,084 divided by 400 Mb per sec) . . . (A)
Max. Clock frequency for loop/pre-loop=58.727/52.059 Mhz
  Clock period=17.028/19.2089 ns . . . (B)
Therefore number of clocks saved in using ASIC for the loop=A divided by B
  =77,000 clock cycles (approx.)
Therefore number of clocks saved in using ASIC for the pre-loop=A divide by B
  =184,000 clock cycles (approx.)

A Control Data Flow Graph consists of both data flow and control flow portions. In compiler terminology, all regions in a code that lie in between branch points are referred to as "basic blocks." Those basic blocks which have additional code due to code movement, shall be referred to these as zones because. Also under certain conditions, decision making control points can be integrated into the basic block regions. These blocks should be explored for any type of data level parallelism they have to offer. Therefore for simplicity in the following description, basic blocks are referred to as zones. The methodology remains the same when modified basic blocks and abstract structures such as nested loops and hammock structures etc. are considered as zones.

High level ANSI C code of the target application is first converted to an assembly code (UltraSPARC). Since the programming style is user dependent, the assembly code needs to be expanded in terms of all functions calls. To handle the expanded code, a suitable data structure that has a low memory footprint is utilized. Assembly instructions that act as delimiters to zones must then be identified. The data structure is then modified to lend itself to a more convenient form for extracting zone level parallelism.

The following are the steps involved in extracting zone level parallelism.

Step-1: Parsing the Assembly Files

In this step for each assembly (.s) file a doubly linked list is created where each node stores one instruction with operands and each node has pointers to the previous and next instructions in the assembly code. Parser ignores all commented out lines, lines without instructions except the labels such as
  Main:
  .LL3:

Each label starting with .LL is replaced with a unique number (unique over all functions)

Step-2: Expansion

Each assembly file that has been parsed is stored in a separate linked list. In this step the expander moves through the nodes of linked list that stores main.s. If a function call is detected that function is searched through all linked lists. When it is found, that function from the beginning to the end, is copied and inserted into the place where it is called. Then the expander continues moving through the nodes from where it stopped. Expansion continues until the end of main.s is reached. Note that if an inserted function is also calling some other function expander also expands it until every called function is inserted to the right place. In the sample code of Appendix A, main( ) function is calling the findsum( ) function twice and findsum( ) function is calling the findsub( ) function. Shown in Appendix C is the expanded code after considering individual assembly codes of Appendix B.

Step-3: Create Control Flow Linked List

Figure 43:
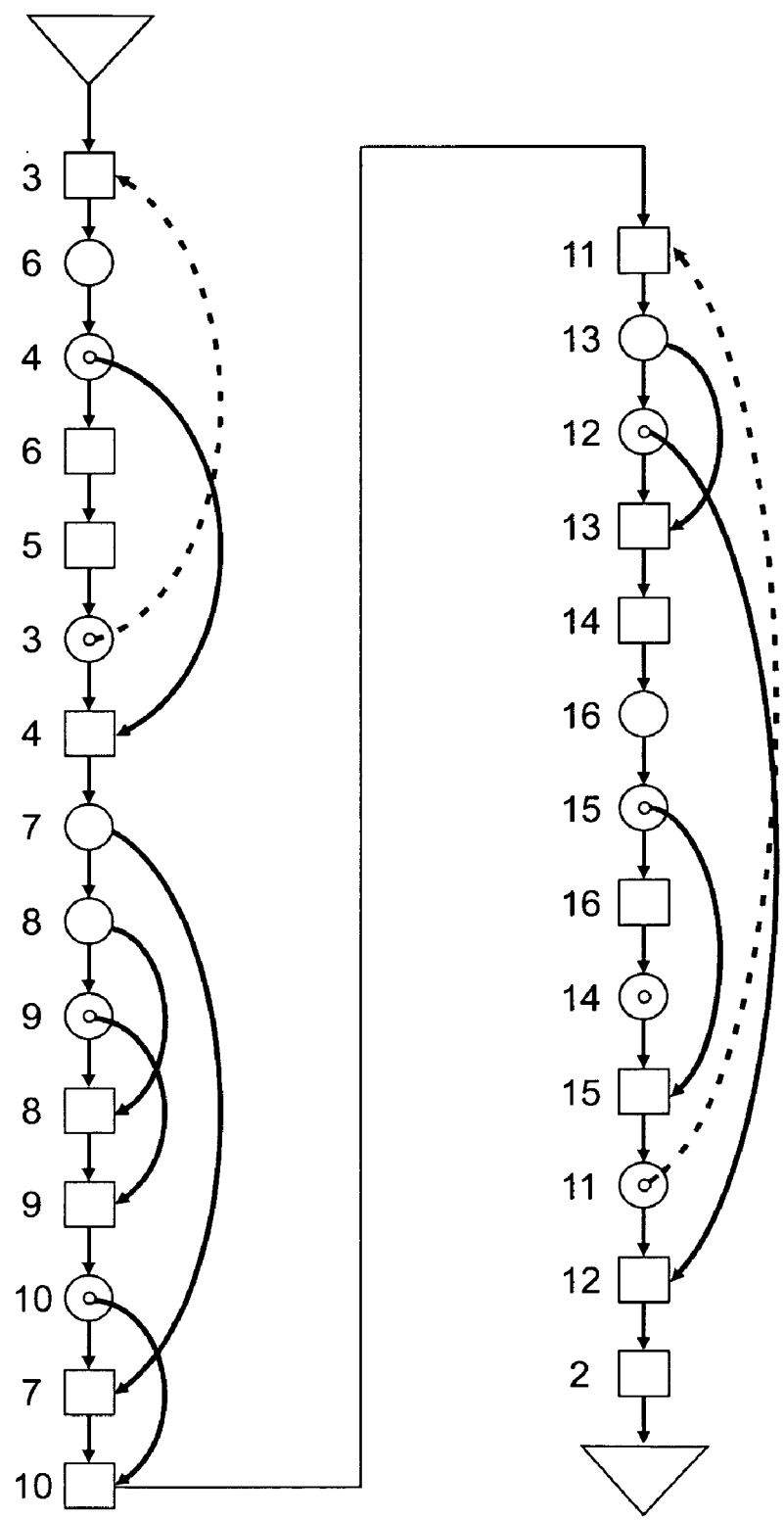
FIG. 43 is a control flow linked list that contains control flow information.

Once the main.s function has been expanded and stored in a doubly linked list, the next step is to create another doubly linked list, the control flow linked list, FIG. 43, that stores the control flow information. This will be used to analyze the control flow structure of the application code, to detect the starting and ending points of functions and control structures (loops, if . . . else statements, etc.).

As the expanded linked list is scanned, nodes are checked if they belong to a:
  Label or
  Function or
  Conditional or
  unconditional branch
In which case, a new node is created to be appended to the control flow linked list by setting the member pointers as defined below.
  If the current node is a
  function label
  A pointer to the expanded list pointing to the function label node
  A pointer to the expanded list pointing to the beginning of the function (the next node of the function label node)
  A pointer to the expanded list pointing to the end of the function
  And node type is set to "function".
  label
  A pointer to the expanded list pointing to the function label node
  A pointer to the expanded list pointing to the beginning of the label (the next node of the label node)
  And node type is set to "square".
  unconditional branch (b)
  A pointer to the expanded list pointing to the branch node A pointer to the control flow linked list pointing to the node that stores the matching target label of the branch instruction.

And node type is set to "dot"

conditional branch (bne, ble, bge, . . . etc)

A pointer to the expanded list pointing to the branch node

A pointer to the control flow linked list pointing to the node that stores the matching target label of the branch instruction.

And node type is set to "circle".

The control flow linked list output for the findsum.s function is shown in Appendix C.

Step 4: Modification of Control Structure

The control structure linked list (which essentially represents the control flow graph of the candidate algorithm) is then modified as follows.

The pointers from unconditional branch nodes (also called "dot" nodes) to the next node in the list need to be disconnected and made NULL. Hence for the "dot" node:

node→next=NULL for the following node:

node→previous=NULL

{Exception: if the next node of the "dot" node is itself the target node!}

The target nodes of the unconditional branches need to be marked as "Possible Exit" nodes. These "Exit" classes of nodes are a subset of the regular "Target" or "Square" nodes.

If unconditional branch node's rank is higher than target node's rank (indicating a feed back or loop), disconnect the link and mark as NULL.

Hence for the "dot" node:

node→to_target=NULL

But before disconnecting, mark target→next (which should be a circle) as "loop node".

In a special case, if an unconditional branch and a square share the same node, then the target of that unconditional branch is declared as an exit square with a loop type (because, instructions following this square, comprise the meat of the do-while loop). This exit square, will not have its next→pointing to a circle. The circle is accessed through the dot node using the previous→pointer. Then it is marked off as type loop.

If a "Possible Exit" node has 2 valid input pointers, and rank of both source pointers is lesser than the node in consideration, then it is an "Exit" node and, disconnect the link to the corresponding "dot" node, and hence also mark that "dot" node's target pointer to NULL. In other words, if the node→previous pointer of the "square/target" node of the "dot" node does not point to the "dot" node, then it has 2 valid pointers.

Hence for the "dot" node:

node→to_target=NULL

Figure 44:
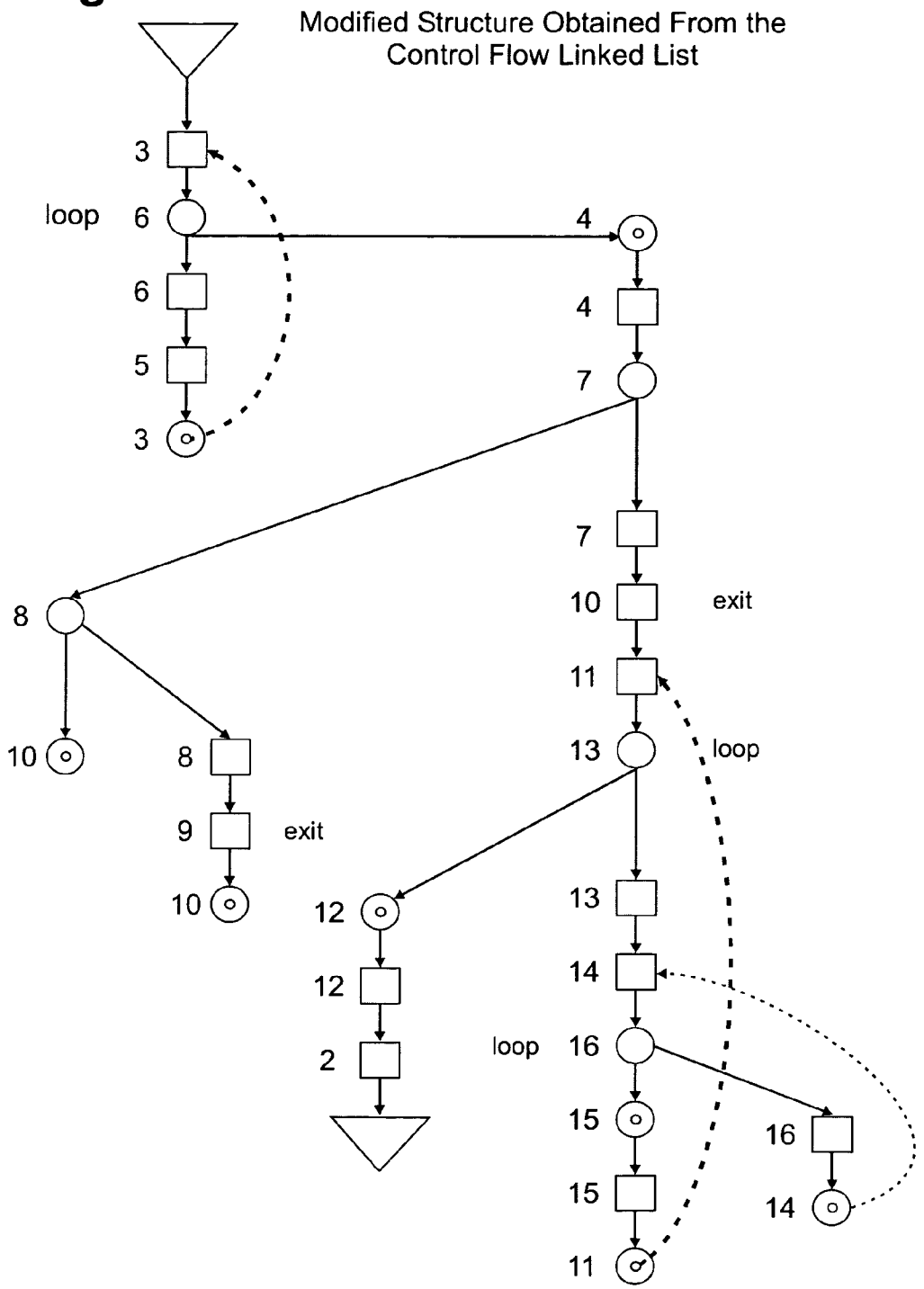
FIG. 44 is an illustration of a modified structure obtained from the control flow linked list of FIG. 43.

A sample high level code is given below, following which is the expanded assembly file. The control flow linked list is as shown in FIG. 43. After modifications to this linked list a structure as indicated in FIG. 44 is obtained. The sample high level code:

```
#include<stdio.h>
void main( )
{
int i=0,j=0,k=0,l=0,m=0,n=0,p=0,r=0;
    for(i=1;i<10;i++)
    {
      p = p - 8;
      p = p* 7;
    }
    i = i+ 1;
    if(i==j)
    {
      n = 9;
      if (k>0)
      {
        p = 19;
      }
      else
      {
        r = 23;
      }
      n= 17 + 8;
    }
    else
    {
      l = 10;
      m = n +r;
    }
    k = k −14;
    k = 7 − 8 * p;
    while(i<p)
    {
      p = p * 20;
      p = p − 7;
      while(k == 8)
      {
        p = p+ 17;
        i = i * p;
      }
      p= p − 23;
    }
    m = m +5;
    n = n +4;
  }
}
```

The expanded assembly file, the gcc (version 2.95.2) compiled code for the UltraSPARC architecture with node labeling is as follows:

```
        .file      "loop_pattern4.c"
gcc2_compiled.:
        .global .umul
.section        ".text"
        .align 4
        .global main
        .type   main,#function
        .proc   020
main:
        !#PROLOGUE# 0
        save    %sp, −144, %sp
        !#PROLOGUE# 1
        st      %g0, [%fp-20]          ground
        st      %g0, [%fp-24]
        st      %g0, [%fp-28]
        st      %g0, [%fp-32]
        st      %g0, [%fp-36]
        st      %g0, [%fp-40]
        st      %g0, [%fp-44]
        st      %g0, [%fp-48]
        mov     1, %o0
        st      %o0, [%fp-20]
.LL3:
        ld      [%fp-20], %o0          square 3
        cmp     %o0, 9
        ble     .LL6                   circle 6
        nop
        b       .LL4                   dot 4
        nop
.LL6:
        ld      [%fp-44], %o0          square 6
        add     %o0, −8, %o1
        st      %o1, [%fp-44]
```

```
            ld      [%fp-44], %o0
            mov     %o0, %o1
            sll     %o1, 3, %o2
            sub     %o2, %o0, %o0
            st      %o0, [%fb-44]
.LL5:
            ld      [%fp-20], %o0           square 5
            add     %o0, 1, %o1
            st      %o1, [%fp-20]
            b       .LL3                    dot 3
            nop
.LL4:
            ld      [%fp-20], %o0           square 4
            add     %o0, 1, %o1
            st      %o1, [%fp-20]
            ld      [%fp-20], %o0
            ld      [%fp-24], %o1
            cmp     %o0, %o1
            bne     .LL7                    circle 7
            nop
            mov     9, %o0
            st      %o0, [%fp-40]
            ld      [%fp-28], %o0
            cmp     %o0, 0
            ble     .LL8                    circle 8
            nop
            mov     19, %o0
            st      %o0, [%fp-44]
            b       .LL9                    dot 9
            nop
.LL8:
            mov     23, %o0                 square 8
            st      %o0, [%fp-48]
.LL9:
            mov     25, %o0                 square 9
            st      %o0, [%fp-40]
            b       .LL10                   dot 10
            nop
.LL7:
            mov     10, %o0                 square 7
            st      %o0, [%fp-32]
            ld      [%fp-40], %o0
            ld      [%fp-48], %o1
            add     %o0, %o1, %o0
            st      %o0, [%fp-36]
.LL10:
            ld      [%fp-28], %o0           square 10
            add     %o0, -14, %o1
            st      %o1, [%fp-28]
            ld      [%fp-44], %o0
            mov     %o0, %o1
            sll     %o1, 3, %o0
            mov     7, %o1
            sub     %o1, %o0, %o0
            st      %o0, [%fb-28]
.LL11:
            ld      [%fp-20], %o0           square 11
            ld      [%fp-44], %o1
            cmp     %o0, %o1
            bl      .LL13                   circle 13
            nop
            b       .LL12                   dot 12
            nop
.LL13:
            ld      [%fp-44], %o0           square 13
            mov     %o0, %o2
            sll     %o2, 2, %o1
            add     %o1, %o0, %o1
            sll     %o1, 2, %o0
            st      %o0, [%fp-44]
            ld      [%fp-44], %o0
            add     %o0, -7, %o1
            st      %o1, [%fp-44]
.LL14:
            ld      [%fp-28], %o0           square 14
            cmp     %o0, 8
            be      .LL16                   circle 16
            nop
            b       .LL15                   dot 15
            nop
.LL16:
            ld      [%fp-44], %o0           square 16
            add     %o0, 17, %o1
            st      %o1, [%fp-44]
            ld      [%fp-20], %o0
            ld      [%fp-44], %o1
            call    .umul, 0
            nop
            st      %o0, [%fp-20]
            b       .LL14                   dot 14
            nop
.LL15:
            ld      [%fp-44], %o0           square 15
            add     %o0, -23, %o1
            st      %o1, [%fp-44]
            b       .LL11                   dot 11
            nop
.LL12:
            ld      [%fp-36], %o0           square 12
            add     %o0, 5, %o1
            st      %o1, [%fp-36]
            ld      [%fp-40], %o0
            add     %o0, 4, %o1
            st      %o1, [%fp-40]
.LL2:
            ret                             square 2
            restore
.LLfe1:
            .size   main,.LLfe1-main
                    .ident "GCC: (GNU) 2.95.2 19991024 (release)"
```

Step 5: Creation of Zones

Figure 45:
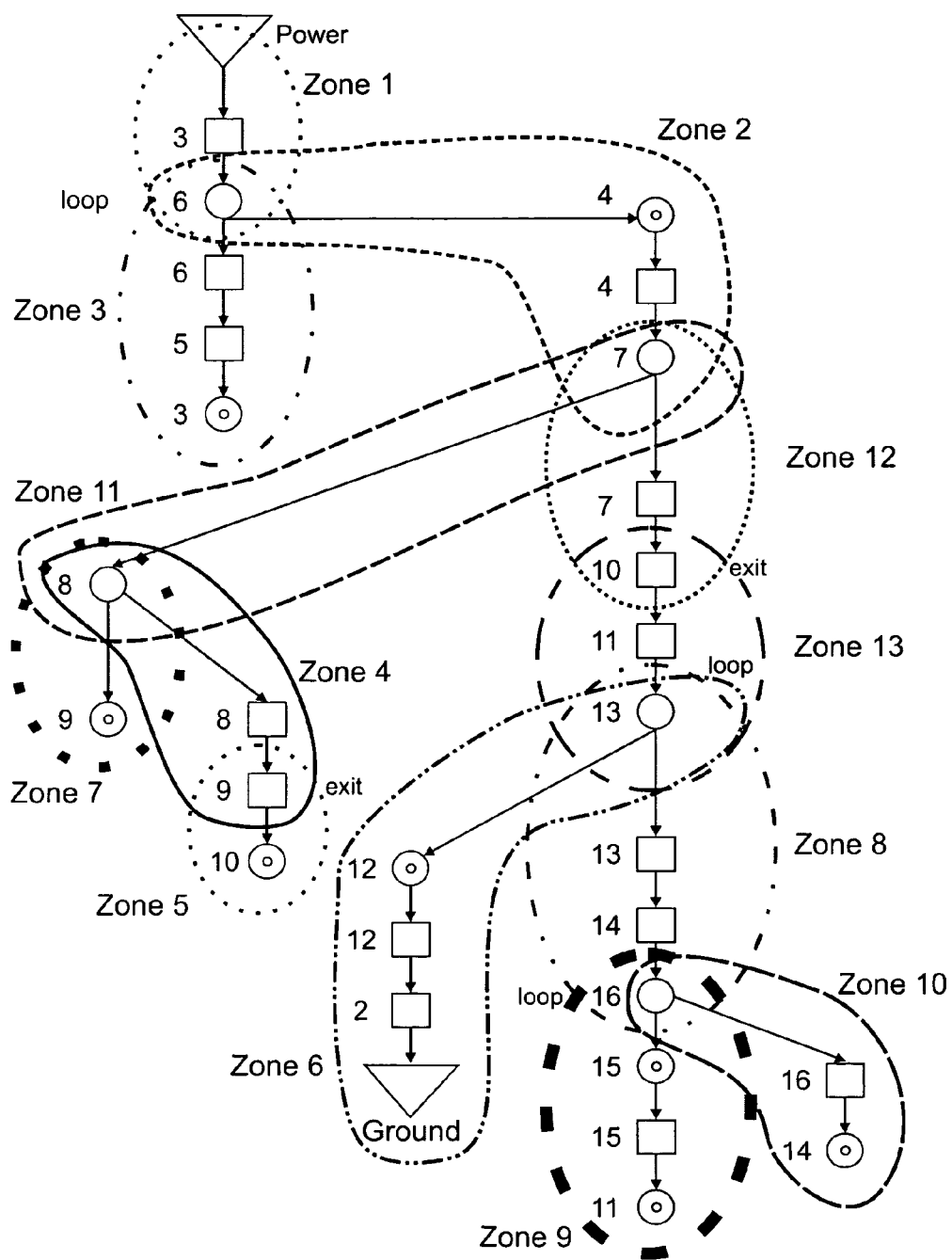
FIG. 45 is an illustration of zones formed in the modified list structure of FIG. 44.

Operation on the modified structure of FIG. 44, in FIG. 45, to extract all possibilities of parallelism and reconfiguration, zones are identified in the modified structure. But to identify such sections, delimiters are needed. A delimiter can be any of the following types of nodes:

(i) Circle
(ii) Dot
(iii) Exit square
(iv) Square
(v) Power
(vi) Ground.

A 'Circle' can indicate the start of a new zone or the end of a zone. A 'Dot' can only indicate the end of a zone or a break in a zone. An 'Exit square' can indicate the start of a new zone or the end of a zone. A 'Square' can only indicate the continuation of a break in the current zone. A 'Power' can only indicate the beginning of the first zone. A 'Ground' can only indicate the end of a zone.

FIG. 45 shows example zones to illustrate the use of delimiters. Three zones, 1, 2, and 3 all share a common node, 'Circle 6'. This node is the end of Zone 1 and the start of zones 2 and 3. Zone 1 has the 'Power' node as its start, while Zone 6 has 'Ground' node as its end. The 'Dot 3' in Zone 3 indicates the end of that zone while 'Dot 4' indicates a break in Zone 2. This break is continued by 'Square 4'. In Zone 4, 'Square 9' indicates the end of the zone while it marks the start of Zone 5.

This function identifies zones in the structure, which is analogous to the numbering system in the chapter page of a book. Zones can have sibling zones (to identify if/else conditions, where in only one of the two possible paths can be taken {Zones 4 and 7 in FIG. 1}) or child zones (to identify nested control structures {Zone 10 being child of zone 8 in FIG. 1}). Zone types can be either simple or loopy in nature (to identify iterative loop structures). The tree is scanned node by node and decisions are taken to start a new zone or end an existing zone at key points such as circles, dots and exit squares. By default, when a circle is visited for the first time, the branch taken path is followed. But this node along with the newly started zone is stored in a queue for a later visit along the branch not taken path. When the structure has been traversed along the "branch taken" paths, the nodes with associated zones are popped out from the stack and traversed along their "branch not taken" paths. This is done till all nodes have been scanned and stack is empty.

The Pseudo code for the process of FIG. 45 is given below:

```
Global variables: pop flag = 0, tree_empty = 0;
Zonise (node) /* input into the function is the current node, a starting node */
{
        while (tree_empty == 0) /* this loop goes on node by node in the tree till all node
                        have been scanned */
        {
        if (node → type = circle)
        {
                if (pop_flag != set) /* pop flag is set when a pop operation is done */
                {
                        /* an entry here means that the circle was encountered for the
first
                           time */
                        /* so set the node→ visited flag */
                        /* close the zone */
                        /* since u r entering a virgin circle, u cant create the new zone
as a
                           sibling to the one u just closed */
                        /* if the zone u just closed, has a valid Anchor Point and if its
of
                           type Loop and if its visited flag is set, then u cannot create a
                           child zone */
                        /* accordingly create a new zone */
                        /* set child as current zone*/
                        /* push this zone and the node into the queue */
                        /* take the taken path for the node, i.e node = node→ taken */
                }
                if (pop_flag = set)
                {
                        /* an entry here means, that we r visiting a node and its
                        associated
                           zone, that have just been popped out form the queue, hence
                           revisiting an old node */
                        /* since this node has its visited flag as set, change that flag
value
                           to −1, so as to avoid any erroneous visit in the future */
                        /* if node is of type Non Loop, then spawn a new sibling zone
*/
                        /* if node is of type Loop, then spawn new zone as laterparent
zone
                           and mark zone type as loop*/
                        /* choose the not taken path for the node */
                }
        }
        else if (node→ type = exit square)
        {
                /* close the zone */
                /* if the closed zone has a parent, i.e zone→ parent pointer is not
NULL,
                   then create a new zone with link to the parent zone as type next zone
*/
                /* if the closed zone does not have a parent, then spawn a new zone
that is
                   next to the closed zone */
                /* choose the not taken path for the node */
        }
        else if (node→ type is dot and node→ taken = NULL)
        {
                /* close zone */
                /* choose node to be considered next by popping out from the queue */
                /* in case the queue is empty, all nodes in tree have been scanned */
                /* set pop flag */
        }
        else if (node→ type = dot and node→ taken != NULL)
        {
                /* this is just a break in the current zone */
                /* create temp stop1 and tempstart1 pointers*/
                /* choose node→ taken path */
        }
        }/* end of the first while loop */
}
```

Once the zones have been identified in the structure, certain relationships can be observed among them. These form the basis of extraction of parallelism at the level of zones. A zone inside a control structure is the 'later child' of the zone outside the structure. Hence the zone outside a control structure and occurring before (in code sequence) the zone inside a control structure is a 'former parent' of the zone present inside. But, the zone outside a control structure and occurring after (in code sequence) the zone inside the structure is referred to as the 'later parent'. Similarly the child in this case would be a 'former child'. A zone occurring after another zone and not related through a control structure is the 'next' of the earlier one. After parsing through the structure thru the zonal relationship as shown in FIG. 46 is obtained.

This is referred to as the 'initial zone structure'. The term initial, is used because, some links need to be created and some existing ones, need to be removed. This process is explained in the section below.

Step 6: Further Modification of the 'Initial Zone Structure'

Some of the relationships that were discussed in the previous step cannot exist with the existing set of links and others are redundant. For example in FIG. 46, we see that Z1 can be connect to Z2 thru 'n'

Z12 can be connected to Z13 thru 'lp'
Z13 can be connected to Z6 thru 'n'
Z8 can be connected to Z9 thru 'n'
Z4 can be connected to Z5 thru 'lp'
Z5 can be connected to Z13 thru 'lp'
Z7 can be connected to Z5 thru 'lp'

But Z8's relationship to Z6 thru 'lp' is false, coz no node can have both 'n' and 'lp' links.

In such a case, the 'lp' link should be removed.

Therefore some rules need to be followed to establish 'n' and 'lp' type links, if they don't exist.

To form an 'n' link:

If a zone (1) has an 'lc' link to zone (2), and if that zone (2) has a 'lp' link to a zone (3), then an 'n' link can be established between 1 and 3. This means that if zone (1) is of type 'loop', then zone (3) will now be classified as type 'loop' also.

To form an 'lp' type links if it doesn't exist:

If a zone (1) has an 'fp' link to zone (2), and if that zone (2) has an 'n' link to a zone (3), then an 'lp' link can be established between 1 and 3

If a zone (1) has an 'lp' link to zone (2), and also has an 'n' link to zone (3), then first, remove the 'lp' link 'to zone (2)' from zone (1) and then, place an 'lp' link from zone (3) to zone (2).

Figure 48:
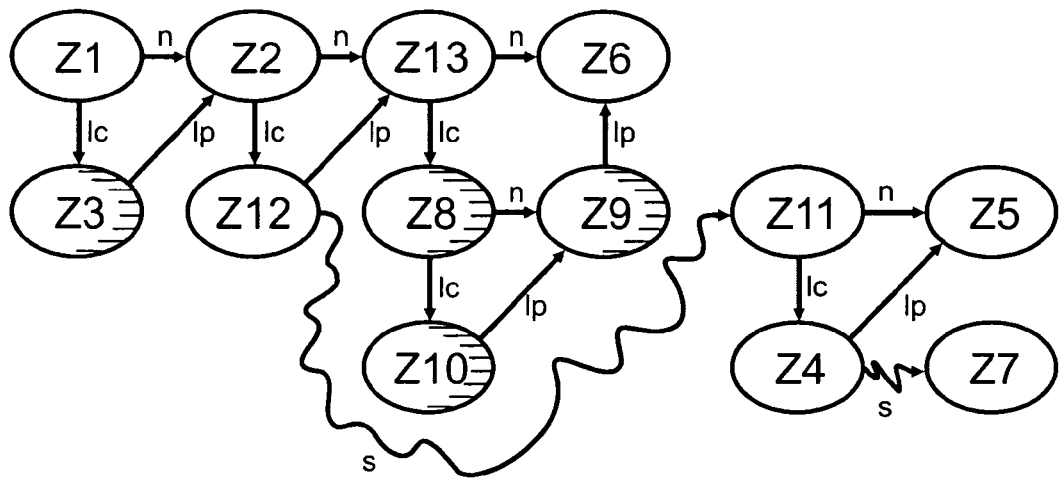
FIG. 48 is a diagrammatic illustration of the zone structure of FIG. 47 with the cancelled links removed.

This provides the 'comprehensive zone structure' as shown in FIG. 47 (with cancelled links) and in FIG. 48 (with all cancelled links removed).

Figure 49:
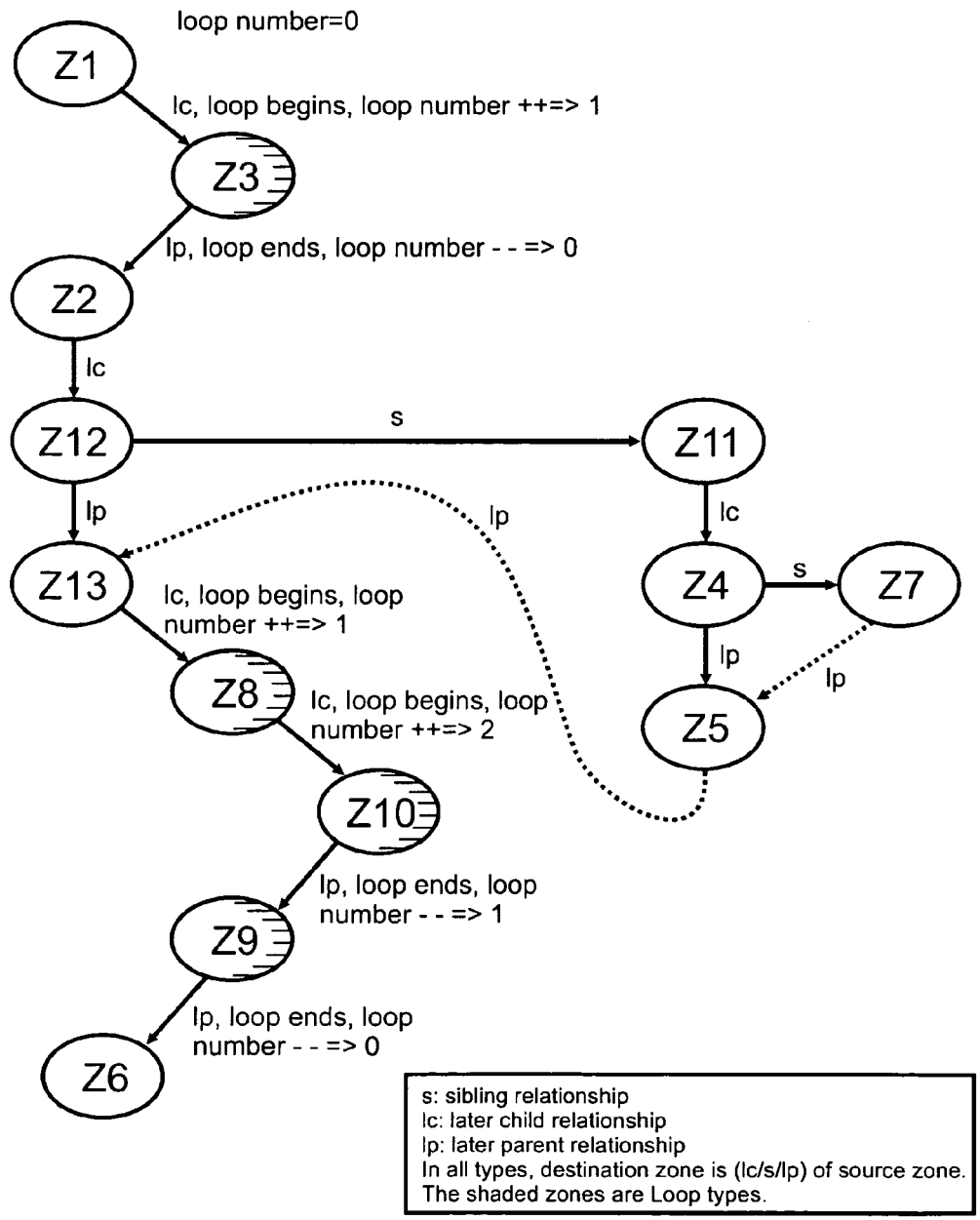
FIG. 49 is a diagrammatic sequential ordering of the zones with annotations.
Figure 39:
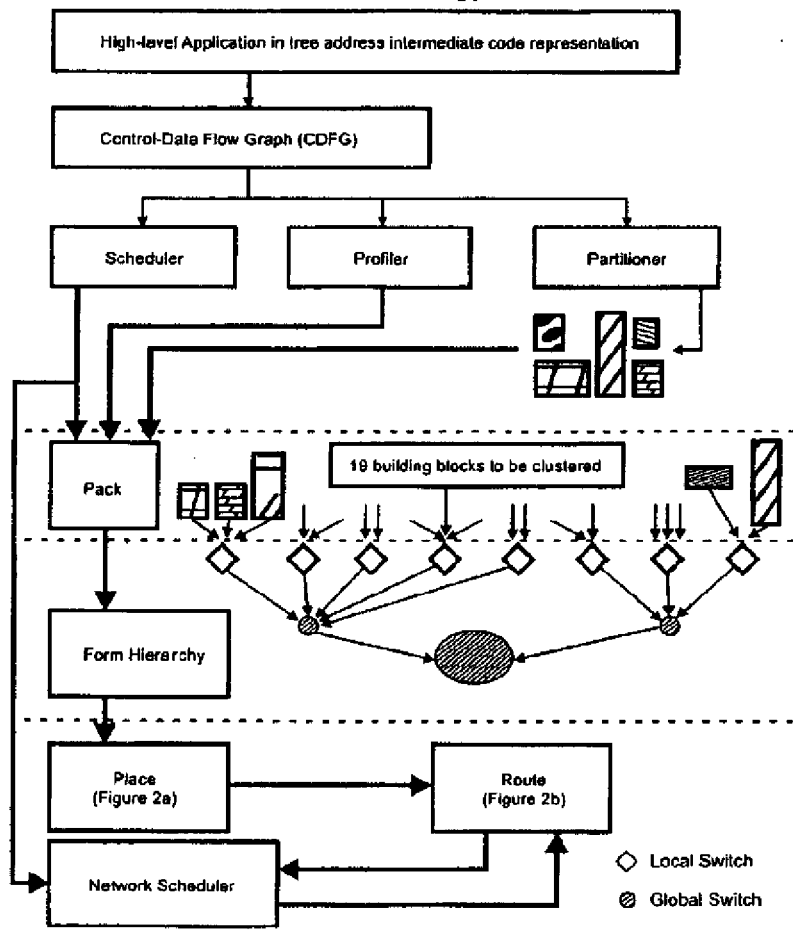
Figure 40A:
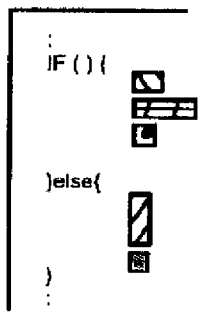
Figure 40B:
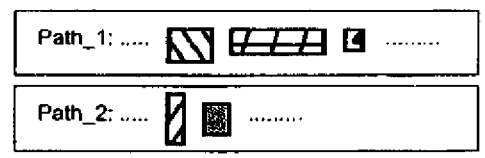

To identify parallelism and hence compulsorily sequential paths of execution, the following approach is adopted. First, the comprehensive zone structure obtained, is ordered sequentially by starting at the first zone and traversing along an 'lc-lp' path. If a Sibling link is encountered it is given a parallel path. The resulting structure is shown in FIG. 49.

To establish parallelism between a zone (1) of loop count A and its upper zone (2) of loop count B, where A<B, check for data dependency between zone 1 and all zones above it up to and including the zone with the same loop count as zone 2.

In the example above, to establish parallelism b/w zone 6 and zone 9, check for dependencies b/w zone 6 and 9, 10, 8. If there is no dependency then zone 6 is parallel to zone 8.

To establish parallelism between a zone (1) of loop count A and its upper zone (2) of loop count B, where A=B, direct dependency check needs to be performed.

To establish parallelism between a zone (1) of loop count A and its upper zone (2) of loop count B, where A>B, direct dependency check needs to be performed. Then, the zone (1) will now have to have an iteration count of (its own iteration count*zone (2)'s iteration count).

When a zone rises like a bubble and is parallel with another zone in the primary path, and reaches a dependency, it is placed in a secondary path. No bubble in the secondary path is subjected to dependency testing.

After a bubble has reached its highest potential, and stays put in a place in the secondary path, the lowest bubble in the primary path is checked for dependency on its upper fellow.

If the upper bubble happens to have a different loop count number, then as described earlier, testing is carried out. In case a parallelism cannot be obtained, then this bubble, is clubbed with the set of bubbles ranging from its upper fellow, till and inclusive of the bubble up the chain with the same loop count as its upper fellow. A global i/o parameter set is created for this new coalition. Now this coalition will attempt to find dependencies with its upper fellow.

The loop count for this coalition will be bounding zone's loop count. Any increase in the iteration count of this coalition will reflect on all zones inside it. In case a bubble wants to rise above another one which has a sibling/reverse sibling link, there will be speculative parallelism.

The algorithm should start at multiple points, one by one. These points can be obtained by starting from the top zone and traversing down, till a sibling split is reached.

Then this zone should be remembered, and one of the paths taken. This procedure is similar to the stack saving scheme used earlier in the zonise function.

Another Pre-processing step is used that loop unrolls every iterative segment of a CDFG that does not have conditional branch instructions inside it and whose iterative count is known at compile time.

Although preferred embodiments of the invention have been described in detail, it will be readily appreciated b those skilled in the art that further modifications, alterations and additions to the invention embodiments disclosed may be made without departure from the spirit and scope of the invention as set forth in the appended claims.

REFERENCES

1. Andre Dehon. "Reconfigurable architectures for general purpose computing," Ph.D Thesis, MIT, 1996.
2. Varghese George and Jan M. Rabaey. "Low-Energy FPGAs—Architecture and Design," Kluwer Academic Publishers.
3. M. Chu, N. Weaver, K. Sulimma, A. DeHon, and J. Wawrzynek. "Object Oriented Circuit-Generators in Java," IEEE Symposium on FPGAs for Custom Computing Machines, April 1998.
4. Ryan Kastner, Seda Ogrenci Memik, Elaheh Bozorgzadeh and Majid Sarrafzadeh. "Instruction Generation for Hybrid Reconfigurable Systems," International Conference on Computer-Aided Design (ICCAD), November, 2001.
5. Philip Brisk, Adam Kaplan, Ryan Kastner and Majid Sarrafzadeh. "Instruction Generation and Regularity Extraction for Reconfigurable Processors," International Conference on Compilers, Architecture and Synthesis for Embedded Systems (CASES), October 2002.
6. W. Lee, R. Barua, D. Srikrishna, J. Babb, V. Sarkar, and S. Amarasinghe. "*Space-Time Scheduling of Instruction-Level Parallelism on a Raw Machine,*" Proc of the Eighth International Conference on Architectural Support for Programming Languages and Operating Systems (ASPLOS), San Jose, Calif., October, 1998.
7. Anant Agarwal, Saman Amarasinghe, Rajeev Barua, Matthew Frank, Walter Lee, Vivek Sarkar, Devabhaktuni Srikrishna and Michael Taylor. *"The Raw Compiler Project,"* Proc of the Second SUIF compiler workshop, Stanford, Calif., Aug. 21-23, 1997.
8. A. DeHon. "The Density Advantage of Configurable Computing," Computer, vol. 33, no. 4, April 2000, pp. 41-49.
9. R. Reed Taylor and Seth Copen Goldstein. "A High-Performance Flexible Architecture for Cryptography," Proc of the Workshop on Cryptographic Hardware and Embedded Systems, 1999.
10. Moreno, J. M, Cabestany, J. et al. "Approaching evolvable hardware to reality: The role of dynamic reconfiguration and virtual meso-structures," Microelectronics for Neural, Fuzzy and Bio-Inspired Systems, 1999.
11. Kiran Kumar Bondalapati. "Modeling and mapping for dynamically reconfigurable hybrid architectures," Ph.D Thesis, USC, 2001.
12. Mirsky, E. DeHon, A. "MATRIX: a reconfigurable computing architecture with configurable instruction distribution and deployable resources," IEEE Symposium on FPGAs for Custom Computing Machines, 1996.
13. Vorbach, M. Becker, J. "Reconfigurable Processor Architectures for Mobile Phones," Proc of International on Parallel and Distributed Processing Symposium, 2003.
14. Ebeling, C. Cronquist et al. "Mapping applications to the RaPiD configurable architecture," The 5th Annual IEEE Symposium on FPGAs for Custom Computing Machines, 1997.
15. Callahan, T. J. Hauser, J. R. Wawrzynek, J. "The Garp architecture and C compiler," IEEE Transactions on computers, 2000.
16. Singh, H. Ming-Hau Lee Guangming Lu Kurdahi, F. J. Bagherzadeh, N. Chaves Filho, E. M. "MorphoSys: an integrated reconfigurable system for data-parallel and computation-intensive applications," IEEE Transactions on computers, 2000.
17. Tsukasa Yamauchi et al. "SOP: A reconfigurable massively parallel system and its control-data-flow based compiling method," IEEE Symposium on FPGAs for Custom Computing Machines, 1996.
18. Scott Hauck et al. "CHIMAERA: a high-performance architecture with a tightly-coupled reconfigurable functional unit," International Conference on Computer Architecture, 2000.
19. P. M. Athanas and H. F. Silverman. "An Adaptive Hardware Machine Architecture for Dynamic Processor Reconfiguration," International Conference on Computer Design, 1991.
20. Peter M. Athanas. "A functional reconfigurable architecture and compiler," Technical Report LEMS-100, Brown University, Division of Engineering, 1992.
21. S. Sawitzki and A. Gratz and R. Spallek. "CoMPARE: A Simple Reconfigurable Processor Architecture Exploiting Instruction Level Parallelism," Proc. of PART, pp. 213-224, Springer-Verlag, 1998.
22. Alan Marshall, Tony Stansfield, Igor Kostarnov, Jean Vuillemin and Brad Hutchings. "A Reconfigurable Arithmetic Array for Multimedia Applications," Proc of the ACM/SIGDA seventh international symposium on Field programmable gate arrays, 1999.
23. E. Sanchez, C. Iseli. "A C++ compiler for FPGA custom execution units synthesis," IEEE Symposium on FPGAs for Custom Computing Machines, 1995.
24. Bernardo Kastrup, Arjan Bink, Jan Hoogerbrugge. "ConCISe: A Compiler-Driven CPLD-Based Instruction Set Accelerator," IEEE Symposium on Field programmable Custom Computing Machines, 1999.
25. Michael Bedford Taylor; Anant Agarwal. "Design Decisions in the Implementation of a Raw Architecture Workstation," MS Thesis, MIT, 1996.
26. Hartenstein, R. Herz, M. Hoffmann, T. Nageldinger, U. "KressArray Xplorer: a new CAD environment to optimize reconfigurable datapath array architectures," Proc of the ASP-DAC Asia and South Pacific Design Automation Conference, 2000.
27. Bittner, R. A., Jr. Athanas, P. M. "Computing kernels implemented with a wormhole RTR CCM," The 5th Annual IEEE Symposium on FPGAs for Custom Computing Machines, 1997.
28. Miyamori, T. Olukotun, U. "A quantitative analysis of reconfigurable coprocessors for multimedia applications," IEEE Symposium on FPGAs for Custom Computing Machines, 1998.
29. Becker, J. Pionteck, T. Habermann, C. Glesner, M. "Design and implementation of a coarse-grained dynamically reconfigurable hardware architecture," IEEE Computer Society Workshop on VLSI, 2001.
30. www.broadcom.com
31. George, V. Hui Zhang Rabaey, J. "The design of a low energy FPGA," International Symposium on Low Power Electronics and Design, 1999.
32. Chen, D. C. Rabaey, J. M. "A reconfigurable multiprocessor IC for rapid prototyping of algorithmic-specific high-speed DSP data paths," IEEE Journal of Solid-State Circuits, 1992.
33. Marlene Wan; Jan Rabaey et al. "Design Methodology of a Low-Energy Reconfigurable Single-Chip DSP System," Journal of VLSI Signal Processing, 2000.
34. Campi, F. Cappelli, A. et al. "A reconfigurable processor architecture and software development environment for embedded systems," International Parallel and Distributed Processing Symposium, 2003.
35. Jack Liu, Fred Chow, Timothy Kong, and Rupan Roy. "Variable Instruction Set Architecture and Its Compiler Support," IEEE Transactions on computers, 2003.
36. Marco Jacobs, Ivan Greenberg and Mike Strauss. "BOPS: Conquering the Geometry Pipeline," Game Developers Conference. Mar. 22-26, 2004, San Jose. Calif.
37. Brian Schoner, Chris Jones and John Villasenor. *"Issues in Wireless Video Coding using Run-time-reconfigurable FPGAs."* Proc of the IEEE Symposium on FPGAs for Custom Computing Machines, Napa Calif., Apr. 19-21 1995.
38. Abbas Ali Mohamed, Szirmay-Kalos László, Horváth Tamás. *"Hardware Implementation of Phong Shading using Spherical Interpolation,"* Periodica Polytechnica, Vol. 44, Nos 3-4, 2000.
39. D. A. Basin. "A term equality problem equivalent to graph isomorphism. Information Processing Letters," 54:61-66, 1994.
40. M. R. Garey and D. S. Johnson. "Computers and Intractability: A Guide to the Theory of NP-Completeness," W.H. Freeman, New-York, 1979.
41. J. E. Hoperoft and J. K. Wong. "Linear time algorithm for isomorphism of planar graphs," Sixth ACM Symposium on Theory of Computing, 1974.
42. S. W. Reyner. "An analysis of a good algorithm for the subtree problem," SIAM Journal of Computing, 6(4):730-732, 1977.

43. A. M. Abdulkader. "Parallel Algorithms for Labelled Graph Matching," PhD thesis, Colorado School of Mines, 1998.
44. B. T. Messmer and H. Bunke. "A decision tree approach to graph and subgraph isomorphism detection," Pattern Recognition, 32:1979-1998, 1999.
45. Michihiro Kuramochi and George Karypis, "An Efficient Algorithm for Discovering Frequent Subgraphs," Technical Report 02-026. University of Minnesota.
46. K. Keutzer, "DAGON: Technology Binding and Local Optimization by DAG Matching," Proc. of Design Automation Conference, 1987.
47. A. Chowdhary, S. Kale, P. Saripella, N. Sehgal and R. Gupta. "A General Approach for Regularity Extraction in Datapath Circuits," Proc. of International Conference on Computer-Aided Design, 1998.
48. D. S. Rao and F. J. Kurdahi. "On Clustering for Maximal Regularity Extraction," IEEE Trans. on Computer-Aided Design, Vol. 12, No. 8, August, 1993.
49. S. Cadambi and S.C. Goldstein. "CPR: A Configuration Profiling Tool," Proc. of the Symposium on Field-Programmable Custom Computing Machines, 1999.
50. S. Gold and A. Rangarajan. "A graduated assignment algorithm for graph matching," IEEE Transactions on Pattern Analysis and Machine Intelligence, 18(4):377-88, 1996.
51. S.-J. Farmer. "Probabilistic graph matching," University of York, 1999.
52. A. Perchant and I. Bloch. "A new definition for fuzzy attributed graph homomorphism with application to structural shape recognition in brain imaging," In IMTC'99, 16th IEEE Instrumentation and Measurement Technology Conference, pages 1801-1806, Venice, Italy, May 1999.
53. J. Sung Hwan. "Content-based image retrieval using fuzzy multiple attribute relational graph," IEEE International Symposium on Industrial Electronics Proceedings (ISIE 2001), 3:1508-1513, 2001.
54. C.-W. K. Chen and D. Y. Y. Yun. "Unifying graph-matching problem with a practical solution," In Proceedings of International Conference on Systems, Signals, Control, Computers, September 1998
55. Anand Rangarajan and Eric Mjolsness, *A Lagrangian. "Relaxation Network for Graph Matching,"* IEEE Transactions on Neural Networks, 7(6):1365-1381, 1996.
56. Kimmo Fredriksson. "Faster string matching with super-alphabets," Proc of SPIRE'2002, Lecture Notes in Computer Science 2476, pages 44-57, Springer Verlag, Berlin 2002.
57. Ganesh Lakshminarayana, Kamal S. Khouri, Niraj K. Jha, Wavesched. "A Novel Scheduling Technique for Control-Flow Intensive Designs," IEEE Transactions On Computer-Aided Design Of Integrated Circuits And Systems, Vol. 18, No. 5, May 1999.
58. D. D. Gajski, N. Dutt, A. Wu, and S. Lin, High-Level Synthesis. "Introduction to Chip and System Design," Boston, Mass.: Kluwer Academic, 1992.
59. W. Wolf, A. Takach, C. Huang, and R. Mano. "The Princeton university behavioral synthesis system," Proc. Design Automation Conf., June 1992, pp. 182-187.
60. D. Ku and G. De Micheli. "Relative scheduling under timing constraints," IEEE Trans. Computer-Aided Design, vol. 11, pp. 696-718, June 1992.
61. C. Chekuri, Richard Johnson, Rajeev Motwani, Balas Natarajan, Bob Rau, and Michael Schlansker. "An Analysis of Profile-Driven Instruction Level Parallel Scheduling with Application to Super Blocks," Proc of the 29th Annual International Symposium on Microarchitecture (MICRO-29), December 1996.
62. J. A. Fisher. "Global code generation for instruction level parallelism," Tech. Rep. HPL-93-43, Hewlett Packard Labs, June 1993.
63. W. W. Hwu et al. "The super block: An effective technique for VLIW and superscalar compilation," Journal. of Supercomputing, 7:229-248 (1993).
64. J. C. Dehnert and R. A. Towle. "Compiling for the Cydra-5," Journal of Supercomputing, 7:181-228, (1993).
65. Hesham L. Rewini and Hesham H. Ali. "Static scheduling of conditional branches in parallel programs," Journal of Parallel and Distributed Computing, 24(1): 41-54, January 1994.
66. Lin Huang and Michael J. Oudshroon. "An approach to distribution of parallel programs with conditional task attributes," Technical Report TR97-06, Department of Computer Science, University of Adelaide, August 1997.
67. Ling Huang, Michael J. Oudshroon and Jiannong Cao. "Design and implementation of an adaptive task mapping environment for parallel programming," Australian Computer Science Communications, 19(1):326-335, February 1997.
68. V. Mooney. *"Path-Based Edge Activation for Dynamic Run-Time Scheduling,"* International Symposium on System Synthesis (ISSS'99), pp. 30-36, November 1999.
69. Petru Eles, Alex Doboli, Paul Pop, Zebo Peng. *"Scheduling with Bus Access Optimization for Distributed Embedded Systems,"* IEEE Trans on VLSI Systems, vol. 8, No 5, 472-491, October 2000.
70. E. G. Coffman Jr., R. L. Graham. "Optimal Scheduling for two Processor Systems," Acta Informatica, 1, 1972, 200-213.
71. H. Kasahara, S. Narita. "Practical Multiprocessor Scheduling Algorithms for Efficient Parallel Processing," IEEE Trans. On Comp., V33, N11, 1984, 1023-1029.
72. Y. K. Kwok, I. Ahmad. "Dynamic Critical-Path Scheduling: an Effective Technique for Allocating TaskGraphs to Multiproces-sors," IEEE Trans. on Parallel and Distributed Systems, V7, N5, 1996, 506-521.
73. P. Chou, G. Boriello. "Interval Scheduling: Fine-Grained Code Scheduling for Embedded Systems," Proc. ACM/IEEE DAC, 1995, 462-467.
74. R. K. Gupta, G. De Micheli. "A Co-Synthesis Approach to Embedded System Design Automation," Design Automation for Embedded Systems, V1, N1/2, 1996, 69-120.
75. F. R. Brown III. "Real-Time Scheduling with Fuzzy Systems," PhD thesis, Utah State University, 1998.
76. Y. Jiajun, X. Guodong, C. Xibin, and M. Xingrui. "A fuzzy expert system architecture implementing onboard planning and scheduling for autonomous small satellite," 12th Annual AIAA/Utah State University Conference on Small Satellites, Logan, Utah, August 1998.
77. A. Dasu. "The need for reconfigurable multimedia processing," Ph.D. qualifying report. 2001.
78. "Complexity Analysis of MPEG-4 Video Profiles", A Master's thesis by C. N. Raghavendra. Arizona State University, 2000.
79. "Algorithms, Complexity Analysis and VLSI Architectures for MPEG 4 Motion Estimation", Peter Kuhn. Kluwer publishers.
80. ISO/IEC JTC1/SC29/WG11, "MPEG-4 video verification model version 11.0", March 1998.
81. A. Dasu, and S. Panchanathan, "A Survey of Media Processing Approaches," *IEEE Transactions on Circuits and Systems for Video Technology,* 12 (8), pp. 633-645, 2002.

82. A. Dasu, A. Akoglu, and S. Panchanathan, "Reconfigurable Processing" U.S Provisional Patent Application filed on Feb. 5, 2003.
83. A. Akoglu, A. Dasu, A. Sudarsanam, M. Srinivasan, and S. Panchanathan, "Pattern Recognition Tool to Detect Reconfigurable Patterns in MPEG4 Video Processing," International Parallel and Distributed Processing Symposium, pp. 131-135, 15-19 Apr. 2002.
84. A. Dasu, A. Akoglu, and S. Panchanathan, "An Analysis Tool Set for Reconfigurable Media Processing" *The International Conference on Engineering of Reconfigurable Systems and Algorithms*, Las Vegas, June 2003.
85. A. A. Aggarwal, and D. M. Lewis, "Routing Architectures for Hierarchical Field Programmable Gate Arrays," *IEEE International Conference on Computer Design*, pp. 475-478, Oct. 10, 1994.
86. W. Li, D. K. Banerji, "Routability prediction for hierarchical FPGAs", Ninth Great Lakes Symposium on VLSI, pp. 256-259 4-6 Mar. 1999.
87. Y. Lai, and P. Wang, "Hierarchical interconnection structures for field programmable gate arrays," IEEE Transactions on Very Large Scale Integration (VLSI) Systems, v.5 n.2, pp. 186-196, June 1997.
88. J. Becker, and M. Glesner, "A Parallel Dynamically Reconfigurable Architecture Designed for Flexible Application-Tailored Hardware/Software Systems in Future Mobile Communication," *The Journal of Supercomputing*, 19(1), pp. 105-127, 2001.
89. K. Sarrigeorgidis, and J. M. Rabaey, "Massively Parallel Wireless Reconfigurable Processor Architecture and Programming," 10*th Reconfigurable Architectures Workshop*, Nice, France, Apr. 22, 2003.
90. H. Zhang, M. Wan, V. George, and J. Rabaey, "Interconnect Architecture Exploration for Low-Energy Reconfigurable Single-Chip DSPs". IEEE Computer Society Workshop on VLSI '99 pp. 2-8, April 1999.
91. H. Zhang, V. Prabhu, V. George, M. Wan, M. Benes, A. Abnous, and J. M. Rabaey, "A 1-V Heterogeneous Reconfigurable DSP IC for Wireless Baseband Digital Signal Processing," *IEEE Journal of Solid-State Circuits*, 35 (11), pp. 1697-1704, November 2000.
92. M. Wan, H. Zhang, V. George, M. Benes, A. Abnous, V. Prabhu, and J. M. Rabaey, "Design Methodology of a Low-Energy Reconfigurable Single-Chip DSP System," *Journal of VLSI Signal Processing Systems*, 28, pp. 47-61, May-June 2001.
93. V. Betz and J. Rose, "VPR: A New Packing Placement and routing Tool for FPGA Research", International Workshop on Field-Programmable Logic and Application, pp. 213-222, 1997.
94. A. Marquardt, V. Betz and J. Rose, "Using cluster-based logic blocks and timing-driven packing to improve FPGA speed and density", Proceedings of the 1999 ACM/SIGDA seventh international symposium on Field programmable gate arrays, p. 37-46, Feb. 21-23, 1999, Monterey.
95. E. Bozorgzadeh, S. Ogrenci-Memik and M. Sarrafzadeh, "RPack: routability-driven packing for cluster-based FPGAs", Proceedings of the conference on Asia South Pacific Design Automation Conference, p. 629-634, January 2001, Japan.
96. A. Singh, G. Parthasarathy and M. Marek-Sadowska, "Efficient circuit clustering for area and power reduction in FPGAs" ACM Transactions on Design Automation of Electronic Systems, Volume 7, Issue 4, October 2002, pp: 643-663.

We claim:

1. A method, comprising:
deriving, by a computing device, control flow graphs for selected multiple program operations of a source code;
identifying, by the computing device, blocks of the control flow graphs;
developing, by the computing device, data flow graphs for two or more of the blocks;
identifying, by the computing device, a common subgraph shared by at least a pair of the blocks;
scheduling, by the computing device, shared processes represented by the common subgraph;
scheduling, by the computing device, the shared processes for operation in each of the multiple program operations; and
scheduling, by the computing device, processing units to carry out the shared processes represented by the common subgraph;
wherein scheduling of common operations represented by the common subgraph includes providing switching of differing delays among processes of the common subgraph to effect subgraphs operating each of the selected multiple program operations, wherein said providing switching of different delays includes configuring multiplexers operative to apply alternative delays between processes of the common subgraph; and
wherein said scheduling of processing units to carry out the common subgraph includes clustering the shared processes into a macroblock having nodes representing the shared processes and at least a plurality of unconditional, conditional, and reconfiguration edges running between nodes, and determining a relative delay among possible paths through the common subgraph for an implementation using processing units formed on an integrated circuit.

2. The method of claim 1, wherein said identifying a common subgraph shared by at least a pair of the blocks includes identifying ones of the blocks that lie inside a loop, including identifying one of:
a single nested level loop with only one block;
a single nested level loop with more than one block; and
a multi-level nested loop.

3. The method of claim 1, wherein said identifying a common subgraph shared by at least a pair of the blocks includes identifying ones of the blocks that lie inside a loop, including identifying one of:
a single nested level loop with more than one block; and
a multi-level nested loop.

4. The method of claim 3, wherein said identifying a common subgraph shared by at least a pair of the blocks further includes identifying blocks of control flow graphs of separate program operations under like control.

5. The method of claim 4, wherein said identifying a common subgraph shared by at least a pair of the blocks further includes determining a count of each operation type in a block.

6. The method of claim 5, wherein said identifying a common subgraph shared by at least a pair of the blocks further includes examining edges in a data flow graph of control flow graphs from the separate programming operations.

7. The method of claim 6, wherein said examining edges includes classifying edges based on source and destination node operation type.

8. The method of claim 7, wherein said examining edges includes eliminating edges of one data flow graph having a source-operation-to-destination-operation not found in another data flow graph having edges under examination.

9. The method of claim 8, further comprising implementing the eliminated edges in a reconfigurable circuit.

10. The method of claim 9, wherein said implementing the eliminated edges in a reconfigurable circuit includes implementing the eliminated edges in one or more look up tables stored in the reconfigurable circuit.

11. The method of claim 7, wherein said examining edges further includes comparing associativity among edges being compared.

12. The method of claim 11, wherein said comparing associativity includes determining numbers of predecessor, siblings, companions, and successors of edges being compared.

13. The method of claim 1, wherein said scheduling the shared processes represented by the common subgraph includes ASAP scheduling the common subgraph.

14. The method of claim 1, further comprising implementing the common operations of the common subgraph in an application specific integrated circuit.

15. The method of claim 1, further comprising:
identifying, by the computing device, at least one other common subgraph shared by the at least a pair of the blocks;
scheduling, by the computing device, other shared processes represented by the other common subgraph;
scheduling, by the computing device, the other shared processes for operation in each of the multiple program operations; and
laying out, by the computing device, an arrangement of circuit elements of a reconfigurable circuit for implementation of the other shared processes, including:
grouping the circuit elements into first level clusters; and
placing the first level clusters by grouping the first level clusters together to form second level clusters and placing the second level clusters.

16. The method of claim 1, wherein said identifying a common subgraph shared by at least a pair of the blocks includes identifying a largest common subgraph shared by the at least a pair of the blocks.

17. An integrated circuit fabricated to execute the multiple program operations of the source code, including carrying out the shared processes represented by the common subgraph identified using the method of claim 1.

18. A computer-readable medium comprising stored programming instructions which, in response to execution by a processor of an apparatus, causes the apparatus to perform the method of claim 1.

19. The method of claim 1, wherein said scheduling of processing units to carry out the common subgraph further includes:
performing branch and bound scheduling for the longest-delay-time path;
merging all schedules;
laying out an arrangement of circuit elements of the integrated circuit, including:
grouping the circuit elements into first level clusters; and
placing the first level clusters by grouping the first level clusters together to form second level clusters and placing the second level clusters.

* * * * *

UNITED STATES PATENT AND TRADEMARK OFFICE
CERTIFICATE OF CORRECTION

| | | |
|---|---|---|
| PATENT NO. | : 8,281,297 B2 | Page 1 of 4 |
| APPLICATION NO. | : 10/544894 | |
| DATED | : October 2, 2012 | |
| INVENTOR(S) | : Dasu et al. | |

It is certified that error appears in the above-identified patent and that said Letters Patent is hereby corrected as shown below:

On the Face Page, in Field (56), under "OTHER PUBLICATIONS", in Column 1, Line 1, delete "al," and insert -- al. --, therefor.

On Page 2, in Field (56), under "OTHER PUBLICATIONS", in Column 1, Line 1, delete "al," and insert -- al. --, therefor.

On Page 2, in Field (56), under "OTHER PUBLICATIONS", in Column 1, Line 2, delete "p." and insert -- pp. --, therefor.

On Page 2, in Field (56), under "OTHER PUBLICATIONS", in Column 1, Line 4, delete "al," and insert -- al. --, therefor.

On Page 2, in Field (56), under "OTHER PUBLICATIONS", in Column 1, Line 6, delete "al," and insert -- al. --, therefor.

On Page 2, in Field (56), under "OTHER PUBLICATIONS", in Column 1, Line 21, delete "Proc" and insert -- Proc. -- at each occurrence throughout the patent.

On Page 2, in Field (56), under "OTHER PUBLICATIONS", in Column 1, Line 47, delete "A.et at." and insert -- A. et al. --, therefor.

On Page 2, in Field (56), under "OTHER PUBLICATIONS", in Column 2, Line 37, delete "p." and insert -- pp. --, therefor.

On Page 2, in Field (56), under "OTHER PUBLICATIONS", in Column 2, Line 47, delete "Real" and insert -- "Real --, therefor.

On Page 2, in Field (56), under "OTHER PUBLICATIONS", in Column 2, Line 47, delete "Systems," and insert -- Systems", --, therefor.

Signed and Sealed this
Twenty-sixth Day of February, 2013

Teresa Stanek Rea
*Acting Director of the United States Patent and Trademark Office*

On Page 3, in Field (56), under "OTHER PUBLICATIONS", in Column 1, Line 6, delete "M.et" and insert -- M. et --, therefor.

On Page 3, in Field (56), under "OTHER PUBLICATIONS", in Column 1, Line 8, delete "E. ," and insert -- E., --, therefor.

On Page 3, in Field (56), under "OTHER PUBLICATIONS", in Column 1, Line 45, delete "V.,et" and insert -- V., et --, therefor.

On Page 3, in Field (56), under "OTHER PUBLICATIONS", in Column 2, Line 48, delete "(VSLI)" and insert -- (VLSI) --, therefor.

On Page 3, in Field (56), under "OTHER PUBLICATIONS", in Column 2, Line 66, delete "p." and insert -- pp. --, therefor.

In Fig. 39, Sheet 35 of 42, delete "Hierachy" and insert -- Hierarchy --, therefor.

In Column 3, Line 1, delete "ASICS" and insert -- ASICs --, therefor.

In Column 11, Line 56, delete "(DFGs)." and insert -- (CFGs). --, therefor.

In Column 17, Line 54, delete ""00"" and insert -- "00", --, therefor.

In Column 28, Line 33, delete "=<" and insert -- => --, therefor.

In Column 31, Line 58, delete "peformed*/" and insert -- performed*/ --, therefor.

In Column 35, Line 29, delete "m|" and insert -- m|. --, therefor.

In Column 36, Line 65, delete "its" and insert -- it --, therefor.

In Column 37, Line 54, delete " D." and insert -- D.) --, therefor.

In Column 50, Line 14, delete "Dependent)" and insert -- dependent). --, therefor.

In Column 50, Line 50, delete "connected" and insert -- connected. --, therefor.

In Column 55, Line 57, delete "building" and insert -- a building --, therefor.

In Column 65, Line 44, delete "3" and insert -- 3. --, therefor.

In Column 69, Line 43, delete "1998" and insert -- 1998. --, therefor.

In Column 70, Line 40, delete "Multiproces-sors,"" and insert -- Multiprocessors," --, therefor.

CERTIFICATE OF CORRECTION (continued)
U.S. Pat. No. 8,281,297 B2

In Column 71, Line 57, delete "p." and insert -- pp. --, therefor.

In Column 71, Line 61, delete "p." and insert -- pp. --, therefor.

Methodology

Control Flow Effect on Clusters